(12) United States Patent
Saeki

(10) Patent No.: US 6,742,133 B2
(45) Date of Patent: May 25, 2004

(54) CLOCK CONTROLLING METHOD AND CLOCK CONTROL CIRCUIT

(75) Inventor: Takanori Saeki, Tokyo (JP)

(73) Assignee: NEC Electronics Corporation (JP)

( * ) Notice: Subject to any disclaimer, the term of this patent is extended or adjusted under 35 U.S.C. 154(b) by 166 days.

(21) Appl. No.: 09/990,781

(22) Filed: Nov. 14, 2001

(65) Prior Publication Data

US 2002/0059536 A1 May 16, 2002

(30) Foreign Application Priority Data

Nov. 14, 2000 (JP) ........................................ 2000-347146
Feb. 19, 2001 (JP) ........................................ 2001-042191

(51) Int. Cl.[7] .............................. G06F 1/12; G06F 17/50
(52) U.S. Cl. .................... 713/500; 713/401; 713/501; 713/502; 713/503; 713/600; 716/1; 716/2; 716/5; 716/6; 327/158; 327/291; 327/292; 327/295
(58) Field of Search ................................. 713/401, 500, 713/501, 502, 503, 600; 716/1, 2, 5, 6; 327/158, 291, 292, 295

(56) References Cited

U.S. PATENT DOCUMENTS

| 4,996,958 | A | * | 3/1991 | Iwata et al. ............ 123/406.65 |
| 5,184,027 | A | * | 2/1993 | Masuda et al. .............. 327/149 |
| 5,210,700 | A | * | 5/1993 | Tom ............................. 716/6 |
| 5,469,116 | A | * | 11/1995 | Slemmer ...................... 331/74 |
| 5,923,188 | A | * | 7/1999 | Kametani et al. ............. 326/93 |
| 6,137,336 | A | * | 10/2000 | Baba et al. .................. 327/295 |
| 6,173,432 | B1 | * | 1/2001 | Harrison ......................... 716/1 |
| 6,184,736 | B1 | * | 2/2001 | Wissell et al. .............. 327/295 |
| 6,271,697 | B1 | * | 8/2001 | Hayashi et al. ............. 327/158 |

FOREIGN PATENT DOCUMENTS

JP          11-4145          1/1999          ............ H03K/5/00

OTHER PUBLICATIONS

Horowitz, M. et al, "PLL Design for a 500 MB/s Interface", IEEE International Solid–State Circuits Conference, Session 10, 1993, pps 160–161.

* cited by examiner

Primary Examiner—Kim Huynh
Assistant Examiner—Tammara Peyton
(74) Attorney, Agent, or Firm—Hayes Soloway P.C.

(57) ABSTRACT

A novel clock control circuit and method in which phase synchronization with respect to an external clock can be realized without recourse to the external clocks. A clock controlling circuit includes a delay circuit sequence comprised of N stages of units each made up of a first delay circuit 10 and a first interior division circuit 11 for delaying the output signal of the first delay circuit, and a phase difference detection circuit 14 for detecting the clock period and the delay time difference of the delay circuit sequence from the input clock IN and a clock END output by the delay circuit sequence as a phase difference of the two signals. A plural number of second interior division circuits 12, fed with an output signal of the first delay circuit, delays a transition edge of an output signal of the first delay circuit by t2−n×T/N to output the delayed signal. The second interior division circuit outputs a signal which makes transition at a timing delayed n×tCK/N as from the start time point of the clock cycle. A synthesis circuit 13 generates a frequency multiplied clock signal which is obtained on equal division of the clock period tCK of the input clock from the input clock IN and the number 1 to number N−1 third delays circuit.

57 Claims, 24 Drawing Sheets

PULSE CORRECTION CIRCUIT

MULTIPLEXER CIRCUIT

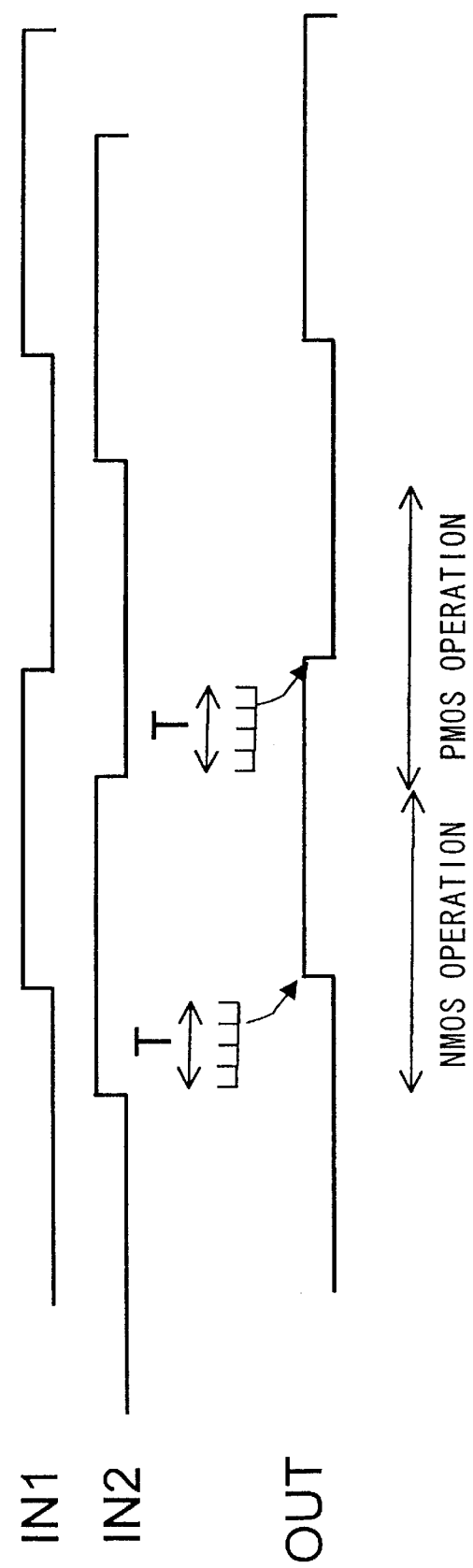

CLOCK CONTROLLING METHOD AND CLOCK CONTROL CIRCUIT

FIELD OF THE INVENTION

This invention relates to a clock controlling method and a clock control circuit. More particularly, it relates to a clock controlling method and a clock control circuit convenient for generating a clock signal having a multiplied frequency of an external clock and being synchronized with the external clock.

BACKGROUND OF THE INVENTION

Recently, with an increasing size of circuits that can be integrated on one chip and with an increasing operating frequency, a clock control circuit has come to be used for controlling the phase and frequency of clock inside and outside a chip of a semiconductor integrated circuit including a synchronization circuit operating on a clock signal supplied to the circuit.

As a clock control circuit, a feedback type circuit, such as a PLL (phase locked loop) or a DLL (delay synchronization loop), has so far been used. Of these, the PLL circuit is made up of a phase comparator circuit receiving a reference clock signal as an input, a charge pump for charging and discharging a capacitor to generate a voltage corresponding to a phase difference output from the phase comparator circuit, a loop filter for smoothing a voltage corresponding to the phase difference, a voltage controlled oscillator receiving a voltage output from the loop filter as a control voltage to vary an oscillation frequency responsive to the control voltage, and a frequency divider for frequency dividing an oscillation output signal from the voltage controlled oscillator to provide a frequency divided signal to the phase comparator circuit. The phase comparator circuit compares the phase difference between the reference clock signal and the signal output from the frequency divider to control the oscillation frequency of the voltage controlled oscillator responsive to the result of phase comparison and hence the voltage controlled oscillator is made to output a clock signal which is phase-synchronized with the reference clock signal which is provided to the phase comparator circuit.

As a circuit for frequency multiplying an input clock, a circuit comprised of the combination of a PLL circuit and an interpolator (interior division circuit) is known in the art. See, for example, Publication 1 (ISSC 1993 p.p. 160–161, Mark Horowitz et al., "PLL Design for 500 MHz Interface"). Meanwhile, the interpolator disclosed in this Publication 1 is of an analog circuit configuration made up of a differential circuit receiving two inputs.

As is well-known, the configuration employing a PLL circuit suffers from the problem that phase synchronization is extremely time-consuming, and that there persists phase jitter ascribable to a feedback loop and marked phase shifting is produced in case the locked state is disengaged due to such jitter.

As a non-feedback type frequency multiplied clock generating circuit, not employing the feedback system, such as PLL, the present inventors have already proposed a construction in e.g., JP Patent Application No. 11-004145, as shown in FIGS. 12 to 15 hereof. Referring to FIG. 12, this multiplier circuit includes a frequency divider 2 for dividing the frequency of the input clock 1 to generate multi-phase clocks 3, a multi-phase clock multiplier circuit 5, which receives output 3 from the frequency divider 2, as an input, a period detection circuit 6, made up of a ring oscillator of a fixed number of stages and a counter for counting the number of times of oscillations of the ring oscillator during one clock period of the input clock 1 to detect the period of the clock 1 to output a control signal 7, and a clock synthesis circuit 8 for synthesizing the output signal of the multi-phase clock multiplier circuit 5 to generate a frequency multiplied clock signal. The multi-phase clock multiplier circuit 5 includes plural timing difference division circuits 4a for outputting signals corresponding to the interior division of the timing difference (phase difference) of two inputs and plural multiplexing circuits 4b for multiplexing output signals of two of the timing difference division circuits.

The plural timing difference division circuits 4a are comprised of plural timing difference division circuits which receives clock signals of the same phase as inputs, and plural timing difference division circuits which receives two neighboring clock signals. The period detection circuit 6 outputs a control signal 7 to adjust the load capacitance of the timing difference division circuits 4a in the multi-phase clock multiplier circuit 5 to control the clock period.

FIG. 13 shows, as an example of the clock multiplier circuit, a specified illustrative structure of a four-phase clock multiplier circuit for generating four-phase clocks. Referring to FIG. 13, the four-phase clock multiplier circuit includes a ¼ frequency divider circuit 201 for frequency dividing an input clock 205 by four to output four-phase clocks Q1 to Q4, a n-stage cascaded connection of four-phase clock multiplier circuits $202_1$ to $202_n$, a clock synthesis circuit 203 and a period detection circuit 204. The last stage four-phase clock multiplier circuit $202_n$ outputs 2n-multiplied four-phase clocks Qn1 to Qn4, which are synthesized in the clock synthesis circuit 203 so as to be output as a multiplied clock signal 207. Meanwhile, the number of stage n of the four-phase clock multiplier circuits is arbitrary.

The ¼ frequency divider 201 frequency divides the input clock 205 by four to generate four-phase clocks Q1 to Q4 which are then multiplied by the four-phase clock multiplier circuit $202_1$ to generate four-phase clocks Q11 to Q14. In similar manner, 2n-tupled four-phase clocks Qn1 to Qn4 are produced from the four-phase clock multiplier circuit $202_n$.

The period detection circuit 204 is made up of a ring oscillator having a fixed number of stages and a counter. During the periods of the clocks 205, the number of times of oscillations of the ring oscillator is counted by the counter to output control signals 206 depending on the number of counts to adjust the load in the four-phase clock multiplier circuit 202. This period detection circuit 204 resolves fluctuations in device characteristics during the clock period operation.

The operation of the four-phase clock multiplier circuit 202 is explained. The four-phase clocks are converted into eight phase clocks by the four-phase lock multiplier circuit 202 of FIG. 13 and converted back to four-phase clocks to effect multiplication continuously, as now explained in detail.

FIG. 14 shows an illustrative structure of the four-phase clock multiplier circuit $202_n$ shown in FIG. 13. Meanwhile, the four-phase clock multiplier circuits $202_1$ to $202_n$ are of the same structure.

Referring to FIG. 14a, this four-phase clock multiplier circuit $202_n$ is made up of eight sets of timing difference division circuits 208 to 215, eight sets of pulse width correction circuits 216 to 223 and four sets of multiplexer circuits 224 to 227. FIG. 14b shows the structure of a pulse width correction circuit comprised of a NAND circuit receiving signals corresponding to the second input T23 inverted by an inverter INV and the first input T21, as inputs. FIG. 14c shows the structure of a multiplier circuit comprised of a two-input AND circuit.

FIG. 15 shows a signal waveform diagram for illustrating the timing operation of the four-phase clock multiplier circuit 202 shown in FIG. 14. The rising of the clock T21 is determined by a delay corresponding to the internal delay of the timing difference division circuit 208 as from the rising of the clock Q(n−1)1, the rising of the clock T22 is determined by timing division by a timing difference division circuit 209 of the timing difference between the rise timing of the clock Q(n−1)1 and the rise of the clock Q(n−1)2 and by the delay corresponding to the internal delay, and the rise timing of the clock T23 is determined by the timing division by a timing difference division circuit 210 of the timing difference between the rise timing of the clock Q(n−1)1 and the rise timing of the clock Q(n−1)2 and by the delay corresponding to the internal delay. In similar manner, the rising of the clock T26 is determined by the timing division by a timing difference division circuit 213 of the timing difference between the rise timing of the clock Q(n−1)3 and the rise timing of the clock Q(n−1)4 and by the delay corresponding to the internal delay, the rising of the clock T27 is determined by the delay corresponding to the internal delay in the timing difference division circuit 214 of the rise timing of the clock Q(n−1)4 and the rising of the clock T28 is determined by the timing division by a timing difference division circuit 215 of the timing difference between the rise timing of the clock Q(n−1)4 and the rise timing of the clock Q(n−1)1 and by the delay corresponding to the internal delay.

Clocks T21, T23 output by the timing difference division circuits 208, 210 are input to the pulse width correction circuit 216. The pulse width correction circuit 216 outputs a pulse P21 having a falling edge determined by the clock T21 and a rising edge determined by the clock T23. By a similar sequence of operations, pulses P22 to P28 are generated. The clocks P21 to P28 are 25-duty % eight-phase pulses, each phase being spaced by 45° from one another. The clock P25, the phase of which being shifted by 180° from that of the clock T21, is multiplexed by a multiplexer circuit 224 and output as a duty-25% clock Qn1. In similar manner, clocks Qn2 to Qn4 are generated. The clocks Qn1 to Qn4 become duty-50% four-phase pulses each phase being spaced by 90° from one another which are frequency multiplied by two in the course of generating clocks Qn1 to Qn4 from the clocks Q(n−1)1 to Q(n−1)4.

FIG. 16 shows an illustrative structure of timing difference division circuits 208, 209 shown in FIG. 14. The same signal is input to two inputs IN1 and IN2 of the timing difference division circuit 208, whereas two neighboring signals are input to the two inputs IN1 and IN2 of the timing difference division circuit 209. That is, the same input Q(n−1) is fed to the input terminals IN1, IN2 of the timing difference division circuit 208, whereas inputs Q(n−1)1 and Q(n−1)2 are fed to the input terminals IN1, IN2 of the timing difference division circuit 209. The timing difference division circuit includes a p-channel MOS transistor MP01, having its source and drain connected to the power supply VDD and to an internal node N1, respectively, an OR gate OR1 which receives the input signals IN1, IN2 and has its output terminal connected to the gate of the p-channel MOS transistor MP01, and n-channel MOS transistors MN01, MN02, having drains connected to the internal node N1 and sources connected via a constant current source 10 to the ground, while having gates fed with the input signals IN1, IN2 respectively. The internal node N1 is connected to an input terminal of an inverter INV01. A series connection of the n-channel MOS transistor MN11 and a capacitor CAP11, a series connection of the n-channel MOS transistor MN12 and a capacitor CAP12, . . . and a series connection of the n-channel MOS transistor MN15 and a capacitor CAP15 are connected in parallel across the internal node N1 and the ground. The gates of the n-channel MOS transistors MN11, MN12, MN13, MN14 and MN15 are fed with a 5-bit control signal 206 from a period detection circuit 204 to turn the transistors on or off. The gate widths of the n-channel MOS transistors MN11, MN12, MN13, MN14 and MN15 are and the capacitances CAP11, CAP12, CAP13, CAP14 and CAP15 are of the size ratio of, for example, 16:8:4:2:1, so that the load connected to the common node is adjusted in 32 stages, based on a control signal 206 output from the period detection circuit 204, to set the clock period.

As for the timing difference division circuit 208, the charge at the node N1 is extracted through the two n-channel MOS transistors MN11 and MN12 by the rising edge of the clock Q(n−1)1, commonly fed to the two inputs IN1, IN2. When the voltage level of the node N1 reaches the threshold voltage of the inverter INV01, the clock T21, output by the node N1, rises. If the charge stored at the node N1, that need to be extracted in order for the node N1 to reach the threshold voltage of the inverter INV01 is CV, where C and V denote the capacitance and the voltage, respectively, and the discharge current by the n-channel MOS transistor is I, the charge CV is discharged at a constant current of 2I as from the rise edge of the clock Q(n−1)1. So, the time CV/2I represents the timing difference from the rising edge of the clock Q(n−1)1 to the rising edge of the clock T21 (propagation delay time).

When the clock Q(n−1)1 is at a low level, the p-channel MOS transistor MP01 is turned on, the node N1 is charged to a high level and the output clock T21 of the inverter INV01 goes down to a low level.

As for the timing difference division circuit 209, charge at node N1 is extracted during the time after time tCKn (=multi-phase clock period) as from the rising edge of the clock Q(n−1)1. When the potential of the node N1 has reached the threshold voltage of the inverter INV01, as from the rising edge of the clock Q(n−1)2 after time tCKn, the clock T22 rises. If the electric charge of the node N1 is CV and the discharge current of the NMOS transistor is I, the charge CV in the capacitor C is discharged as from the rising of the clock Q(n−1)1 during the time tCKn with the constant current I, while being discharged during the remaining period with the constant current 2I. As a result, the time $$tCKn+(CV-tCKn\times I)/2I=CV/2I+tCKn/2 \quad (1)$$

represents the timing difference as from the rising edge of the clock Q(n−1)1 until the rising edge of the clock T22.

That is, the timing difference between the rising edge of the clock T22 and the rising edge of the clock T21 is tCKn/2.

When the clocks Q(n−1)1 and Q(n−1)2 both go at a low level, and the node N1 is charged through the p-channel MOS transistor MP01 from the power supply to a high level, the clock T22 falls. The same applies for the clocks T22 to T28, such that the timing difference of the clocks T21 to T28 is equal to tCKn/2.

The pulse width correction circuits 216 to 223 generate duty-25% eight-phase pulses P21 to P28, which are phase shifted by 45° from one another (see FIG. 14).

The multiplexing circuits 224 to 227 generate duty 50% four-phase pulses Qn1 to Qn4, each phase being spaced by 90° from one another.

The timing difference division circuit of FIG. 16 is suitably changed depending on the application used. For example, it is also possible to provide an output of a NAND circuit which receives the first and second input signals IN1, IN2, to the gate of the p-channel MOS transistor MP01 and to input the first input signal IN1 and the second input signal IN2, inverted by the inverter, to the gates of the n-channel MOS transistors MNO1 and MNO2. In this case, when the first and second input signals IN1, IN2 are at a high level, the p-channel MOS transistor MP01 is turned on to charge the internal node N1, with the output signal of the inverter INV01 going to a low level. When one or both of the first and second input signals IN1 and IN2 are at a low level, the p-channel MOS transistor MP01 is turned off, and one or both of the p-channel MOS transistors MNO1 and MNO2 is turned on to discharge the internal node N1. When the voltage of the internal node N1 falls to below the threshold value of the inverter INV01, the output signal of the inverter INV01 rises to a high level.

SUMMARY OF THE DISCLOSURE

In the above-described clock control circuit, employing the PLL, in which an oscillation output signal from the voltage controlled oscillator (VCO) and the input signal (reference signal) are controlled so as to match in phases to each other, a lock process is time consuming, and it is difficult to output a signal synchronized with the oncoming input clock immediately from the clock cycle next following the oncoming input clock in case of the PLL being in an unlocked state or in case of no input clock(reference signal) being provided to the PLL from the perspective of the circuit structure.

In the clock multiplier circuit, employing the conventional timing difference division circuit, a timing signal corresponding to the interior division of the phase difference of two input signals can be output with high precision, however, should variations such as those in the manufacturing process or power supply state be produced, these variations are presented as variations in the delay time of the timing difference division circuit. For example, there are occasions where variations in the threshold voltage V, constant current I (drain current of the n-channel MOS transistor) or the capacitance value C in CV/2I in the above equation (1) affect the delay time of the timing difference division circuit, and as a result, jitters may be produced in output signal in the clock multiplier circuit made up of plural stages of parallel connections of the timing difference division circuits.

In the above-described clock multiplier circuit employing the timing difference division circuit (see FIG. 12) and employing no feedback circuit as a PLL circuit or the like, it is difficult to generate multiplexed signals phase-synchronized with the external clock received.

In a configuration not employing a feedback circuit, such as PLL circuit, it is difficult to generate from an input external clock a multiplied signal of equal time intervals by dividing one period of the external clock due to such as jitter of the output signal of the timing difference division circuit.

It is therefore an object of the present invention to provide a novel clock control circuit for generating multi-phase clocks phase-synchronized to an external clock and a frequency multiplied clock signal without recourse to a feedback system, a semiconductor integrated circuit device having the clock control circuit, and a clock controlling method.

It is another object of the present invention to provide a novel clock control circuit for generating multi-phase clocks having equal clock intervals and a frequency multiplied clock signal by a simplified structure without recourse to a feedback system, a semiconductor integrated circuit device having the clock control circuit, and a clock controlling method.

For accomplishing the above object, a clock control circuit in accordance with one aspect of the present invention, comprises a delay circuit sequence including a plurality of cascaded stages of delay circuit units, each made up of a first circuit receiving an input signal to output said input signal with a first delay time and a second circuit receiving an output signal from said first circuit to output said signal with a second delay time; a phase difference detection circuit receiving an input clock fed to said delay circuit sequence and an output clock output from said delay circuit sequence to detect a time difference between a clock period of said input clock and a delay time of said delay circuit sequence as a phase difference of said received two clocks; and a plurality of third circuits, each receiving an output signal of said first circuit of each of said delay circuit units to delay and output transition edge of said output signal of said first circuit with respective different delay time, in accordance with a stage number of said delay circuit unit to which belongs said first circuit in said delay circuit sequence, in terms of time obtained on equally dividing said phase difference by the stage number of said delay circuit units in said delay circuit sequence, as a unit; wherein said third circuits output a plurality of output signals which make transition at a time interval corresponding to equal division of the clock period of said input clock by the number of said delay circuit units in said delay circuit sequence.

In accordance with one aspect of the present invention, the third circuit includes a circuit controlling charging and discharging of a capacitor; and a circuit outputting, as said output signal of said third circuit, a logic value corresponding to the magnitude relation between a terminal voltage of said capacitor and a threshold value; and wherein said capacitor is charged or discharged during the time corresponding to said phase difference, said capacitor is again discharged or charged following said discharging or charging during the time period corresponding to the phase difference, responsive to transition of an output signal of said first circuit of the delay circuit unit associated with said third circuit; and a rise or fall transition edge of an output signal of said first circuit of said delay circuit unit associated with said third circuit is output with a delay equal to time corresponding to said second delay time less a delay time corresponding to a phase obtained on multiplying a phase obtained by equally dividing the phase difference by a number equal to the number of delay circuit units with a value indicating the stage number in said delay circuit sequence of said delay circuit unit corresponding to said third circuit.

According to the present invention, there is provided a synthesis circuit for generating and outputting a frequency multiplied clock signal of a period obtained on equal division of a clock period of the input clock based on the input signal and on output signals of the third circuits.

In accordance with one aspect of the present invention, there are provided a plural number of cascaded stages of delay circuit units each made up of a first delay circuit with a first delay time t1 and a second delay circuit for delaying and outputting the rise or fall transition edge of an output signal of the first delay circuit with a second delay time t2, with the delay circuit sequence being fed from the last stage delay circuit unit of the delay circuit sequence with input clock with a clock period tCK, and a phase difference detection circuit for detecting, from output clocks output by the last stage delay controlled unit of the delay circuit sequence and an input clock input to the delay circuit sequence and from the input clock input to the delay circuit sequence, the phase difference T corresponding to the time difference between the delay time of the delay circuit sequence and the period tCK of the input clock (T=N×(t1+t2−tCK).

There are also provided (N−1) third delay circuits, each fed with an output signal of a first delay circuit of from stage number 1 to stage number (N−1) delay circuit unit, with a third delay circuit of a number n third delay circuit, where n is a positive integer of from 1 to N−1, delaying the transition edge of an output signal of the first delay circuit of a corresponding stage number n delay circuit unit, based on the phase difference T as detected by the phase difference detection circuit, by time t2−n×T/N corresponding to second delay time t2 less a delay time n×T/N corresponding in turn to the phase T/N obtained on equally dividing the phase difference T by the number N of the delay circuit units multiplied by the number of states n in the delay circuit sequence of delay circuit units corresponding to the third delay circuit and outputting the delayed signal.

The number n third delay circuit, where n is an integer from 1 to N−1, outputs a signal which goes high or low at a timing delayed from a start time point of a clock cycle of the input clock by time n×(t1+t2−T/N)=n×tCK/N.

There is also provided a synthesis circuit for generating a frequency multiplied clock signal of a clock period obtained on equally dividing the clock period tCK of input clock from the input signal and from number 1 to number (N−1) third delay circuits.

The present invention also provides a clock control circuit including a delay circuit sequence comprised of a plural number (N) of cascaded stages of first delay circuits each with delay time t1, with the delay circuit sequence being fed with input clock of a period tCK from a stage number 1 first delay circuit, a phase difference detection circuit for detecting the phase difference T (T=tCK−N×t1) corresponding to the delay time of the delay circuit sequence and the clock period tCK of input clock, from output clocks from the last stage first delay circuit of the delay circuit sequence and input clock input to the delay circuit sequence, and N second delay circuits fed respectively with output signals of number 1 to number N first delay circuits.

The number n second delay circuit, n being a positive integer from 1 to N, delays a transition edge of an output signal of the corresponding stage number n first delay circuit by a time prescribed by a delay time proper to the second delay circuit tpd less (N−n)×T/N where T/N corresponds to the phase difference T divided equally by the total number of first delay circuits and N-n corresponds to the difference between N and the stages n of first delay circuits in delay circuit sequence.

The number n second delay circuit, n being a positive integer from 1 to N, outputs signals making rise or fall transition with a timing delayed by $$n \times t1 + tpd - (1-n/N) \times T$$

as from the start time point of the clock cycle of input clock, with multi-phase clocks with a time interval of t1+T/N being generated from an output signal of each of the number 1 to number N second delay circuits.

A clock controlling method in accordance with one aspect of the present invention includes following steps, step1: entering an input clock to a delay circuit sequence including a plurality of cascaded stages of delay circuit units each made up of a first circuit for outputting an input signal with a first delay time and a second circuit for outputting an output signal of said first circuit with a second delay time, step2: detecting, by a phase difference detection circuit, a phase difference between a clock pulse of the clock cycle next to the input clock fed to said delay circuit sequence and a clock pulse output from the last state delay circuit unit of the delay circuit sequence, that is a difference between the delay time of the delay circuit sequence and the clock period of input clock, step3: outputting, from a plurality of third circuits which receives output signals of the first circuits of said plural delay circuit units, transition edges of the output signals of said first circuits with respective different delay time, in accordance with a stage number of said delay circuit unit to which belongs said first circuit in said delay circuit sequence, in terms of time obtained on equally dividing said phase difference by the number of said delay circuit units in said delay circuit sequence, as a unit; wherein said third circuits outputting a plurality of output signals which make transition at a time interval corresponding to equal division of the clock period of said input clock with the number of said delay circuit units in said delay circuit sequence.

The above objets may also be accomplished by another aspect of the invention. In accordance with another aspect of the present invention, a clock control circuit includes a first delay circuit sequence including plural cascaded stages of delay circuits, a second delay circuit sequence including plural cascaded stages of delay circuits, an input clock entered to the stage 1 delay circuit of the first delay circuit sequence being output from the last stage delay circuit of the first delay circuit sequence after propagation through the first delay circuit sequence to be entered to the stage 1 delay circuit of second delay circuit sequence for propagation through the second delay circuit sequence. A plural number of interior division circuits are mounted in juxtaposition to one another in association with respective stages of the delay circuits of the first and second delay circuit sequences for outputting output signals with a delay time prescribed by the time corresponding to division of the phase difference between two input signals with a preset interior division ratio. The number 1 interior division circuit of juxtaposed plural interior division circuits is fed with an input clock output by the first delay circuit sequence and fed to the stage number 1 delay controlled of the second delay circuit sequence and the next cycle input clock.

The interior division ratio of plural interior division circuits is set such as to increase the respective delay time every preset unit T/N, with the phase different between output signals of two neighboring interior division circuits being tCK/N, with the phase difference between the output signal of the number 1 interior division circuit and the number N interior division circuit being the input clock period or tCK.

A clock control circuit includes a first delay circuit sequence including 2N cascaded stages of first delay circuit sequences, with a non-inverting phase clock being input at a stage number 1 delay circuit of first delay circuit sequence for propagation through the first delay circuit sequence, where N is an integer not less than 1, a second delay circuit sequence including 2N cascaded stages of first delay circuit sequences, with an inverting-phase clock being input at a stage number 1 delay circuit of second delay circuit sequence for propagation through second delay circuit sequence, where N is an integer not less than 1, and first and second groups of interior division circuits, each group including (N+1) interior division circuits for outputting an output signal of a delay time prescribed by the time obtained on dividing the phase difference of two input signals with a preset interior division ratio. The interior division ratio of (N+1) interior division circuits is set to respective different values in each group.

The number 1 interior division circuit of the first group of the interior division circuits is fed with an output signal of the stage number N delay circuit of the second delay circuit sequence and with a forward phase clock of the next cycle.

The number i interior division circuit of the first group of the interior division circuits, i being a number from 2 to N+1, is fed with an output signal of the number (N+1−1) delay circuit of the second delay circuit sequence and with an output signal of the delay circuit of the (i−1) stage number delay circuit of the first delay circuit sequence fed with forward phase clocks of the next cycle. The number 1 to number N interior division circuits output multi-phase clocks of a phase difference corresponding to N equal division of the input clock period. As will become clear from the following explanation, the above objects may similarly be achieved by the subject matter of the invention as defined on the respective claims.

A clock controlling method in accordance with another aspect of the present invention includes following steps, step1: connecting 2N cascaded stages of delay circuits, N being an integer not less than 1, inputting input clock to a stage number 1 delay circuit of a delay circuit sequence, step2: at least N interior division circuits for outputting an output signal of a delay time prescribed by time obtained on dividing a phase difference of two input signals by a predetermined interior division ratio, with the interior division ratio of said plural interior division circuits being set to respective different values, step3: the interior division circuit receiving an output signal of the stage number N delay circuit and with the input clock of the next cycle, and outputting an output signal of a delay time prescribed by the time obtained on dividing the phase difference of two input signals with a predetermined interior division ratio;

the interior division circuit fed with an output signal of the stage number (N+i) delay circuit, i being an integer from 1 to N−1, and with an output signal of the stage number i of the delay circuit of the next cycle input clock, outputting an output signal of a delay time prescribed by time obtained on dividing the phase difference of the two input signals by a preset interior division ratio; and step4: generating multi-phase clocks of a phase difference corresponding to N equal division of the input clock period through N of said interior division circuits.

Still other objects and advantages of the present invention will become readily apparent to those skilled in this art from the following detailed description, wherein only the preferred embodiment of the invention is shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 24 is a timing diagram for illustrating the operation of the interior division circuit shown in FIG. 23.

PREFERRED EMBODIMENTS OF THE INVENTION

Figure 1:
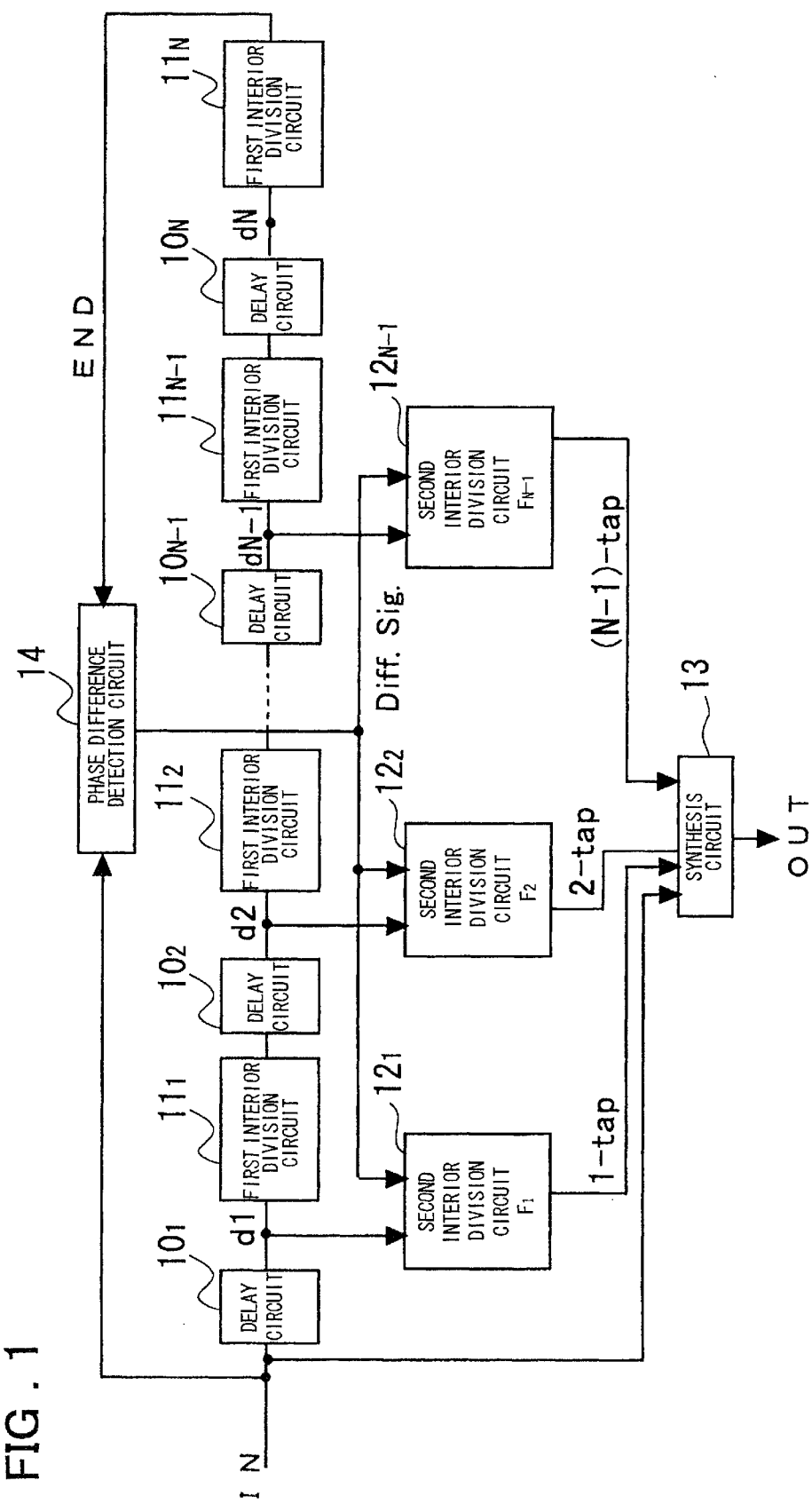
FIG. 1 shows a structure of an embodiment of the present invention.

Reference is made to the drawings for illustrating the embodiment of the present invention. FIG. 1 shows a illustrative configuration of a preferred embodiment of a clock control circuit in accordance with the present invention Referring to FIG. 1, the preferred embodiment of the clock control circuit according to the present invention include a cascaded connection of plural stages of delay circuit units, each of which is made up of a first delay circuit 10 having a first delay time t1 and a second delay circuit 11 (made up of a first interior division circuit) to form a delay circuit sequence. The second delay circuit 11 is adapted for delaying the rise or fall transition edge of an output signal of the first delay circuit 10 by a second delay time t2 to output the delayed output signal. This delay circuit sequence is fed with input clock IN of a period tCK. The clock received by this delay circuit sequence is delayed by delay time N×(t1+t2) so as to be output as a clock signal END.

An embodiment of the present invention includes a phase difference detection circuit 14 for detecting a phase difference T between an output terminal of a second delay circuit 11N (made up of a first interior division circuit) at the last stage of the delay circuit sequence and the input clock IN of the period tCK. The phase difference detection circuit 14 detects the phase difference T between the rising (or falling) transition edge of an output clock END from the delay circuit sequence and the rising (or falling) transition edge of an input clock after one clock period tCK (next clock cycle) of the input clock corresponding to the output clock END.

Since the phase difference T is given by $$T = N \times (t1+t2) - tCK \quad (2)$$

where T is the time difference between the delay time of the delay circuit sequence and the clock period tCK, it follows from the equation (2) that the time corresponding to N equal division of the clock period tCK is $$tCK/N = t1 + t2 - T/N \quad (3)$$

The present embodiment includes (N−1) third delay circuits 12, each made up of a second interior division circuit, and a synthesis circuit 13. The (N−1) third delay circuits 12 receives outputs from the first to (N−1)st delay circuit units of the first delay circuit 10 to send out delayed outputs, whilst the synthesis circuit 13 generates, from the input clock and the output signals from the (N−1) third delay circuits 12, a multiplied clock signal OUT, clock pulses of which are output at a time interval corresponding to N equal division of the period tCK of the input clock.

The number n third delay circuit 12, where n is 1 to N−1, delays the transition edge of the output signal of the first delay circuit 10 of the corresponding stage number n delay circuit unit, by delay time t2−n×T/N, based on the phase difference T as detected by the phase difference detection circuit 14, to output the resulting delayed output signal. The number n second interior division circuit, where n is 1 to N−1, outputs a signal, the rising or falling edge of which makes a transition at $$n \times (t1+t2-T/N) = n \times tCK/N \quad (4)$$

which represents the timing as from the clock cycle start time point, which is the transition edge of the input clock, the delay time (n−1)×(t1+t2) of the number (n−1) stage delay circuit unit, plus delay time t1 of the first delay circuit 10 of the number stage n delay circuit unit and further added by the delay time t2−n×T/N.

That is, the number 1 to number (N−1) third delay circuit 12 output clocks, which make transitions at the timings of $$1 \times tCK/N,$$

$$2 \times tCK/N, \ldots,$$

$$(N-1) \times tCK/N$$

with the synthesis circuit 13 generating, from these clocks and the input clock, N-multiplied clock signal, corresponding to N equal division of the period tCK of the input clock.

Figure 5:
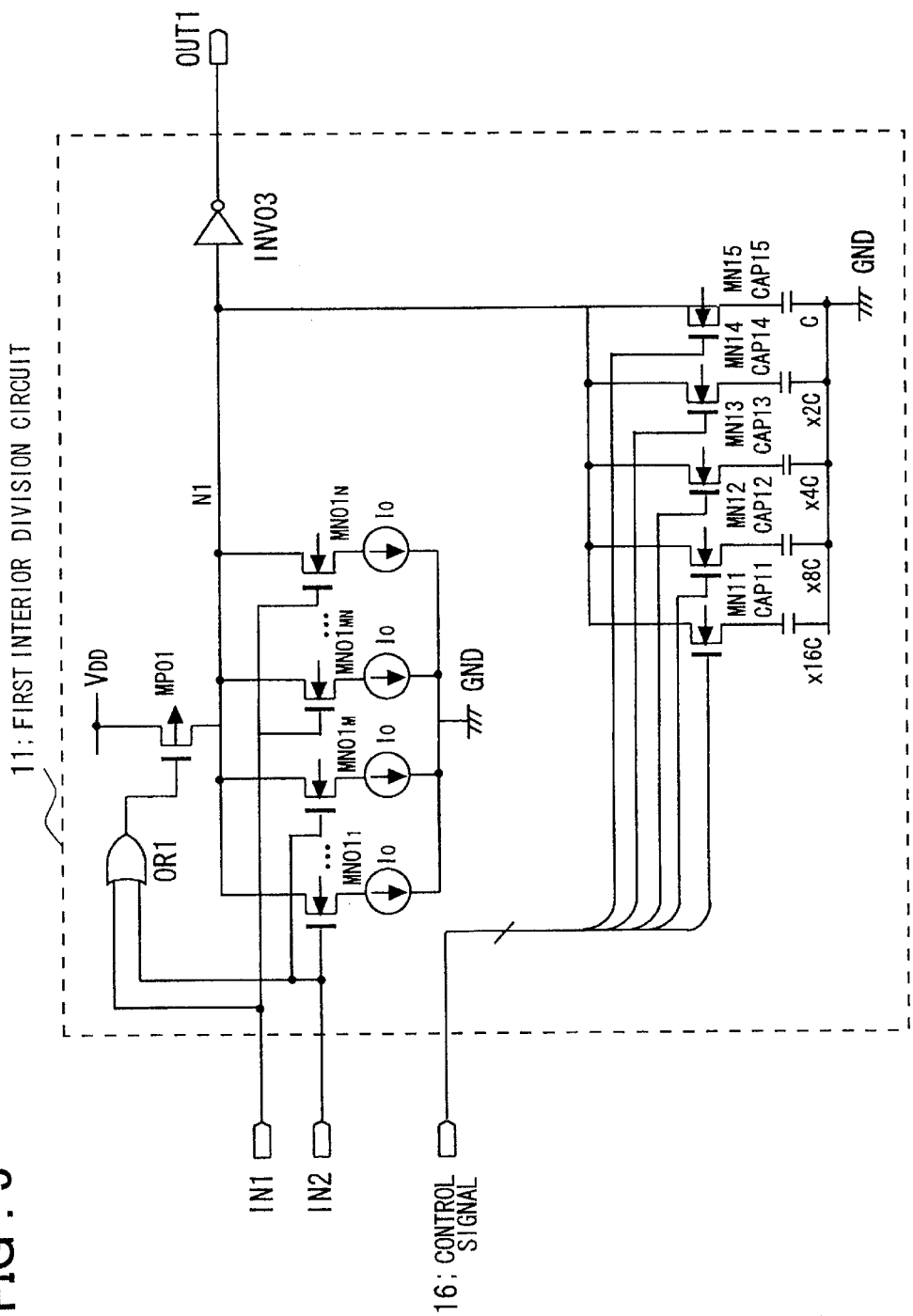
FIG. 5 shows a structure of a first interior division circuit according to an embodiment of the present invention.

According to the present invention, the second delay circuit 11 is comprised of an interior division circuit having a fixed interior division ratio (weight). Referring to FIG. 5, the second delay circuit 11 includes a switch MP01 which, when the input signal (output signal of the first delay circuit 10) is of a second value, turns on the charging path from a power supply of the capacitance of the internal node N1, N parallel-connected switches MN011 to MN01N for controlling the on/off of the discharge path discharging the electric charge stored in the capacitance to ground when the input signal is of the first value, and a buffer circuit INV03 for outputting the logic value corresponding to the magnitude relation between the internal node (terminal voltage of the capacitance) and a threshold voltage.

In this first interior division circuit, whether capacitance is to be controlled to charging or to discharging or whether the buffer circuit is to be a reverse type inverter or a forward type inverter is changed depending on the application logic. The first interior division circuit, adapted for charging the capacitance depending on the transition of the input signal and for varying an output when the capacitance terminal voltage exceeds a threshold voltage, includes a switch for turning on the discharge path when the input signal is of a second value, N parallel-connected switches for turning on the charging of the capacitance when the input signal is of a first value and a buffer circuit for outputting the logic value proportionate to the relative magnitude between the capacitance terminal voltage and the threshold value.

Figure 6:
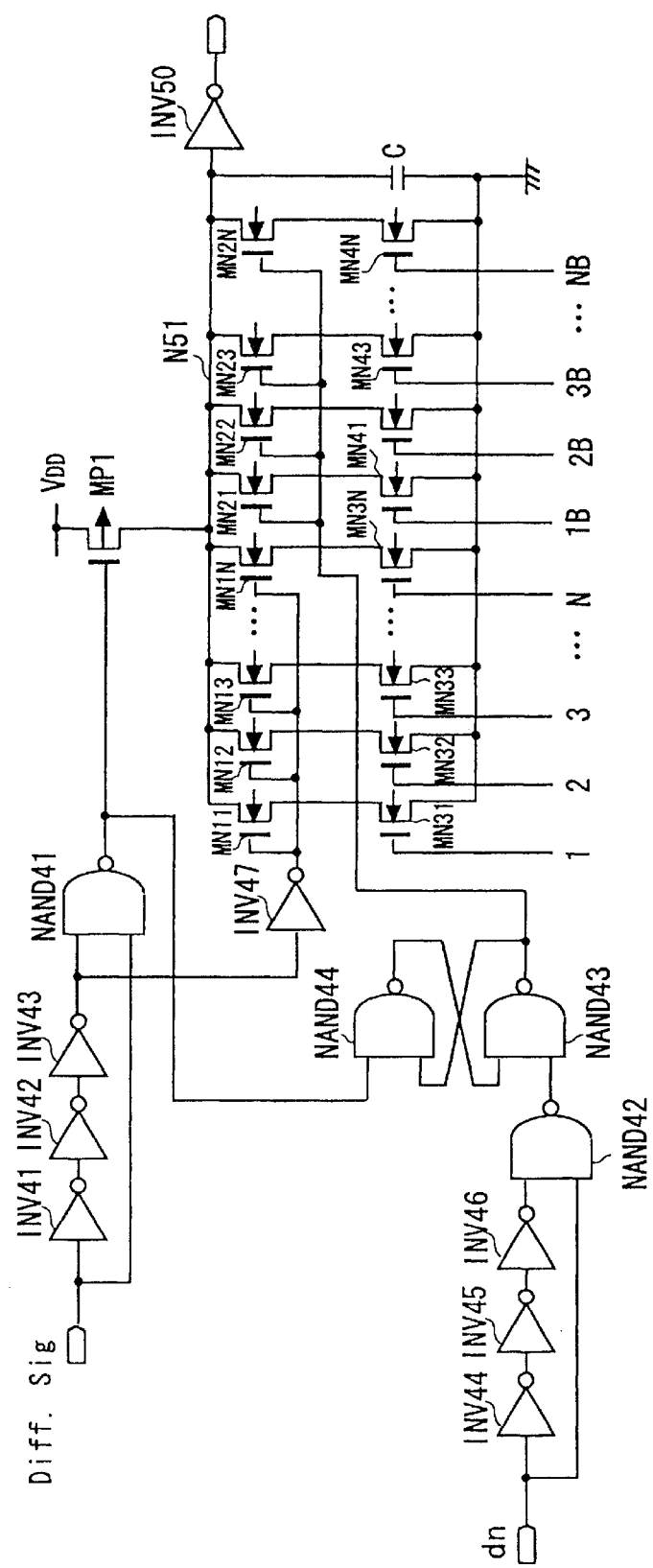
FIG. 6 shows a structure of a second interior division circuit according to an embodiment of the present invention.

The number 1 to number (N−1) third delay circuits 12 are interior division circuits $12_1$ to $12_{N-1}$, having interior division ratios set to different values of from $F_1$ to $F_{N-1}$. Referring to FIG. 6, the number n second interior division circuit at least includes a switch MP1 for turning on the charging path to the capacitor C of the internal node N1 at a preset timing prior to discharge, plural switches MN11 to MN1N and MN21 to MN2N connected in parallel for controlling the on/off of the discharge path to the ground of the stored electric charge of the capacitor C charged when the switch MP1 is on, and a buffer circuit INV50 for outputting a logic value corresponding to the magnitude relation between the terminal voltage of the capacitor C (voltage of the internal node N1) and the threshold value.

Of the plural switches MN11 to MN1N and MN21 to MN2N, n switches MN11 to MN1N are on/off controlled by an output (Diff. Sig.) of the phase difference detection circuit 14, and are turned on during the period corresponding to the phase difference T as detected by the phase difference detection circuit 14, so that, through these switches MN1N and MN21, the discharge path to the ground is formed to partially discharge the electric charge stored in the capacitor C.

In FIG. 6, the transitor pairs connected in series between the internal node N51 and the ground, such as MN11 and MN31, ... MN1N and MN3N, MN21 and MN41, ... MN2N and MN4N, may be reversed in their poistions. For example, the drains of transistors MN31 ... MN3N, and MN41 ... MN4N may be connected to the internal node N51 while the sources of transistors MN11 ... MN1N, and MN21 ... MN2N are connected to the ground and the drains thereof are connected to the sources of transistors MN31 ... MN3N, and MN41 ... MN4N resepectively.

With the capacitor C, in which the stored electric charge have been partially discharged, the N switches MN21 to MN2N, on/off controlled based on the output $d_n$ of the number n first delay circuit, are turned on, as from the time point the output signal of the number n first delay circuit has made the transition, to discharge electric charge of the capacitor C to lower the terminal voltage of the capacitor C to change the output value from the buffer circuit INV 50. It is noted that, after lapse of the period when the Diff. Sig is of the first value, the n switches MN11 to MN1N are turned off, while the electric charge of the capacitor C is kept.

In the number n second interior division circuit 12n, switches MN31 to MN3N and MN41 to MN4N, respectively connected to the plural switches MN11 to MN1N and MN21 to MN2N, are on/off controlled by the control signals 1 to N and the control signals 1B to NB. In the number n second interior division circuit 12n, n switches of the switches MN31 to MN3N are turned on, while the switches MN41 to MN4N are all turned on.

If, in the buffer circuit INV50 of the number n second interior division circuit 12n, the electric charge Q that needs to be extracted from the capacitor for the terminal voltage across the capacitor reaching the threshold value, is Q=C×V, where C and Q are capacitance and terminal voltage of the capacitor, respectively, the n switches MN11 to MN1N are turned on during the period the output signal of the phase difference detection circuit 14 (Diff. Sig) is of the first value. The n switches are turned on to discharge the electric charge CV with the current nI during the period when the output signal of the phase difference detection circuit 14 is of the first value, so that the stored charge of the capacitor C after discharging with the phase difference T (Diff. Sig) is $$CV-n\times I\times T \tag{5}$$

With this state of the stored electric charge of the capacitor C, after transition to the first value of the output dn of the number n first delay circuit, the N switches MN21 to MN2N of the second interior division circuit 12 are turned on to discharge the electric charge with the current N×1. The delay time since the time point of transition of the output $d_n$ of the number n first delay circuit 10 until transition of the output signals n-tap of the buffer circuit INV 50 of the second interior division circuit 12 is $$(CV-n\times I\times T)/(N\times I)=CV/NI-nT/N \tag{6}$$

The delay time t2 of the first interior division circuit 11 (the delay time until the output signal of the first interior division circuit 11 makes transition after the transition of the input signal) is CV/NI. That is, if, in the first interior division circuit 11, the electric charge Q that needs to be extracted from the capacitor for the terminal voltage of the capacitor to get to the threshold voltage is Q=CV, where C and V are the capacitance value and the terminal voltage of the capacitor, respectively, the electric charge stored in the capacitor C of the first interior division circuit 11 is discharged with the current NI, by turning the N switches MN011 to MN01N (see FIG. 5) when the input signal (output signal of the first delay circuit 10 located in a preceding stage) is changed from the second value to the first value, with the delay time t2 being CV/NI.

The number n second delay circuit 12 outputs an output signal which makes a transition at a timing of a delay CV/NI−nT/N from the output timing of the number n first delay circuit 10n, or (n−1)×(t1+CV/NI)+t1. The transition timing of this output signal is expressed as follows from the clock cycle start time point which is at a rising transition edge of the input clock IN, $$n\times t1+(n-1)\times CV/NI+CV/NI-nT/N$$

$$=n(t1+CV/NI-T/N)$$

$$=n\times tCK/N \tag{7}$$

where n=1, 2, ..., N−1.

The synthesis circuit 13 receives from the N−1 interior division circuits 12 clocks output at a time interval of tCK/N and the input clock to synthesize input signals to a single line signal for generating a frequency multiplied clock, which has a period obtained by equally dividing the input clock period tCK.

Figure 10:
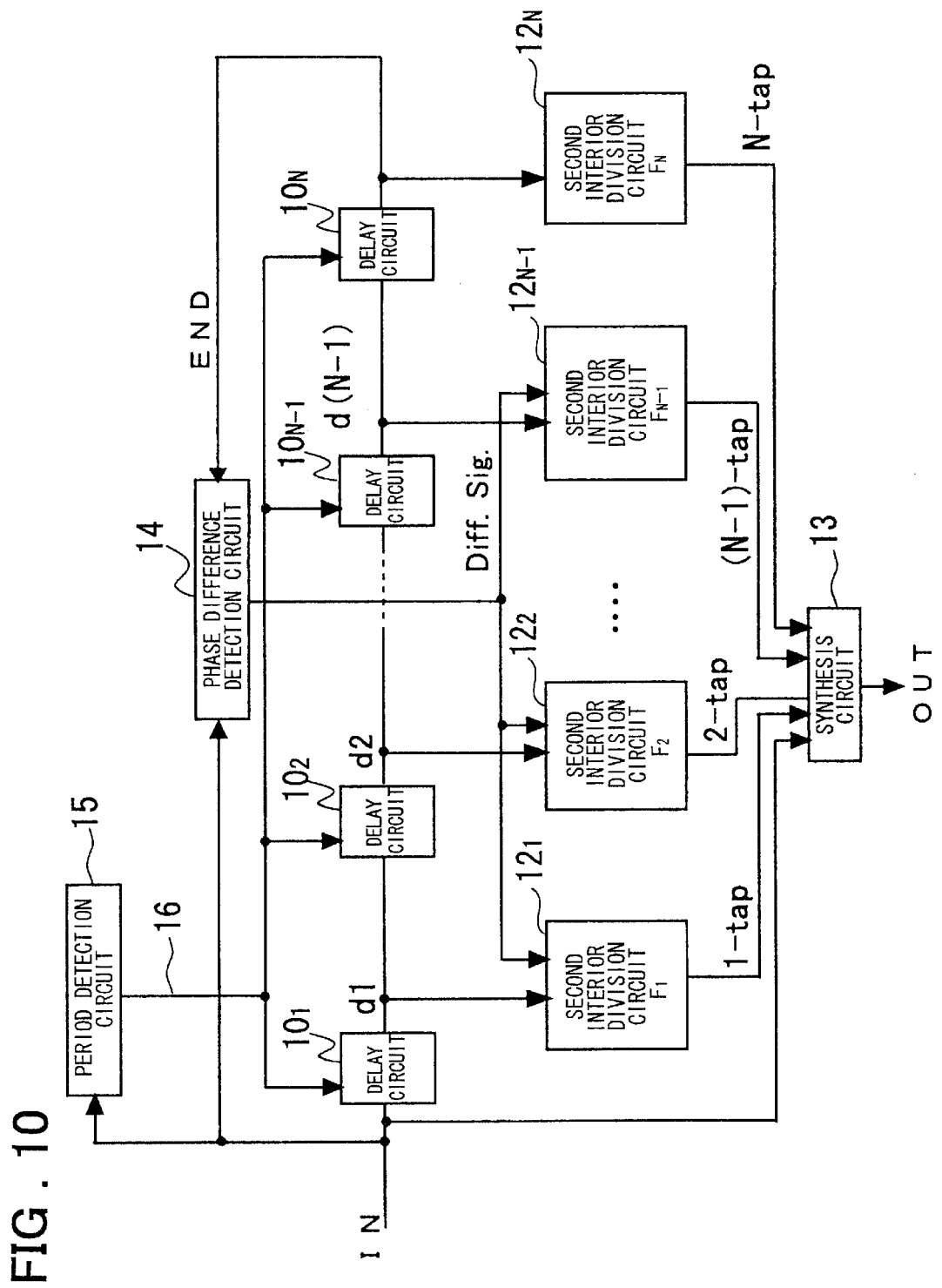
FIG. 10 shows a further embodiment of the present invention.

Referring to FIG. 10, in an another embodiment, a circuit in accordance with the present invention, includes a delay circuit sequence which is comprised of plural delay circuits $10_1$ to $10_N$ connected in cascade in plural stages (N stages), each of which has a delay time t1, receives an input clock with the period tCK and outputs a signal END delayed by time N×t1, and a phase difference detection circuit 14 which receives the input clock IN and the output clock END output from the delay circuit sequence. The phase difference detection circuit 14 detects the time difference T between the delay time of the delay circuit sequence and the clock period (T=tCK−N×t1) as the phase difference between the output clock and an input clock of the next cycle of the input clock corresponding to the output clock to output a signal of an active state during the time corresponding to the phase difference T.

There are provided number 1 to number N interior division circuits $12_1$ to $12_N$ in association with the number 1 to number N delay circuits $10_1$ to $10_N$, respectively. These interior division circuits $12_1$ to $12_N$ are configured similarly to the second interior division circuits $12_1$ to $12_N$ of the previous embodiment. Referring to FIG. 6, the number n interior division circuit which receives an output from the number n first delay circuit 10n as an input, at least includes a switch MP1 for turning on the charging path to a capacitor C of an internal node N1 at a preset timing prior to discharge, a plural number of switches MN11 to MN1N and MN21 to MN2N connected in parallel for controlling the on and off of the discharge path to the ground of the electric charge stored in the capacitor C which is charged when the switch MP1 is on, and a buffer circuit INV50 for outputting a logic value corresponding to the magnitude relation between the terminal voltage of the capacitor C (voltage of the internal node N1) and a threshold value. Of the plural switches MN11 to MN1N and MN21 to MN2N, (N−n) switches MN11 to MN1N−n are on/off controlled by an output (Diff. Sig.) of the phase difference detection circuit 14, and are turned on during the period corresponding to the phase difference T as detected by the phase difference detection circuit 14, so that the discharge path to the ground is formed through these (N−n) switches MN1N and MN1N−n to partially discharge the electric charge stored in the capacitor C.

With the capacitor C, from which the electric charge has been partially discharged, the N switches MN21 to MN2N, on/off controlled based on the output signal dn from the number n first delay circuit $10_n$, are turned on, from the time point when the output signal of the number n first delay circuit $10_n$ has made the transition, to discharge electric charge of the capacitor C to lower the terminal voltage of the capacitor C to change the output value from the buffer circuit INV 50. It is noted that, after lapse of the period when the Diff. Sig is of the first value, the n switches MN11 to MN1N−n are turned off, while the electric charge of the capacitor C is preserved.

In the second interior division circuit 12n, switches MN31 to MN3N and MN41 to MN4N, respectively connected to the plural switches MN11 to MN1N and MN21 to MN2N, are on/off controlled by the control signals 1 to N and the control signals 1B to NB. In the number n second interior division circuit, (N−n) switches of the switches MN31 to MN3N are turned on, while the switches MN41 to MN4N are all turned on.

If, in the buffer circuit INV50 of the number n second interior division circuit 12, the electric charge Q of the capacitor that needs to be extracted for the terminal voltage of the capacitor reaching the threshold value is such that Q=C×V, where C and Q are capacitance and terminal voltage of the capacitor, respectively, the (N−n) switches MN11 to MN1N−n are turned on during the period when the output signal of the phase difference detection circuit 14 (Diff. Sig) is of the first value, and the N-n switches are turned on to discharge the electric charge CV with the current (N−n)I during the period when the output signal of the phase difference detection circuit 14 (Diff. Sig) is of the first value, so that the electric charge stored in the capacitor C after discharging with the phase difference T (Diff. Sig) is $$CV-(N-n)\times I\times T \qquad (8)$$

With the electric charge quantity stored in the capacitor C being kept in this state, after a transition to the first value of the output dn of the number n first delay circuit, the N switches MN21 to MN2N of the second interior division circuit 12 are turned on to discharge the electric charge with the current N×1. The delay time since the time point of the transition of the output $d_n$ of the number n first delay circuit 10 to a transition of the output signal n-tap of the buffer circuit INV 50 of the second interior division circuit 12 is $$(CV-(N-n)\times I\times T)/(N\times I)=CV/NI-(N-n)\times T/N \qquad (9)$$

The number n second interior division circuit 12n outputs an output signal n-tap which makes a transition with a timing of the delay time CV/NI−(N−n)×T/N from the output timing of the number n first delay circuit $10_n$ or n×t1.

This output signal n-tap has its transition timing $$n\times t1+CV/NI-(N-n)\times T/N=CV/NI+n\times t1+nT/N-T \qquad (10)$$

where n=1, 2, . . . , N−1, from the clock cycle start time point which is the rising transition edge of the input clock IN.

The time difference between the neighboring output signal n-tap and (n+1)-tap is t1+T/N, and the N second interior division circuits $12_1$ to $12_N$ output multi-phase clocks (with the clock period of tCK) with a phase difference of an equal interval (=t1+T/N).

The synthesis circuit 13 is fed with clocks output at equal time intervals from the N second interior division circuits $12_1$ to $12_N$ and with the input clock to synthesize them into one signal to generate a frequency multiplied clock.

Figure 2:
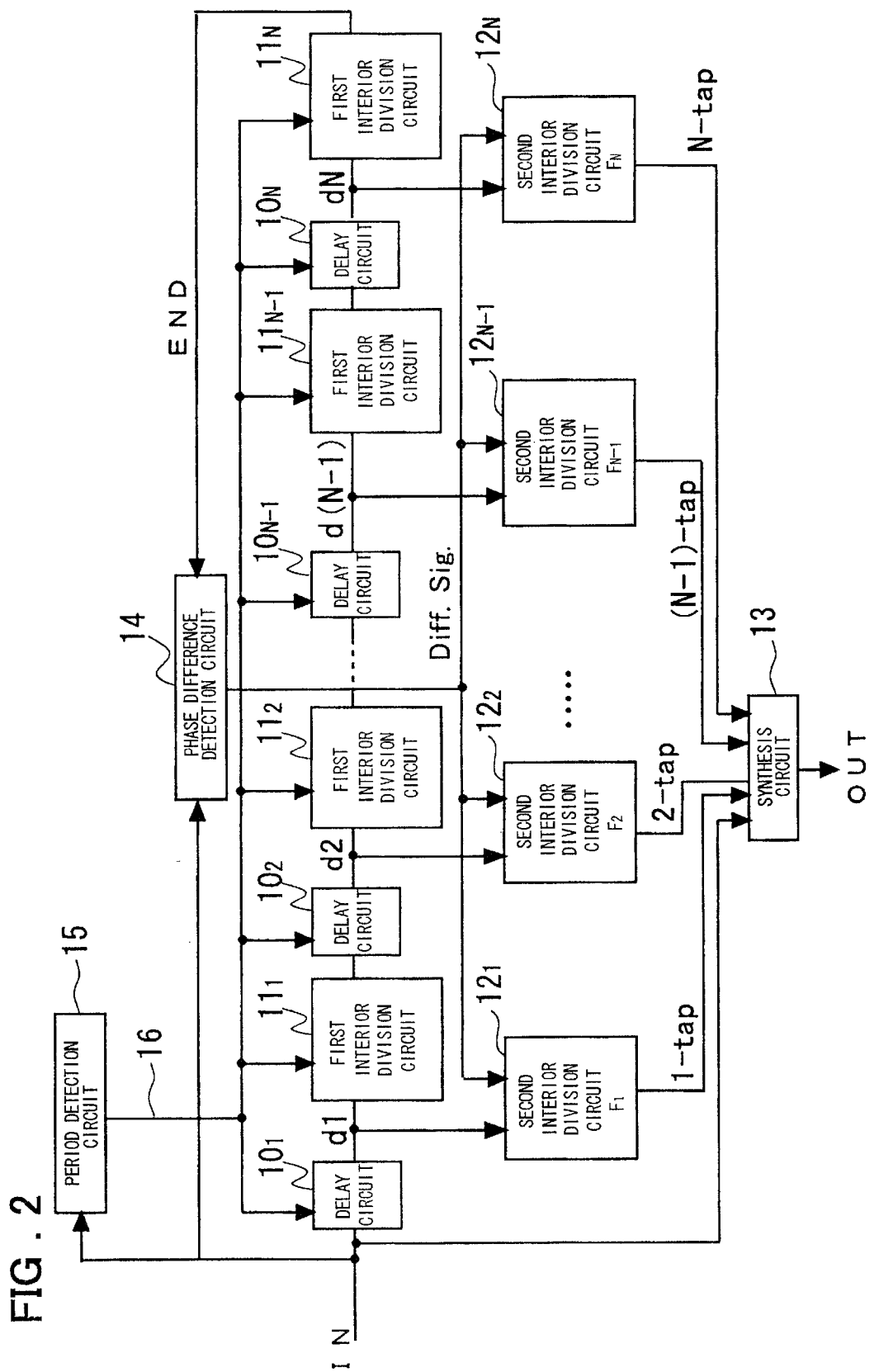
FIG. 2 shows a structure of an embodiment of the present invention.

For further detailed explanation of the above-described embodiments of the present invention, reference is made to the drawings, of which FIG. 2 shows the configuration of an embodiment of the present invention.

Referring to FIG. 2, the present embodiment includes a delay circuit sequence comprised of plural (N) delay circuit units, each of which is made up of a first delay circuit 10 with a first delay time t1 and a first interior division circuit 11 which delays a rising or falling edge of an output signal output from the first delay circuit 10 with a second delay time t2. The plural delay circuit units are connected to one another in a cascaded connection to form a delay circuit sequence for delaying the input clock which has a clock period tCK and is fed to the initial stage by time N×X(t1+t2). The present embodiment also includes a phase difference detection circuit 14 and a period detection circuit 15.

The period detection circuit 15 is made up of a ring oscillator having a fixed number of stages and a counter. During one period of the input clock IN, the number of times of oscillations in the ring oscillator is counted to detect the period of the clock IN to output a control signal 16 indicating the clock period to adjust the delay time of the first delay circuits $10_1$ to $10_N$ and the first interior division circuits $11_1$ to $11_N$. If the input clock IN is of a high clock rate, the period detection circuit 15 may be adapted to count the number of times of oscillations of the ring oscillator during one period of the signal obtained by frequency dividing the input clock IN to detect the period.

The phase difference detection circuit 14 detects the phase difference T between the rise or fall transition edge of the clock END output from the delay circuit sequence and the rising or falling edge of a clock which is input after one clock period tCK of the input clock corresponding to the output clock. This phase difference T corresponds to the time difference between the delay time of the entire delay circuit sequence and the clock period tCK. The phase difference detection circuit 14 outputs a signal (Dif. Sig) which is made active (e.g., high level) during the time period (time width) of the phase difference tCK/N=t1+t2−2T/N. The following relationship:

$$tCK/N=t1+t2-T/N$$

holds between the clock period tCK, the delay time t1, t2 and the phase difference T.

N−1 second interior division circuits $12_1$ to $12_{N-1}$ are provided in association with the first delay circuit $10_1$ to $10_{N-1}$ of the 1 to N−1 delay circuit unit. The number n interior division circuit $12_n$, receiving the output signal of the number n first delay circuits $10_n$, as an input, where n is 1 to N, is so arranged that n switches connected in parallel in discharge paths are turned on by an output signal of the phase difference detection circuit 14, the electric charge store in the capacitor of the interior division circuit $12_n$ is discharged with the current nI (discharged charge =nI×T), during the time period corresponding to the phase difference T output from the phase difference detection circuit 14, and the N discharge path switches connected in parallel are turned on, from the time point when the number n first delay circuit 10n is changed to the first value, from the partially discharged capacitor, with the electric charge of the capacitor then being discharged with the current NI to lower the terminal voltage of the capacitor to change the output value from the buffer circuit.

If, in the buffer circuit of the number n second interior division controlled 12, the electric charge Q of the capacitor that need to be extracted from the capacitor for the terminal voltage of the capacitor reaching the threshold voltage is such that Q=CV, where C and V are capacitance values and the terminal voltage of the capacitor, respectively, the n switches of the discharge paths are turned on during the time T when the output signal of the phase difference detection circuit 14 (Diff. Sig) is of the first value, and the charges CV is discharged with the current nI, so that the amount of the electric charge stored in the capacitor C after discharging with the phase difference T (Diff. Sig) is CV −n×I×T. Then, after the output signal of the number n first delay circuit is changed to the first value, the N switches of the second interior division circuit 12 are turned on to discharge the electric charge stored in the capacitor C with the current N×I. The delay time as from the time point of transition of the output dn output from the number n first delay circuit 10 to a transition of the output signal n-tap output from the buffer circuit INV50 of the second interior division circuit 12 is $$(CV-n\times I\times T)/(N\times I)=CV/NI-nT/N.$$

The delay time t2 of the first interior division circuit 11 is CV/NI. That is, the first interior division circuit 11 which constitutes the second delay circuit 11 is arranged so that, if the amount of electric charge Q that needs to be extracted from the capacitor for reaching the threshold value is such that Q=CV, where C and V are capacitance value and the terminal voltage of the capacitor, respectively, the N switches MN011 to MN01N are turned on when the input signal is changed from the second value to the first value to discharge the electric charge stored in the capacitor C by the current NI and hence the delay time t2 is CV/NI.

The number n second interior division circuit 2 outputs an output signal which makes a transition at a timing of the delay time CV/NI−nT/N, from the output timing of the number n first delay circuit $10_n$ (timing from the transition edge of the input clock), or (n−1)×(t1+CV/NI)+t1.

The transition timing of the output signal is $$t1 \times n + (n-1) \times CV/NI + CV/NI - nT/N = n(t1+CV/NI-1/T) = n \times tCK/N,$$

where n=1, 2, ... N−1.

The synthesis circuit 13 receives multi-phase clocks output from the N−1 interior division circuits 12 and the input clock to form a single stream signal to generate a frequency multiplied clock having a period corresponding to N equal division of the period tCK of the input clock.

The synthesis circuit 13 may be of any suitable configuration provided that it multiplexes input signals to form a single line output signal. For example, the synthesis circuit 13 may include a plurality of circuits for detecting the rising edge of the input signal from the low level to the high level to generate a signal of a preset pulse width, to take the logical OR of the output signals of the circuit to multiplex the signals into a single line signal. The number of the circuits for detecting the rising edge of the input signal corresponds to the number of input signals.

In an embodiment of the present invention, the period detection circuit 15 detects clock periods of the input clock and outputs a control signal 16 indicating the detected clock period to the first delay circuit 10 and to the first interior division circuit 11 to variably set the delay time of the respective circuits. If, in the configuration shown in FIG. 2, the clock period is known at the outset, the period detection circuit 15 may be omitted.

The circuit shown in FIG. 2 includes N second interior division circuits 12, and the number N second interior division circuit $12_N$ outputs a signal corresponding to the delay of the input clock IN delayed by one clock period tCK. That is, the output signal N-tap from the second interior division circuit $12_N$ outputs a signal which makes a transition at a timing NxtCK from the clock cycle start time point. It is also possible for the synthesis circuit 13 to generate a frequency multiplied signal using the output signal N-tap of the second interior division circuit $12_N$ in place of the input clock IN.

Figure 3A:
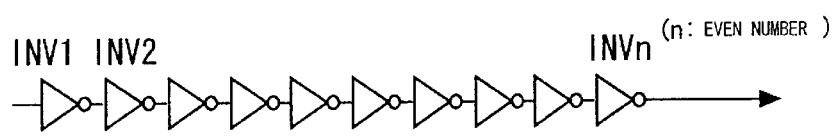
FIGS. 3a and 3b show a structure of a delay circuit according to an embodiment of the present invention.

FIG. 3 shows the configuration of the first delay circuit 10 explained with reference to FIGS. 1 and 2. The first delay circuit 10 has, as its basic structure, an even number of stages of inverters (see FIG. 3a).

Figure 3B:
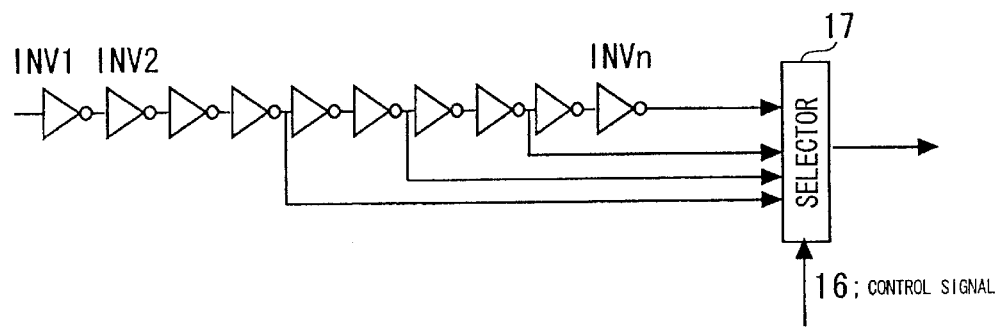

If, in the circuit configuration of the embodiment shown in FIG. 2, the clock period of the input clock IN is detected by the period detection circuit 15 and the delay time is variably set by the control signal 16 depending on the clock period, the tap of the delay circuit (a sequence of inverters), from which the delayed output signal is taken, may be selected by a selector 17, based on the control signal 16, as shown in FIG. 3b.

The phase difference detection circuit 14 may be of any desired configuration provided that it can detect the phase difference between the input clock IN and the signal END which is a clock pulse that was fed to the delay circuit sequence, one clock ahead of the current input clock IN, and propagated through the delay circuit sequence to make delay so as to be output from the delay circuit sequence, that is the time difference between the clock period tCK and the delay time of the delay circuit sequence, to output a signal of a time width corresponding to the phase difference. FIG. 4 shows a typical circuit configuration.

Figure 4A:
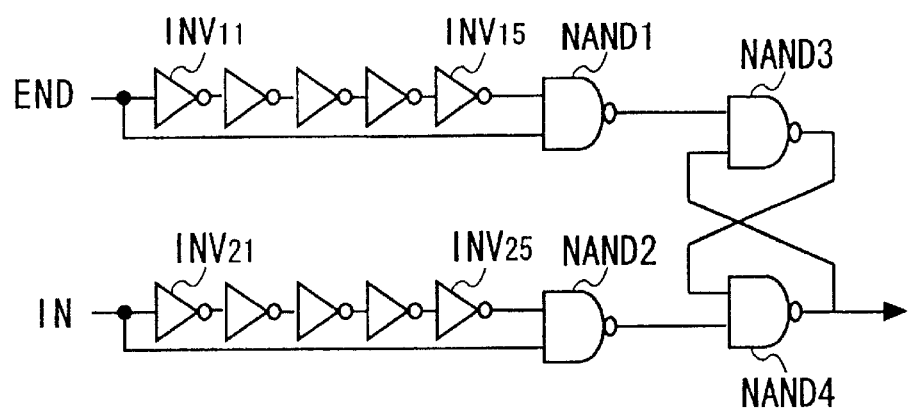
FIGS. 4a and 4b show a structure of a phase detection circuit according to an embodiment of the present invention.

Referring to FIG. 4a, the phase difference detection circuit 14 includes a odd number of stages of inverters INV11 to INV15, herein five inverters, for inverting and delaying the delayed clock END output from the delay circuit sequence, a first NAND circuit NAND 1 which receives an output signal of the inverter sequence and the delayed clock END, an odd number of stages, herein five stages, of inverters INV21 to INV25, a second NAND circuit NAND2 which receives an output signal of the inverter sequence, as an input, and an RS flip-flop (RS-latch) composed of a third and fourth NAND circuits NAND 3, NAND4, both of which have outputs and inputs cross-connected to each other.

Referring to FIG. 4a, the operation of this phase difference detection circuit 14 is explained. At a time point the input clock IN (clock pulse) is changed from a low level to a high level, a signal of a pulse width (low level) corresponding to the time delay of the inverter sequence INV21 to INV25 is output from the NAND2. On receipt of this signal, the NAND4 sets its output (output signal of the phase difference detection circuit 14) to the high level (set state), with the NAND3 outputting the low level signal to maintain this state. Then, at a time point the signal END output from the delay circuit sequence is changed from the low level to the high level, a signal of a pulse width (low level) corresponding to the time delay of the inverter sequence INV11 to INV15 is output from the NAND1. On receipt of this signal, the NAND 3 sets its output to th high level. Responsive thereto, the output signal of the NAND 4 is at a low level (reset).

As a result, from the RS flip-flop circuit of the phase difference detection circuit 14 is output a high level signal during a time period as from the timing of the rising edge of the clock pulse of the signal END until the timing of the rising edge of the input clock of the next cycle of the input clock corresponding to the clock pulse of the signal END (this input clock being delayed by the delay circuit sequence to output the clock pulse of the signal END). This time period is the aforementioned phase difference T.

Figure 4B:
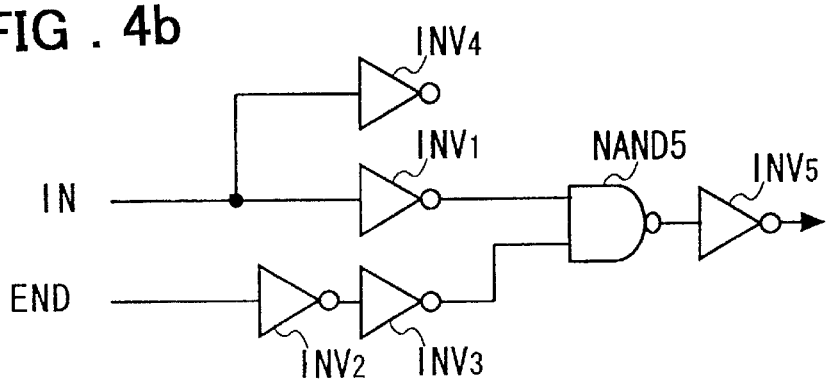

Referring to FIG. 4b, the phase difference detection circuit 14 includes as a simple structure version, a NAND 5 which receives a signal corresponding to the input clock inverted by the inverter INV1 and with a signal corresponding to the signal END delayed by the inverters INV2 and INV3, and an inverter INV5 for inverting the output signal of NAND 5. This phase difference detection circuit 14 outputs a high level signal during the time period when the input clock is at a low level and the signal END is at a high level (this time period corresponding to the aforementioned phase difference T). The inverter INV4 is used for adjusting the load of a path fed with the input clock signal IN and with the signal END. From the perspective of layout of the signal wiring and signal delay, the phase difference detection circuit 14 may be provided in the second interior division circuit.

Figure 14A:
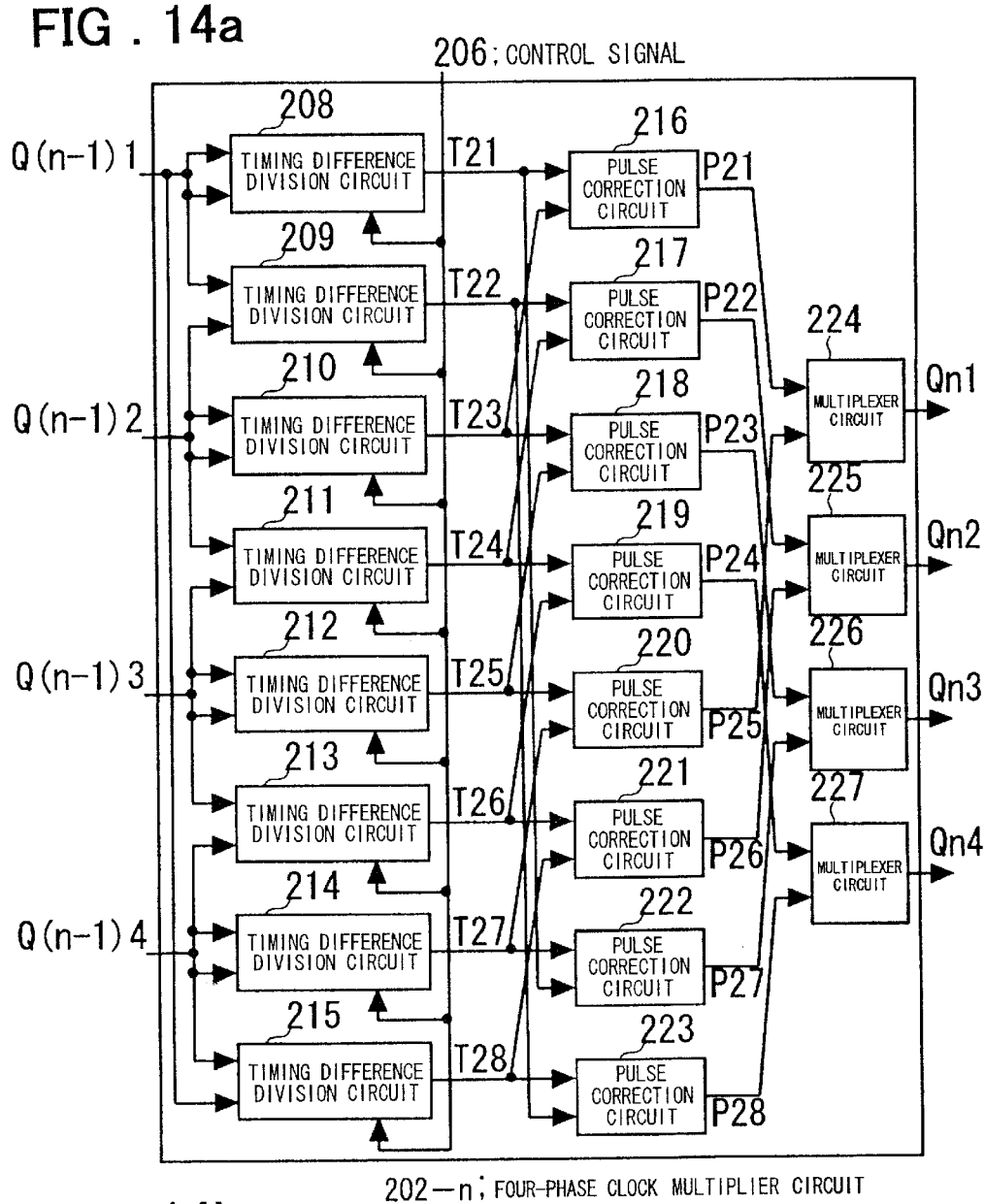
FIG. 14 shows the structure of a four-phase clock multiplier circuit shown in FIG. 11.
Figure 14B:
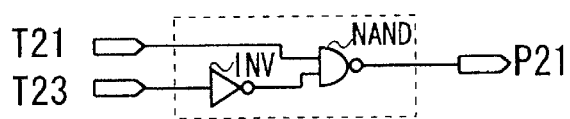
Figure 14C:
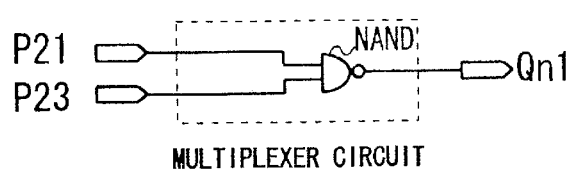

FIG. 5 shows an illustrative structure of the first interior division circuit 11 in a first embodiment of the present invention. In FIG. 5, the first interior division circuit 11 is basically comprised of a timing difference division circuit shown in FIG. 14, and is made up of a p-channel MOS transistor MP01 which is connected across a power supply VDD and an internal node N1, a logical OR circuit OR1 which receives signals from two input terminals IN1, IN2 and has its output terminal connected to the gate of the p-channel MOS transistor MP01 to be adapted to turn on the p-channel MOS transistor MP01 when the input signals fed to the two input terminals IN1 and IN2 in common are low, an inverter INV03 which has its input terminal connected to the internal node N1, m pieces of n-channel MOS transistors which are connected across the internal node N1 and the ground and have the gates fed in common with the input signal supplied to the input terminal IN1, and N-m pieces of n-channel MOS transistors which are connected across the internal node N1 and the ground and have the gates fed with the input signal supplied to the input end IN2. So, the first interior division circuit 11 includes a total of N number n-channel MOS transistors $MN01_1$ to $MN01_N$. The first interior division circuit 11 also includes a plural number of series circuits, each of which is composed of an n-channel MOS transistor and a capacitor, that is, MN11 and CAP11, MN12 and CAP12, MN13 and CAP13, MN14 and CAP14, and MN15 and CAP15, connected in parallel across the internal node N1 and the ground. The switches MN11 to MN15, making up the series circuit, are turned on or off by a control signal 16 output by the period detection circuit (15 of FIG. 2), with the capacitance value of the capacitor connected to the internal node N1 being changed depending on the clock period.

In the configuration shown in FIGS. 1 and 2, an output signal of the first delay circuit 10 of the precedent stage is supplied in common to the two input terminals IN1, IN2 of the first interior division circuit 11 shown in FIG. 5. Stated differently, the first interior division circuit 11 is arranged so that the p-channel MOS transistor MP01, turned on when the input signal input in common is at a low level, is connected across the power supply VDD and the internal node N1, to which the capacitor is connected, and N pieces of n-channel MOS transistors MN011 to MN01N, turned on when the input signal is at a high level, are connected in parallel across the internal node N1 and the ground with the internal node N1 being connected to the inverter INV03.

Referring to FIG. 5, the operation of the first interior division circuit 11 is explained. If, in case the input signal is at a low level, the p-channel MOS transistor MP01 is turned on, and the internal node N1 is charged by the power supply voltage, the amount of electric charge Q that needs to be discharged until inversion of the output signal of the inverter INV03 occurs is CV, the input signal rises to a high level from a low level, the N pieces of n-channel MOS transistors MN011 to MN01N are turned on, the electric charge Q is discharged with the constant current NI, the voltage level of the internal node N1 falls to below the threshold value, and the output signal of the inverter INV03 rises to the high level from the low level. In this first interior division circuit 11, the time delay from the rising transition of the input signal to the rising transition of the output signal is CV/NI.

A control signal 16 output from the period detection circuit 15 is fed to gates of the n-channel MOS transistors MN11 to MN15 to turn the transistors on or off. If the clock period tCK detected is long or short, the value of the capacitance added to the internal node N1 is increased or decreased, respectively. Since this structure varies the capacitance added to the internal node N1 depending on the clock period, it is possible to cope with the input clock over a wide frequency range.

The relation between the logic values of the input signals and the charging/discharging in the first interior division circuit 11 may, of course, be reversed. For example, N pieces of p-channel MOS transistors may be connected across the power supply VDD and the internal node N1, with m pieces among N pieces of p-channel MOS transistors having gates being fed with the input IN1 inverted by the inverter, N-m pieces among N pieces of p-channel MOS transistors having gates being fed with a signal corresponding to the input IN2 inverted by the inverter, one n-channel MOS transistor being connected across the internal node N1 and the ground and with an output signal of the logic circuit taking the NOR of the inputs IN1 and IN2 being connected to the gate of the n-channel MOS transistor. If, in this case, the inputs IN1 and IN2 are both low, the n-channel MOS transistor connected across the internal node and the ground is turned on, with the capacitor being discharged. When the inputs IN1 and IN2 are changed to a high level, the p-channel MOS transistor connected across the power supply VDD and the internal node N1 is turned on to charge the internal node N1. If, responsive to transition of the inputs IN1 and IN2 from the low level to the high level, the output is to be switched from the low level to the high level, a non-inverting buffer circuit or a two-stage inverter is connected to the internal node in place of the inverter.

FIG. 6 shows a typical structure of the second interior division circuit 12 in the first embodiment of the present invention. Referring to FIG. 6, the second interior division circuit 12 includes a NAND circuit NAND42 and a inverter sequence INV44 to INV46. The NAND 42 receives the output signal dn output from the first delay circuit of the stage number n delay circuit unit, and an output signal from an inverter INV46. The inverter sequence INV44 to INV46 receives the signal dn, inverts and delays the signal by of odd number, herein three, of inverters. The NAND 42 outputs a low level first pulse signal during a time period corresponding to the time delay of the inverter sequence INV44 to INV46, on transition of the output signal dn from the low level to the high level.

The second interior division circuit 12 includes further a NAND circuit NAND41 and a inverter sequence INV41 to INV43. The NAND circuit NAND 41 receives the output signal Diff.Sig output from the phase difference detection circuit 14. The inverter sequence INV41 to INV43 receives the signal Diff.Sig, inverts and delays the signal by of odd number, herein three, of inverters. The NAND circuit NAND41 outputs a low level second pulse signal during a time period corresponding to the time delay of the inverter sequence INV41 to INV43, on a transition of the output Diff.Sig from the low level to the high level. A sequential logic circuit is provided by cross-connecting inputs and outputs of NAND circuits 43, 44, there being an RS flip-flop circuit arranged so that the first pulse signal output from the NAND 42 is received by the NAND 43, which then outputs a high level and is reset, and so that the second pulse signal output from the NAND 41 is received by the NAND 44, which then outputs a low level and is reset.

Referring to FIG. 6, the second interior division circuit 12 includes a p-channel MOS transistor MP1 connected across the power supply VDD and an internal node N51 and which is turned on when the second pulse signal from the NAND 41 is at a low level, a capacitor C connected across the internal node N51 and the ground, and an inverter INV50 which has an input terminal connected to the internal node N51 and the output terminal for outputting an output signal n-tap.

The second interior division circuit 12 also includes 2N pieces of n-channel MOS transistors MN11 to MN1N and MN21 to MN2N, the drains of which are connected to the internal node N51 and which are connected in parallel with one another, and 2N pieces of n-channel MOS transistors MN31 to MN3N andMN41 to MN4N, the drains of which are connected respectively to the sources of the 2N pieces n-channel MOS transistors MN11 to MN1N and MN21 to MN2N and the sources of which are connected to the ground.

The gates of one half N of the 2N n-channel MOS transistors MN11 to MN1N are connected in common to the output terminal of an inverter INV 47 which receives an output signal from the inverter sequence INV41 to INV43 which receives the signal Diff.Sig from the phase difference detection circuit 14, while the gates of the remaining half N of the 2N n-channel MOS transistors MN11 to MN1N are connected, in common, to the output terminal of the NAND 43 (output terminal of the RS flip-flop).

In the number n second interior division circuit 12, n of the n-channel MOS transistors MN31 to MN3N are turned on by the control signals 1 to N and 1B to NB which are fed to the gates of the n-channel MOS transistors MN31 to MN3N and MN41 to MN4N. The gates of the n-channel MOS transistors MN41 to MN4N may also be connected to the power supply VDD.

Referring to FIG. 6, the operation of the number n second interior division circuit 12 is explained. The p-channel MOS transistor MP1, the gate of which is fed with an output signal of the NAND 41, outputting the second pulse signal which is at a low level during the time corresponding to the delay time of the inverter sequence 41 to 43 on transition of the signal Diff. Sig from the low level to the high level, is turned on during the time period when the output signal of the NAND 41 is at a low level, and charges the capacitor C with the current from the power supply.

With transition to the high level from the low-level period of the output signal of the NAND 41 (time period is equivalent to the time delay of the inverter sequence INV41 to INV43), the high level of the signal Diff. Sig, delayed by the inverter sequence INV41 to INV43 and the inverter INV47, is input during the period of the phase difference T to the gates of the n-channel MOS transistors MN11 to MN1N. These n-channel MOS transistors MN11 to MN1N are turned on during this time. The charge accumulated in the capacitor C are partially discharged through the paths of n pieces of n-channel MOS transistors among the n-channel MOS transistors MN31 to MN3N, the drains of which are connected to the sources of the n-channel MOS transistors MN11 to MN1N, the sources of which are connected to the ground, the gates of which are fed with control signals 1 to N, and which are turned on by the control signals.

In the number n second interior division circuit 12n, fed with the output dn of the number n delay circuit, the capacitor C is discharged during the time T through n pieces of n-channel MOS transistors among the n-channel MOS transistors MN31 to MN3N which have been turned on by the control signal. As a result, the electric charge required to discharge for the switching of the inverter INV50 to occur is CV-nTI.

The high level period of the signal Diff. Sig is T. After this time period T has elapsed, the output signal of the inverter INV47 is at a low level. The n-channel MOS transistors MN11 to MN1N, the gates of which are connected to the output terminal of the inverter INV47, are all turned off, with the discharge path being turned off. So, the electric charge stored in the capacitor C is held at CV-nTI. From the circuit operating frequency, it is assumed that the voltage drop due to leakage current of the electric charge stored in the capacitor C can be discounted. Stated differently, the following discharge operation occurs before the voltage drop of the capacitor C by the leakage current is at issue:

That is, at the time of rising transition from the low level to the high level of the output dn of the number n first delay circuit 10, NAND42 outputs a low level during the time corresponding to the time delay of the inverter sequence INV44 to INV46. Responsive thereto, the output signal of the NAND 43 forming the RS flip-flop circuit goes to a high level, and this set state of the RS flip-flop circuit is kept until being reset. Then the n-channel MOS transistors MN21 to MN2N, the gates of which are connected to the output terminal of NAND 43 are turned on. Since the n-channel MOS transistors MN41 to MN4N, the gates of which are connected with control signals 1B to 4B, are at all times turned on, the charge CV-nTI stored in the capacitor C is discharged by the current NI.

So, the n-tap signal makes a transition from a low level to a high level at a timing when the delay time (CV-nTI)/NI has elapsed from the timing of the transition from the low level to the high level of the output signal dn of the number n first delay circuit 10.

In the second interior division circuit 12, the input signal logic and the charging/discharging of the capacitor may, of course, be reversed from that shown in FIG. 6. In this case, the n-channel MOS transistor, connected across the internal node N51 and the ground in FIG. 6, is the p-channel MOS transistor, connected across the internal node N51 and the power supply VDD, the p-channel MOS transistor, connected across the power supply VDD and the internal node N51, is replaced by the n-channel MOS transistor, connected across the internal node N51 and the ground, a signal corresponding to the output signal of the NAND 41 complemented by the inverter, is connected to the n-channel MOS transistor connected across the internal node N51 and the ground, and signals corresponding to the output signal of the inverter INV47 and to the output signal of NAND43, complemented by the inverter, are connected to the gate of the substituted p-channel MOS transistor. Since the control signals 1, 2, N and control signals 1B, 2B and NB are coupled to the gates of the p-channel MOS transistor, the low level is associated with the active state, so that the p-channel MOS transistor is turned on.

In the second interior division circuit 12, the RS flip-flop circuit, made up of NANDs 43, 44, which is reset at a timing when the n-channel MOS transistor MP1 is turned on and set by the transition to the high level of the output signal dn of the first delay circuit 10n, may be replaced by a circuit configuration in which a high level output signal is sent to the gates of the n-channel MOS transistors MN21 to MN2N on transition from the low level to the high level of the output signal dn of the first delay circuit 10 n and in which the low level output signal is sent to the gates of the n-channel MOS transistors MN21 to MN2N on transition from the high level to the low level of the output signal dn of the first delay circuit 10n. In this case, the output signal n-tap, output from the number n second interior division circuit 12n, is switched from the high level to the low level, in synchronism with the transition from the high level to the low level of the output signal dn of the first delay circuit 10n, so that 1-tap to N-tap, output from number 1 to number N second interior division circuits $12_1$ to $12_n$, become multiphase clocks, each phase of which is spaced equally by tCK/N.

Figure 7:
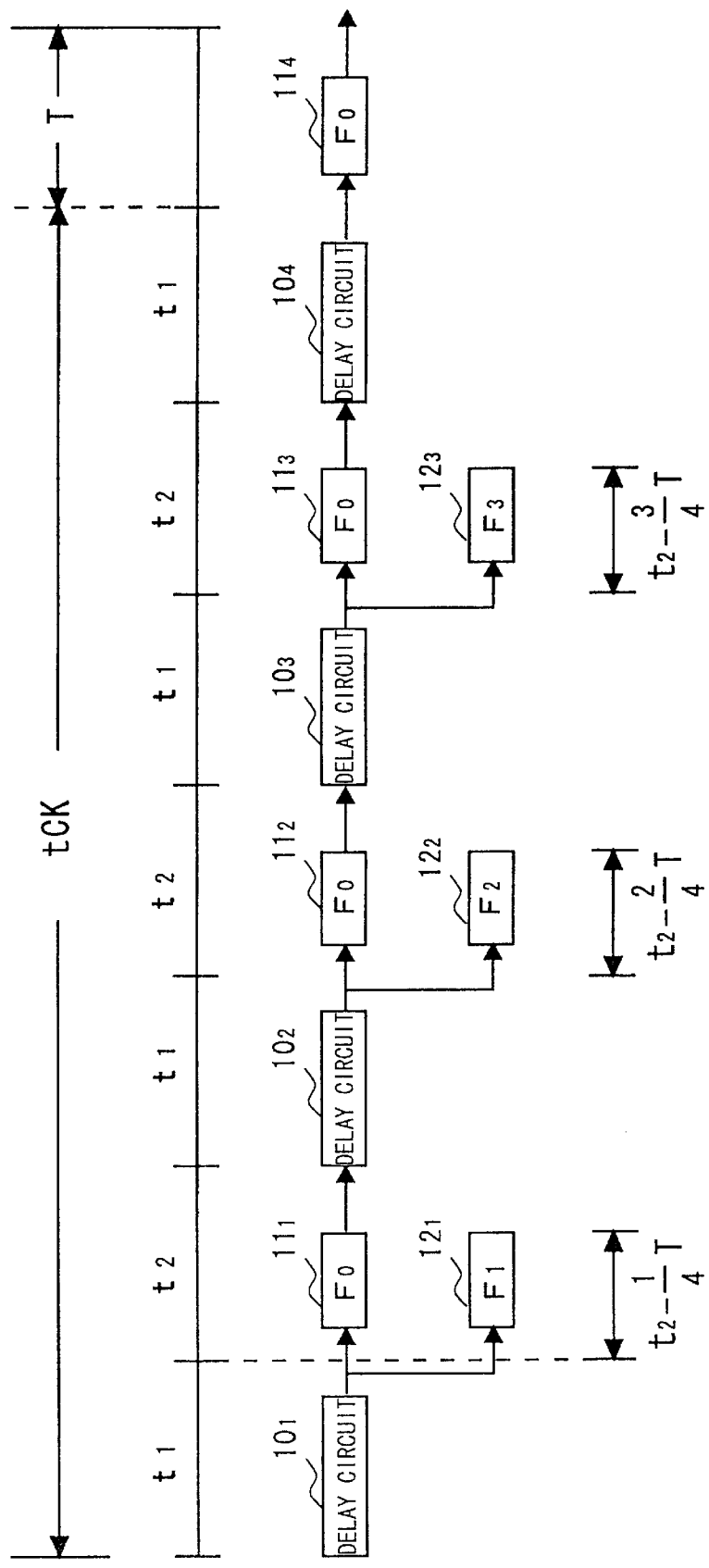
FIG. 7 illustrates the operating principle of an embodiment of the present invention.

FIG. 7 is a schematic view for illustrating the operating principle in case of equally dividing the period tCK of the input clock 1N by four (N=4). Referring to FIG. 7, the operating principle of a preferred embodiment of the present invention is explained.

With the time delay t11 of the first delay circuit 10, and with the delay time t2 of the first interior division circuit 11, the delay time of the delay circuit sequence is 4×(t1+t2), with the phase difference T as detected by the phase difference detection circuit 14 being $$T=4\times(t1+t2)-tCK$$

so that $$tCK/4=t1+t2-T/4.$$

The number 1 second interior division circuits $12_1$ receives an output signal of the number 1 first delay circuit $10_1$ to output a signal 1-tap with a time delay of t2−T/4. So, the time as from the transition time point from the low level to the high level of the input clock IN (clock cycle starting time point) until outputting of the signal 1-tap is t1+t2−T/4, so that it is tCK/4.

The number 2 second interior division circuit 122 receives an output signal of the number 3 first delay circuit 103 to output a signal 2-tap with a time delay of t2−2XT/4. So, the time as from the transition time point from the low to the high of the clock cycle beginning time point until outputting of the signal 2-tap is t1+t2+t1+t2+t1+t2+t2−2XT/4, so that it is 2×tCK/4.

The number 3 second interior division circuit $12_3$ receives an output signal of the number 3 first delay circuit $10_3$ to output a signal 3-tap with a time delay of t2−3×T/4. So, the time as from the transition time point from the low to the high of the clock cycle beginning time point until outputting of the signal 3-tap is t1+t2+t1+t2+t1+t2+t2−3×T/4, so that it is 3×tCK/4.

Figure 8:
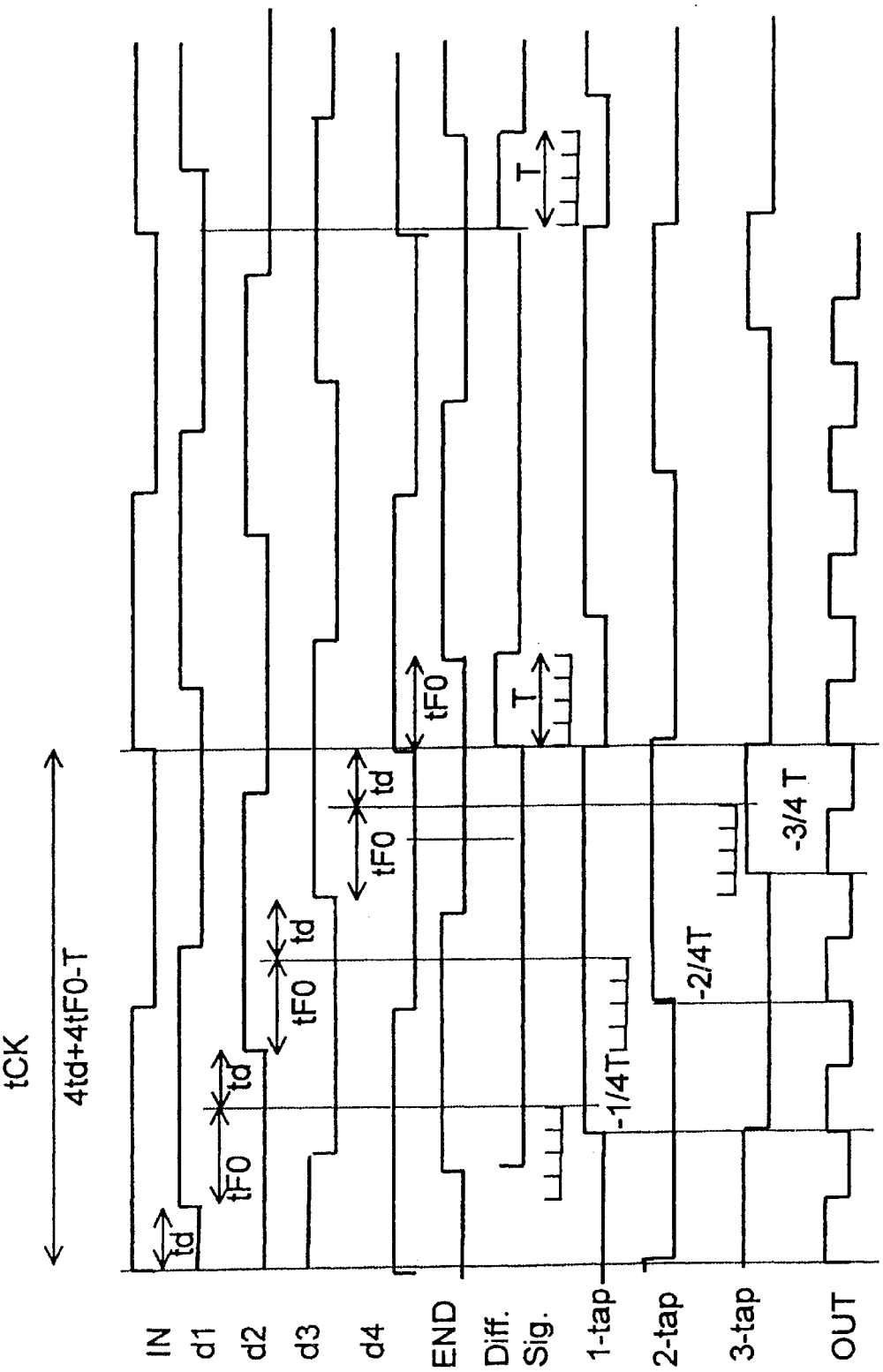
FIG. 8 is a timing diagram for illustrating the operation of an embodiment of the present invention.

FIG. 8 is a timing chart for illustrating the operation when the period tCK of the input clock is to be divided by four (N=4), as explained with reference to FIG. 7. In FIG. 8, IN designates an input clock, d1 to d4 are output signals from the number 1 to number 4 first delay circuits $10_1$ to $10_4$, END designates an output signal of the number four first interior division circuit $11_4$, Diff.Sig is an output signal from the phase difference detection circuit 14, t-tap to 3-tap are output signals from the number 1 to number 3 first interior division circuits $12_1$ to $12_3$, and OUT is a frequency multiplied clock which is multiplexed to a single line output by the synthesis circuit 13.

If a clock with a period corresponding to one obtained by equally dividing of one clock period by four (N=4) is to be output, as shown in FIG. 8, the transition edges from the low level to the high level of the outputs 1-tap to 3-tap of the number 1 to number 3 first interior division circuits $12_1$ to $12_3$ become tCK/4, 2tCK/4 and 3tCK/4, respectively.

Of course, a frequency doubled clock with a period of tCK/2 may also be generated in the synthesis circuit 13 from the input clock and 2-tap or from the 2-tap and 3-tap, in place of generating the quadrupled clock of the tCK/4 period.

Thus, in accordance with the present invention, the plural clocks (multi-phase clock) having a time interval corresponding to equal division of the period tCK of the input clock without employing a feedback circuit configuration.

Figure 9:
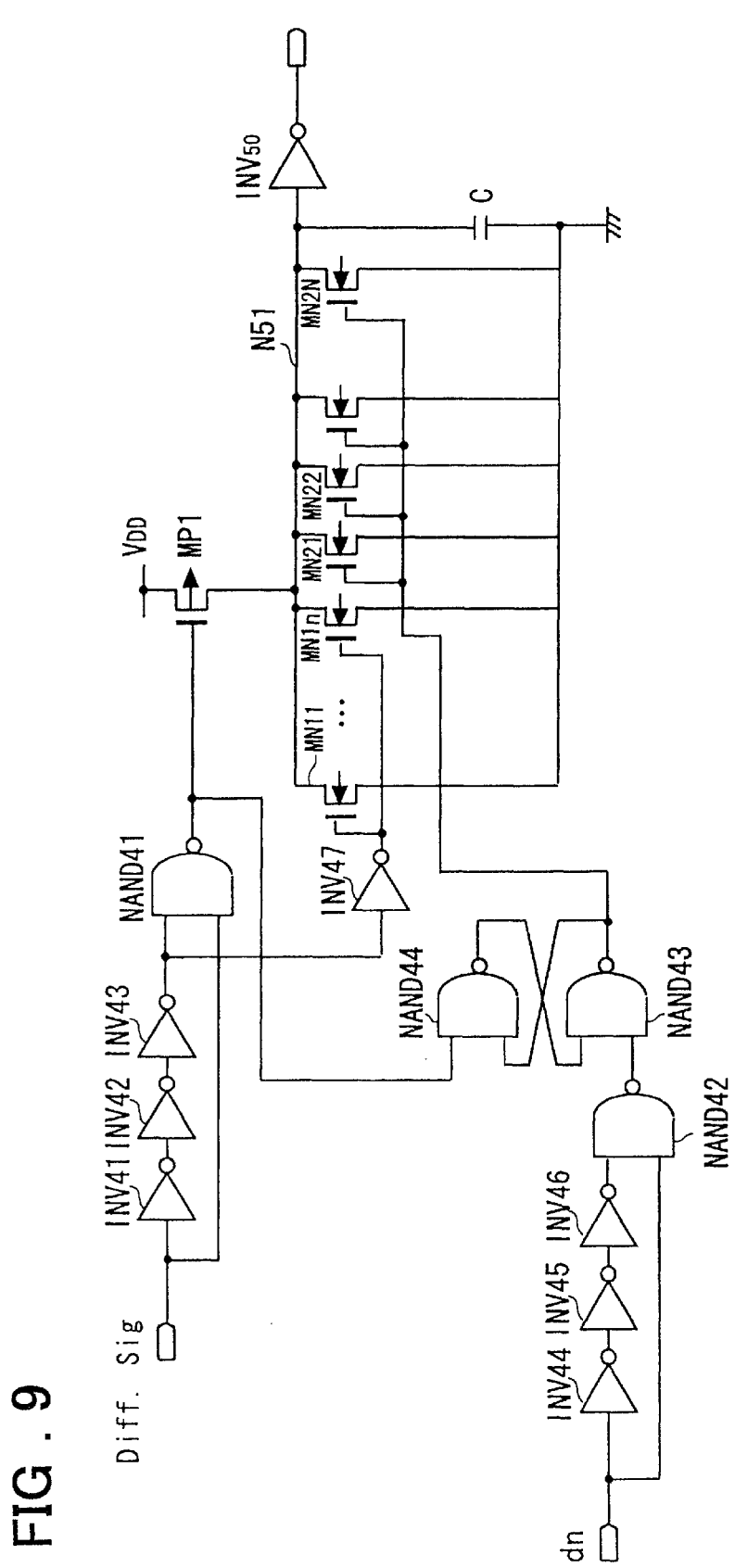
FIG. 9 shows a structure of a second interior division circuit according to another embodiment of the present invention.

Another embodiment of the present invention is now explained. FIG. 9 shows the configuration of the second interior division circuit 12 in accordance with a modified embodiment of the present invention. In the previous embodiment, plural second interior division circuits have the same circuit structure in common, that is, the plural second interior division circuits are formed by placing a plural number of the interior division circuits of the same structure. The interior division ratio of the timing of each second interior division circuit 12 is caused to differ by changing the control signals 1 to n input to the second interior division circuit and the switches turned on/off by the control signals 1B to NB (n-channel MOS transistors MN31 to MN3N and MN41 to MN4N) for each of the second interior division circuits 12. That is, in the number one second interior division circuit $12_1$, one of the n-channel MOS transistors MN31 to MN3N is turned on by the control signal, while the n-channel MOS transistors MN41 to MN4N are all turned on. In the number two second interior division circuit $12_2$, two of the n-channel MOS transistors MN31 to MN3N are turned on by the control signal, while the n-channel MOS transistors MN41 to MN4N are all turned on. In similar manner, in the number n second interior division circuit $12_n$, n of the n-channel MOS transistors MN31 to MN3N are turned on by the control signal, while the n-channel MOS transistors MN41 to MN4N are all turned on.

In the present embodiment, the number one second interior division circuit $12_1$ includes, as a n-channel MOS transistor connected across the internal node N51 and the ground, and a sole n-channel MOS transistor MN11 and n n-channel MOS transistors MN21 to MN2N. A signal corresponding to the Diff. Sig from the phase difference detection circuit 14, delayed by the inverter sequence INV41 to INV43 and INV47, is input to the gate of the n-channel MOS transistor MN11, while the output signal of the NAND43 of the RS flip-flop circuit is fed to the gates of N number of n-channel MOS transistors MN21 to MN2N. The number n second interior division circuit 12n includes, as a n-channel MOS transistor, connected across the internal node N51 and the ground, n n-channel MOS transistors MN11 to MN1n and N n-channel MOS transistors MN21 to MN2N. A signal corresponding to the Diff.Sig output by the phase difference detection circuit 14 and delayed by the inverter sequence INV41 to 43 and INV 47 is fed to n pieces of the n-channel MOS transistors MN11 to MN1n, while an output signal of the NAND 43 which constitutes the RS flip-flop is fed to the gates of N pieces of the n-channel MOS transistors MN21 to MN2N.

In the present embodiment, the plural interior division circuits $12_1$ to $12_n$ differ in circuit configuration respectively, however, the number of components is reduced as compared with that in the previous embodiment.

Of course, constant current sources may be inserted between the sources of the n-channel MOS transistors MN11 to MN1N and the ground and between the N n-channel MOS transistors MN21 to MN2N and the ground respectively.

With a clock control circuit in accordance with the present invention, as described above, clocks making transition at a timing corresponding to equal division of the period of the clock input from outside and a multiplied clock synchronized with the input clock are generated. Since the configuration of the PLL circuit in which a frequency divided signal of an output the oscillator is fed back to a phase detector for matching the phase of the frequency divided signal with the input clock is not adopted, it is possible to output a multiplied clock synchronized with the input clock immediately following the detection of the phase difference T between the clock corresponding to the input clock IN delayed and the clock of the next cycle clock.

A further embodiment of the present invention is explained. FIG. 10 shows the structure of the present embodiment. Referring to FIG. 10, there is provided a delay circuit sequence comprised of first delay circuits $10_1$ to $10_N$, with the delay time being t1, with the number of cascaded stages being N. There is also provided a phase difference detection circuit 14 receiving the output clock END output from a first delay circuit 10N located in the last stage of the delay circuit sequence and the input clock 1N input to the delay circuit sequence, for detecting the phase difference T corresponding to the time difference between the delay time of the delay circuit sequence (=N×t1) and the clock period tCK of the input clock (T=tCK−N×t1). There are also provided N interior division circuits $12_1$ to $12_N$, which receives outputs of the stage 1 to stage N first delay circuits $10_1$ to $10_N$ respectively.

The number n second interior division circuit $12_n$, n being a positive integer from 1 to N, outputs the transition edge of the output signal of the first delay circuits $10_n$ of the corresponding stage n, by a time corresponding to the delay time proper to the second interior division circuit (td which is CV/N1 as later explained) less (N−n)×T/N, based on the phase difference T as detected by the phase difference detection circuit 14. The number 1 to N second interior division circuits $12_1$ to $12_N$ output signals which make rising transition or falling transition at a timing delayed from the start time point of the clock cycle of the input clock by n×t1+tpd−(T−n×T/N) and multi-phase clocks which have a clock period of tCK and are equally spaced at a time interval (phase difference) of t1+T/N are generated from the outputs of the number 1 to number N second interior division circuits $12_1$ to $12_N$.

In the present embodiment, the first interior division circuit 11 is omitted from the delay circuit sequence of the previous embodiment, and multi-phase clocks, spaced at an equal time interval, are generated when the time delay of the delay circuit sequence is shorter than the clock period tCK.

The phase difference detection circuit 14 is of the circuit configuration as shown in FIG. 4. For example, an output clock END of FIG. 10 is fed to the IN input of FIG. 4a and the input clock IN of FIG. 10 is fed to the input END of FIG. 4a. The phase difference detection circuit 14 outputs a signal which goes high and low with the rising transition edge of the output clock END and with the rising transition edge of the input clock IN, respectively. The period detection circuit 15 of FIG. 10 is of the same construction as the previous embodiment explained with reference to FIG. 3.

The second interior division circuit 12 is configured similarly to the second interior division circuit 12 of the above described second embodiment which is explained with a reference to FIGS. 6 and 9. However, the setting of the magnitude relation between the delay time in the number 1 to number N second interior division circuits $12_1$ to $12_N$ differs from that of the previous embodiment. That is, in the present embodiment, the delay time is increased by steps of T/N sequentially in the order of the number 1 second interior division circuit $12_1$ to the number N second interior division circuit $12_N$, with the number N second interior division circuit $12_N$ having the maximum delay time.

Referring to FIG. 6, the number n second interior division circuit $12_n$ includes a first second switch (p-channel MOS transistor MP1) for controlling on and off of a charging path to the capacitor C provided in the circuit, a plural number of second switches (n-channel MOS transistors MN11 to MN1N and MN21 to MN2N) connected in parallel and a buffer circuit for outputting a logic value corresponding to the relative magnitude of the terminal voltage of the capacitor C against a threshold value (inverter INV50). N-n pieces of second switches among the plural second switches (n-channel MOS transistors MN11 to MN1N) are controlled on and off by the output signal Diff.Sig output from the phase difference detection circuit 14 and are turned on during the time interval corresponding to the phase difference T as detected by the phase difference detection circuit 14 to partially discharge the electric charge of the capacitor C. With the capacitor C thus discharged partially, N pieces of second switches (n-channel MOS transistors MN21 to MN2N), on/off controlled by the output signal dn output from the number n first delay circuits $10_n$, as from the time point when the output signal dn from the number n first delay circuits $10_n$ makes a transition, are turned on to discharge the electric charge stored in the capacitor C. This causes a fall in the terminal voltage of the capacitor C and a switching of the output value of the buffer circuit (inverter INV50 of FIG. 6). Meanwhile, if the second interior division circuit 12 is of the circuit configuration shown in FIG. 6, N−n pieces of second switches of the plural number of the second switches (n-channel MOS transistors MN11 to MN1N) are connected to the ground via the switches turned on by the high level control signals 1 to N−n (N−n of the n-channel MOS transistors MN31 to MN3N), with the remaining n of the switches (the n-channel MOS transistors MN31 to MN3N) being set to off state by the control signal. N pieces of second switches (n-channel MOS transistors MN21 to MN2N), which are turned on or off by the output dn of the first delay circuits $10_n$, are connected to the ground through the switches (n-channel MOS transistors MN1 to MNN) which are set to on states at all times by the control signals 1B to NB.

If the electric charge to be discharged from the charged capacitor C until a switching of the output signal of the buffer circuit (inverter INV50 of FIG. 6) occurs is CV, the N−n pieces second switches are turned on during the time beginning from the rising of the output terminal of the delay circuit sequence until the rising of the input clock IN of the next clock cycle.

If the current flowing through a second switch in an on-state (drain current of the n-channel MOS transistor) is I, the electric charge of (N−n)×IT is discharged during this time. Then, as from the time point when the output signal dn of the number n delay circuits $10_n$ makes a transition, the N pieces second switches (MN21 to MN2N of FIG. 6) which are turned on/off by the output dn of the first delay circuits $10_n$, are turned on to discharge the electric charge of the capacitor C (CV−(N−n)×IT) with the current NI. This lowers the terminal voltage of the capacitor C to change the output value from the buffer circuit (inverter INV50 of FIG. 6).

The propagation delay as from the transition from the low level to the high level of the output signal dn of the first delay circuits $10_n$ (input to the second interior division circuit 12n) until the transition from the low level to the high level of the second interior division circuit 12n is given by $$(CV-(N-n)\times IT)/NI=CV/NI+(n-N)T/N$$

That is, the delay time is sequentially increased by a step of T/N in an ascending order of the second interior division circuits, i.e., in a direction from the number 1 second interior division circuit $12_1$ to the number N interior division circuit $12_{N-1}$.

An output signal 1-tap of the number 1 second interior division circuit $12_1$ is output at a timing of $$t1+CV/NI+(1-N)T/N,$$

an output signal 2-tap of the number 2 second interior division circuit $12_2$ is output at a timing of $$2t1+CV/NI+(2-N)T/N,$$

an output signal (N−1)-tap of the numberN−1 second interior division circuit $12_{N-1}$ is output at a timing of $(N-1) \times t1 + CV/NI + (N-1-N)T/N$, and an output signal N-tap of the number N second interior division circuit $12_N$ is output at a timing of $N \times t1 + CV/NI$, where CV/NI is the time delay proper to the N second interior division circuits $12_1$ to $12_N$.

With the output signals 1-tap to N-tap of the second interior division circuits $12_1$ to $12_N$, the time difference between neighboring output signals is $t1 + T/N$ so that multi-phase clocks which make transitions at an equal interval (equal phase difference) are produced. At the next clock cycle, the output signal 1-tap of the number 1 second interior division circuit $12_1$ makes transition at a timing of $t1 + CV/NI + (1-N)T/N$ as from the start time point of the clock cycle, with the output signal 1-tap being a clock with a period of $N \times t1 + T = tCK$. The same holds for the periods of the outputs 2-tap to N-tap from the number 1 to number N second interior division circuits $12_1$ to $12_N$.

The synthesis circuit 13 combines the input clock IN and the output signals 1-tap to N-tap of the second interior division circuits $12_1$ to $12_N$ into one line signal to output a frequency multiplied clock. It is optional whether N multiplied clock of the period corresponding to N division of the clock period tCK are to be generated using the N lines of output signals 1-tap to N-tap of the second interior division circuits $12_1$ to $12_N$ or N/2 multiplied clock of the period corresponding to N/2 division of the clock period tCK are to be generated using every other one of the N outputs of the second interior division circuits $12_1$ to $12_N$, with the signal-to-signal phase difference being $2t1 + 2/T$).

Figure 11:
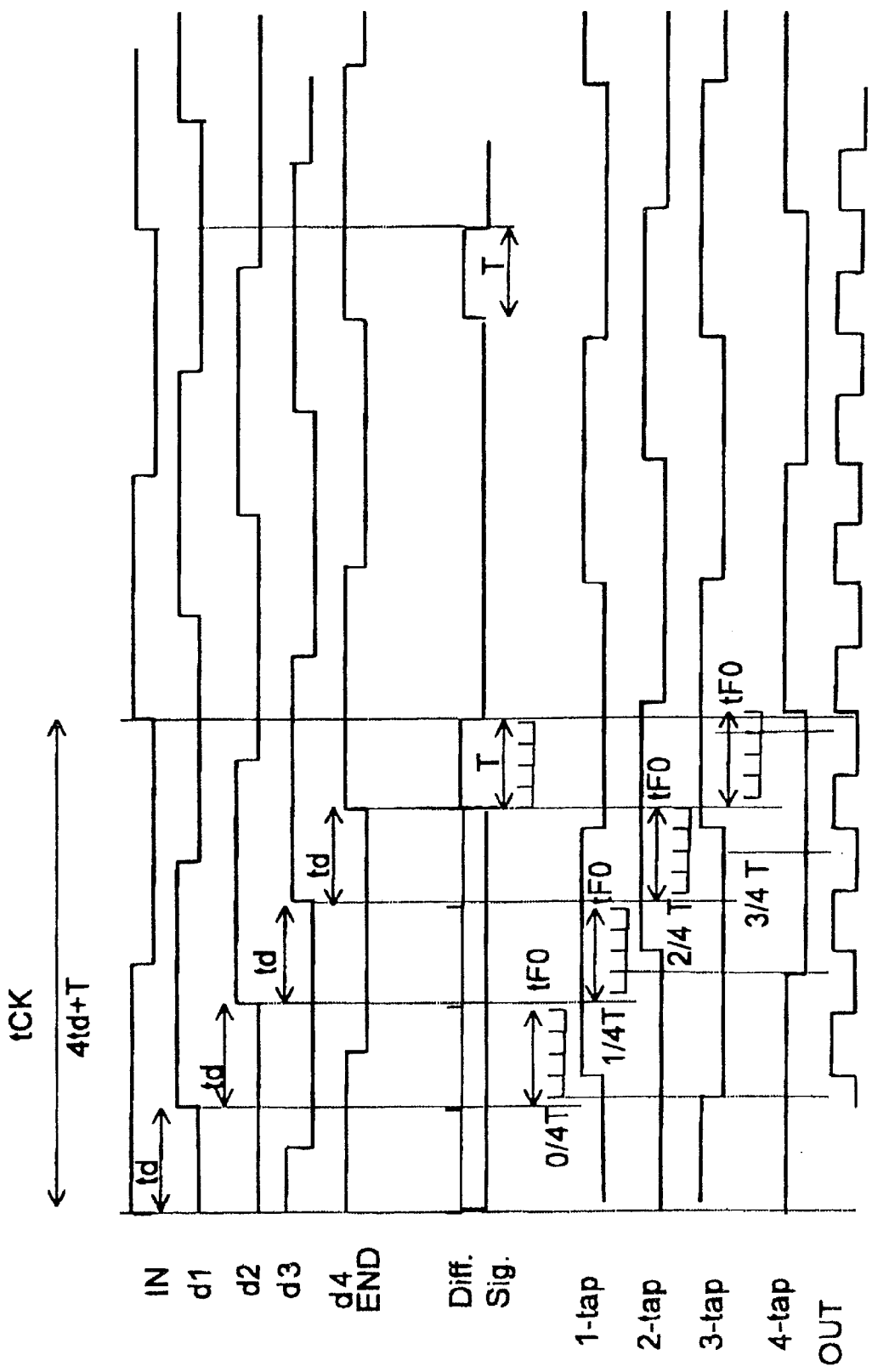
FIG. 11 is a timing diagram for illustrating the operation of a further embodiment of the present invention.
Figure 12:
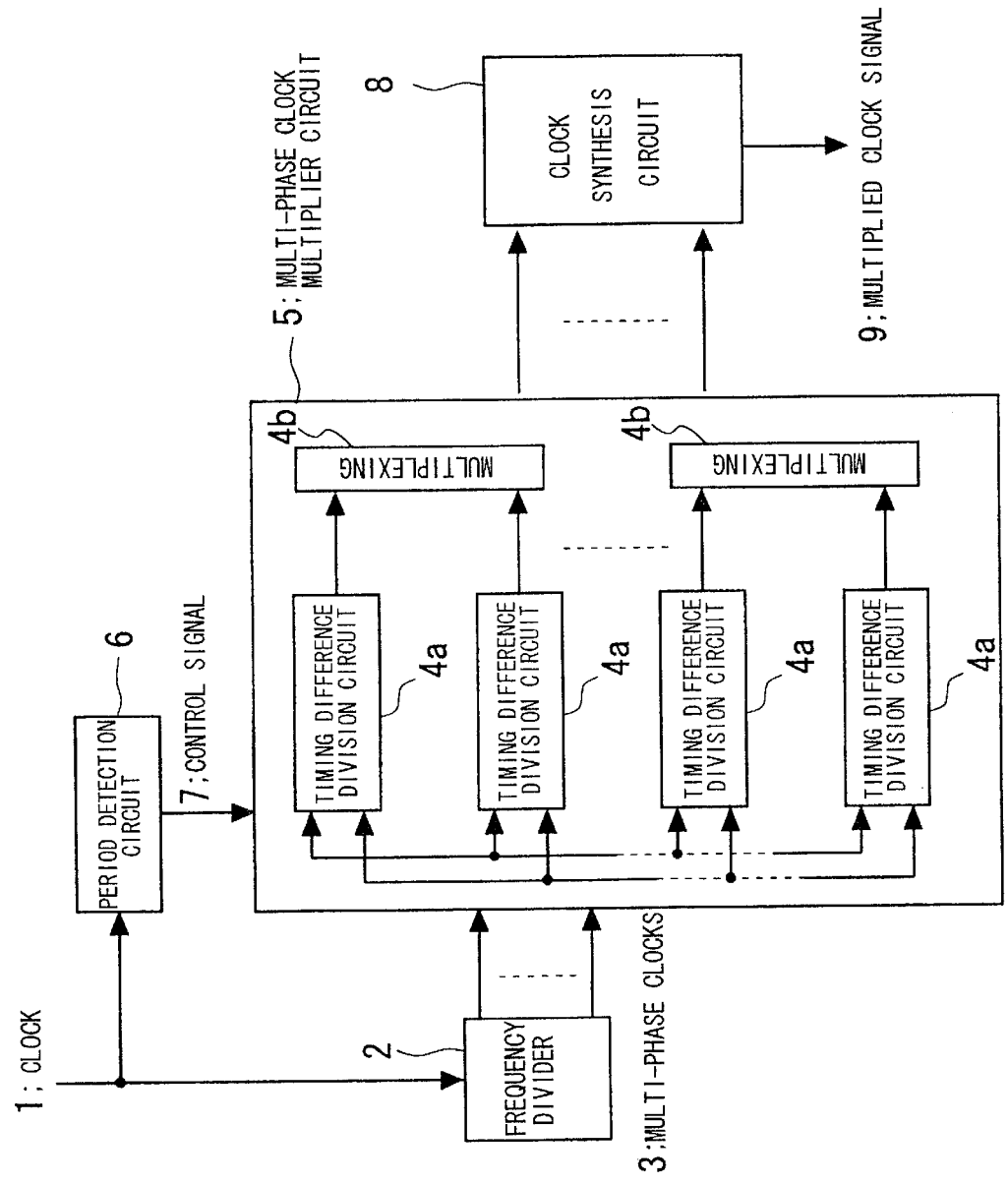
FIG. 12 shows the structure of a conventional clock multiplier circuit.
Figure 13:
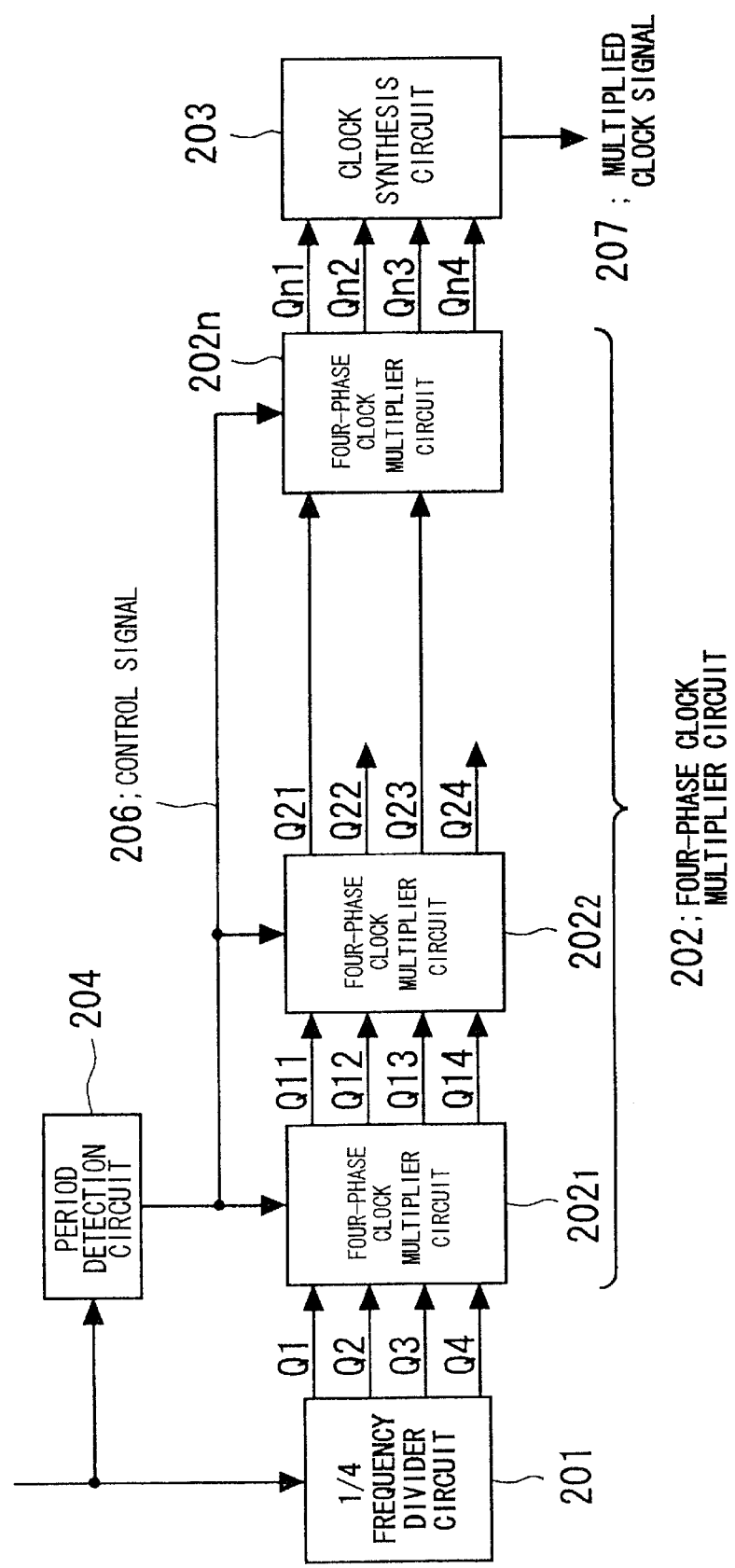
FIG. 13 shows the structure of a conventional clock multiplier circuit.

FIG. 11 shows a timing diagram for illustrating a typical operation of another embodiment of the present invention in which four first delay circuits, each of which has a delay time td, are cascaded (N=4 stages) to form a delay circuit sequence. The phase difference T between the output terminal of the delay circuit sequence and the input clock of the next cycle is the clock period tCK less 4td, with the delay time increasing sequentially by steps of T/4 in a direction from the number one second interior division circuit $12_1$ to the number N second interior division circuit $12_N$.

The propagation delay time from the transition of the input of the second interior division circuit $12n$ from the low level to the high level until transition of the output signal of the second interior division circuit $12n$ from the low level to the high level is given by $CV/4I + (n-4)T/4$.

An output signal 1-tap of the number 1 second interior division circuit $12_1$ is output at a timing of $td + CV/4I - 3T/4$, an output signal 2-tap of the number 2 second interior division circuit $12_2$ is output at a timing of $2td + CV/4I - 2T/4$, an output signal 3-tap of the number 3 second interior division circuit $12_3$ is output at a timing of $3 \times td + CV/4I - T/4$, and an output signal 4-tap of the number 4 second interior division circuit $12_4$ is output at a timing of $4 \times td + CV/4I$. At the next clock cycle, the output signal 1-tap of the number one second interior division circuit $12_1$ makes transition at a timing of $td + CV/4I - 3T/4$ as from the clock cycle start time point, with the period of the output 1-tap being $4 \times td + T = tCK$. The same holds for the periods of the outputs 2-tap to 4-tap from the interior division circuits $12_2$ to $12_4$.

With the output signals 1-tap to 4-tap of the second interior division circuits $12_1$ to $12_4$, the time difference between neighboring outputs is $t1 + T/4$, with the time between the output signal 1-tap and the output signal 4-tap being the clock period tCK, thus giving multi-phase clocks exhibiting transition at equal time intervals. Thus, the synthesis circuit 13 outputs an output signal OUT corresponding to a quadruped input clock.

With the clock control circuit in accordance with the present invention, the circuit configuration is simplified to reduce the circuit size and the time required for synchronization with an external clocks or the like is decreased as compared to the case of using a PLL circuit. So, the present invention may be applied with advantage to a clock control circuit adapted for generating from an external clock an internal clock synchronized with the external clock.

In a semiconductor integrated circuit device having a clock control circuit adapted for generating multi-phase clocks or a frequency multiplied clock synchronized with an external clock input from a clock input terminal through an input buffer and for outputting the generated clock as internal clocks from a clock driver to a synchronization circuit (sequential circuit) constituting an internal circuit of the semiconductor integrated circuit device, as the case of application of the present invention practiced to a semiconductor integrated circuit device, the clock control circuit of the present invention, explained in connection with the embodiments shown in FIGS. 1, 2 and 10, may be provided as a clock control circuit, in place of the PLL circuit, to reduce the circuit size and the time required for synchronization. In the clock control circuit of the semiconductor integrated circuit device, the input clock IN is made up of the external clock input via an input buffer. If the multi-phase clocks are to be provided as internal clocks, output signals of plural second interior division circuits 12 are used, whereas, if the multiplied clock is to be provided, a multiplied output signal of the synthesis circuit 13 is used.

The present invention may be applied with advantage to a device fed with a clock furnished from such as a quartz oscillation circuit as an external clock to generate a frequency multiplied clock thereof, a timing generating device for generating a signal at a timing corresponding to equal division of the clock period tCK, or to a signal generating device for generating a pulse signal with a variable frequency.

A further preferred embodiments of the present invention are hereinafter explained. In the above-described embodiment, the phase difference T between the output terminal of the delay circuit sequence and the input clock IN where $T = (N \times (t1+t2) - tCK)$ is detected by the phase difference detection circuit 14, and the phase difference T is then memorized in the form of the electric charge stored in the capacitor. In the following embodiments, the phase difference detection circuit 14 of the previous embodiment is not used.

The modified embodiment of the present invention includes a first delay circuit sequence ($10_1$ to $10_N$ of FIG. 17), composed of a plural number of cascaded stages of the delay circuits, and a second delay circuit sequence ($10_{N+1}$ to $10_{2N}$ of FIG. 17), composed of a plural number of cascaded stages of the delay circuits. The input clock entered from the first stage delay circuit ($10_1$ of FIG. 17) of the first delay circuit sequence, is propagated through the first delay circuit sequence, output from the last stage delay circuit ($10_N$ of FIG. 17) of the first delay circuit sequence, fed to the first stage delay circuit ($10_{N+1}$ of FIG. 17) of the second delay circuit sequence, and is propagated through this second delay circuit sequence. The present embodiment also includes a plural number of interior division circuits ($12_0$ to $12_N$ of FIG. 17) arranged in parallel in association with respective stages of the delay circuits of the first and second delay circuit sequences and adapted for outputting output signals of the delay time prescribed by the time which is obtained by dividing the phase difference of two input signals with a preset interior division ratio. The number 1 interior division circuit ($12_0$ of FIG. 17) of the plural interior division circuits ($12_0$ to $12_N$ of FIG. 17) is fed with a clock dN, output by the first delay circuit sequence and fed to the first stage delay circuit of the second delay circuit sequence and with the input clock IN of the next cycle, while the number n+1 interior division circuit ($12_n$ of FIG. 17) receives as inputs an output signal (d(N+n)) of the stage number n delay circuit ($10_{N+n}$ of FIG. 17) of the second delay circuit sequence associated with the interior division circuit and the output signal dn of the stage number n delay circuit ($10_n$ of FIG. 17) of the first delay circuit sequence fed with the input clock of the next cycle. It is noted that n+1 is not less than 2 and not larger than the number of stages of the last stage delay circuit of the first delay circuit sequence. The interior division ratio of the plural interior division circuits ($12_0$ to $12_N$ of FIG. 17) is set so as to be larger by a unit value corresponding to the order of the interior division circuit. With the period of the input clock being tCK, the number of stages of the last stage delay circuits of the first delay circuit sequence being N, the delay time of each delay circuit being td and T=tCK−N×td, the delay time of the plural interior division circuits is set so as to be sequentially larger by a unit time T/N with regards to the number of the interior division circuit so that the phase difference of the outputs of the two neighboring interior division circuits is tCK/N and the time difference between the output signal of the number 1 interior division circuit and the output signal of the number N interior division circuit is the input clock period tCK.

The first and second delay circuit sequences of N stages may be interconnected to form a two-stage delay circuit sequence. The delay time of the respective delay circuits is of the same value (td). In this case, there is provided a delay circuit sequence comprised of 2N cascaded delay circuits each having the same delay time ($10_1$ to $10_{2N}$ of FIG. 17), with the input clock being fed to the first stage delay circuit ($10_1$ of FIG. 17) and thence propagated through the cascaded delay circuits. There are also provided at least N interior division circuits ($12_0$ to $12_{N-1}$ of FIG. 17) adapted for outputting output signals having delay times prescribed by the time corresponding to a value obtained by dividing the phase difference between two input signals with respective different preset values of the interior division ratio. The number i interior division circuit, where i is an integer from 0 to N, is fed with an output signal of the stage number N+i delay circuit, output signal of the stage number (N+1) delay circuit and with the output signal of the stage number i delay circuit of the input clock of the next cycle. If the stage number is 0, the clock is the input clock. The number 0 to number (N−1) interior division circuits $12_1$ to $12_{N-1}$ output multi-phase clocks of the phase difference corresponding to N equal division of the input clock period. There may also be provided a synthesis circuit (13 of FIG. 17) for synthesizing multi-phase clocks output from number 0 to number (N−1) interior division circuits to output a N-tupled clock.

In a further embodiment in accordance with the present invention, there are provided a first delay circuit sequence of cascaded N delay circuits of the same delay time ($10_1$ to $10_N$ of FIG. 19), where N is an integer not less than 1, a second delay circuit sequence of cascaded N delay circuits of the same delay time ($10_{N+1}$ to $10_{2N}$ of FIG. 19), and a selection circuit (19 of FIG. 19) fed with outputs of the respective delay circuits of the first delay circuit sequence for selecting and outputting one of them depending on the value of multiplication K as specified by a multiple number decision signal (18 of FIG. 19), where K is an integer not less than 1 and not larger than N. The input clock IN is fed to the stage number 1 delay circuit of the first delay circuit sequence. An output signal of the selection circuit (19 of FIG. 19) is fed to the stage number 1 delay circuit of the second delay circuit sequence ($10_{N+1}$ of FIG. 19). At least N interior division circuits, adapted for outputting an output signal of the delay time prescribed by the time corresponding to the division by a preset interior division ratio of the phase different of two input signals are arranged in juxtaposition ($12_0$ to $12_{N-1}$ of FIG. 19). The values of the interior division ratio of the interior division circuits differ from one interior division ratio to another and are prescribed by the value of multiplication K.

The number 0 interior division circuit ($12_0$ of FIG. 19) receives an output signal of the selection circuit (19 of FIG. 19) and the input clock IN of the next cycle. The number i interior division circuit ($12_i$ of FIG. 19), where i is an integer from 1 to N, receives an output signal of the stage number i delay circuit ($12_{N+i}$ of FIG. 19) of the second delay circuit sequence and with an output signal of the stage number i delay circuit ($12_i$ of FIG. 19) of the first delay circuit of the next cycle clock. The number 0 to number (K−1) interior division circuits output multi-phase clocks of the phase difference corresponding to K equal division of the input clock period. K multi-phase clocks output from the K interior division circuits may be fed to and synthesized into one signal by the synthesis circuit to output an K tupled clock signal.

In a further embodiment in accordance with the present invention, there are provided first and second sets of the interior division circuits, each comprised of N+1 interior division circuits. More specifically, a first delay circuit sequence is comprised of 2N cascaded delay circuits of the same delay time, N being an integer not less than 1 ($10_1$ to $10_{2N}$ of FIG. 20) and a second delay circuit sequence is comprised of 2N cascaded delay circuits of the same delay time, N being an integer not less than 1 ($10_{B1}$ to $10_{B2N}$ of FIG. 20), with a positive-phase clock (CLK) input to the initial stage delay circuit ($10_1$ of FIG. 20) and propagated through the first delay circuit sequence, and with a inverse-phase clocks (CLKB) input to the initial stage delay circuit ($10_{B1}$ of FIG. 20) of the second delay circuit sequence and propagated through the first delay circuit sequence. There are also provided a first and second group of interior division circuits($12_1$ to $12_{N_a}$nd $12_{B0}$ to $12_{BN}$ of FIG. 20) outputting signals having delay times prescribed by the time obtained by dividing the phase difference of the two input signals by a preset interior division ratio. In each of the first and second group of the interior division circuits, the values of the interior division ratio of the interior division circuits are different from each other.

The number 0 interior division circuit ($12_0$ of FIG. 20) of the first group of the interior division circuits receives an output signal(dN+π) of the stage number N delay circuit ($10_{BN}$ of FIG. 20) of the second delay circuit sequence and the positive-phase clock (CLK) of the next cycle, the number i interior division circuit ($12_i$ of FIG. 20) of the first group of the interior division circuits, i being an integer of 1 to N, receives an output (d(N+i)+π) of the stage number (N+i) delay circuit ($10_{BN+i}$ of FIG. 20) of the second delay circuit sequence and the positive-phase clocks (CLK) of the next cycle. From the number 0 to number N interior division circuits of the first group of the interior division circuits ($12_0$ to $12_N$ of FIG. 20) are output multi-phase (N-phase) clocks having a phase difference between neighboring two clocks corresponding to N equal division of one-half(phase π) of the input clock period.

Figure 20:
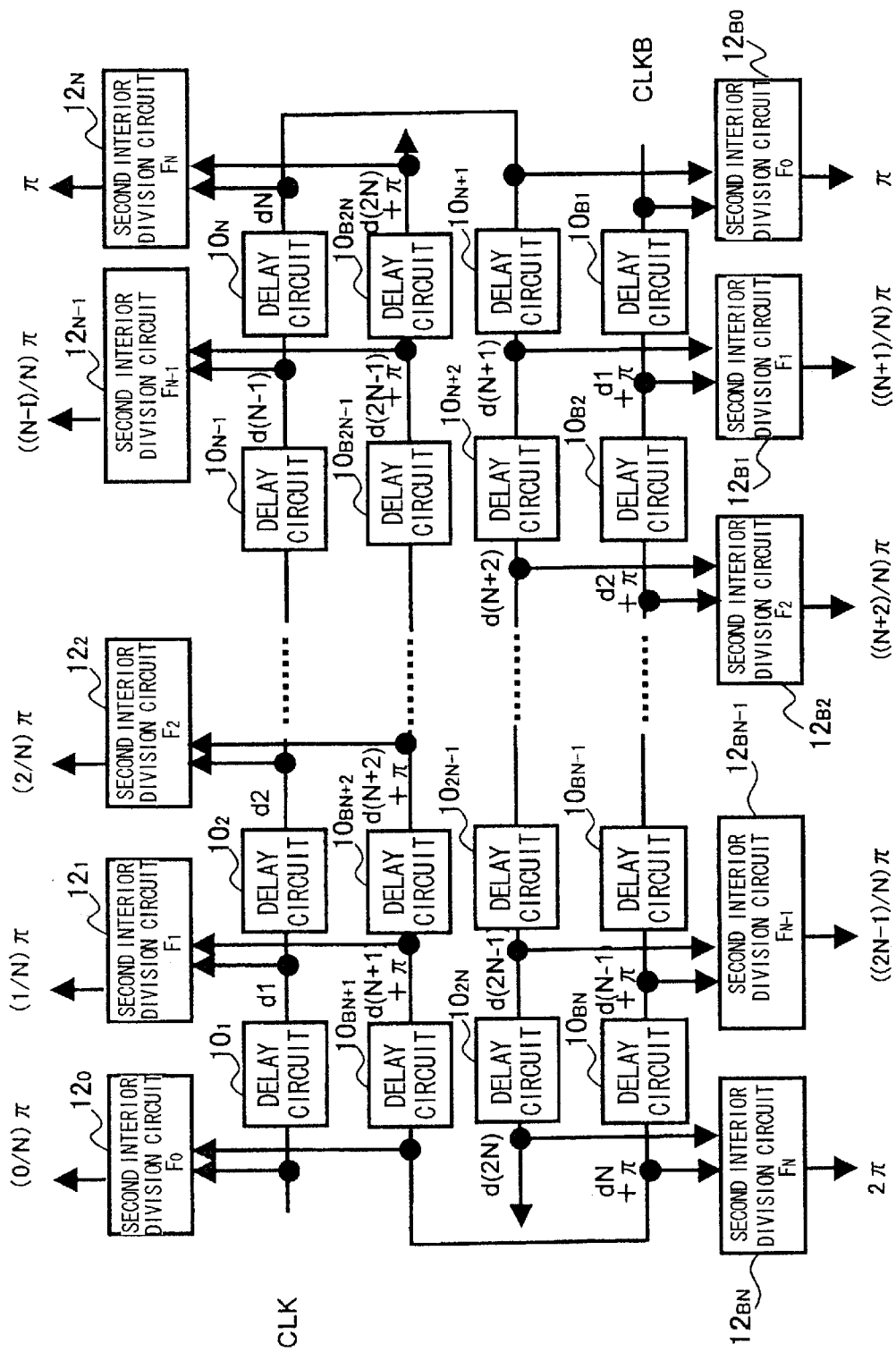
FIG. 20 shows the structure of a further embodiment of the present invention.

The number 0 interior division circuit ($12_{B0}$ of FIG. 20) of the second group of the interior division circuits receives an output (dN) of the stage number N delay circuit ($10_N$ of FIG. 20) of the first delay circuit sequence and the inverse-phase clock (CLKB) of the next cycle, the number i interior division circuit ($12_{Bi}$ of FIG. 20) of the second set of the interior division circuits, i being an integer of 1 to N, receives an output (d(N+i)) of the stage number (N+i) delay circuit ($10_{N+i}$) of FIG. 20) of the first delay circuit sequence and an output signal (d(N+i)+π) of the stage i delay circuit ($10_{BN+i}$ of FIG. 20) of the second delay circuit sequence fed with the inverse-phase clock (CLKB) of the next cycle. From the number 0 to number N interior division circuits of the second group of the interior division circuits ($12_{B0}$ to $12_{BN}$ of FIG. 20) are output multi-phase (N-phase) clocks corresponding to N equal division of one-half the input clock period (phase λ), phase shifted by λ from the output signal of the number 0 to number N interior division circuits of the first set of the interior division circuits ($12_0$ to $12_N$ of FIG. 20).

Figure 17:
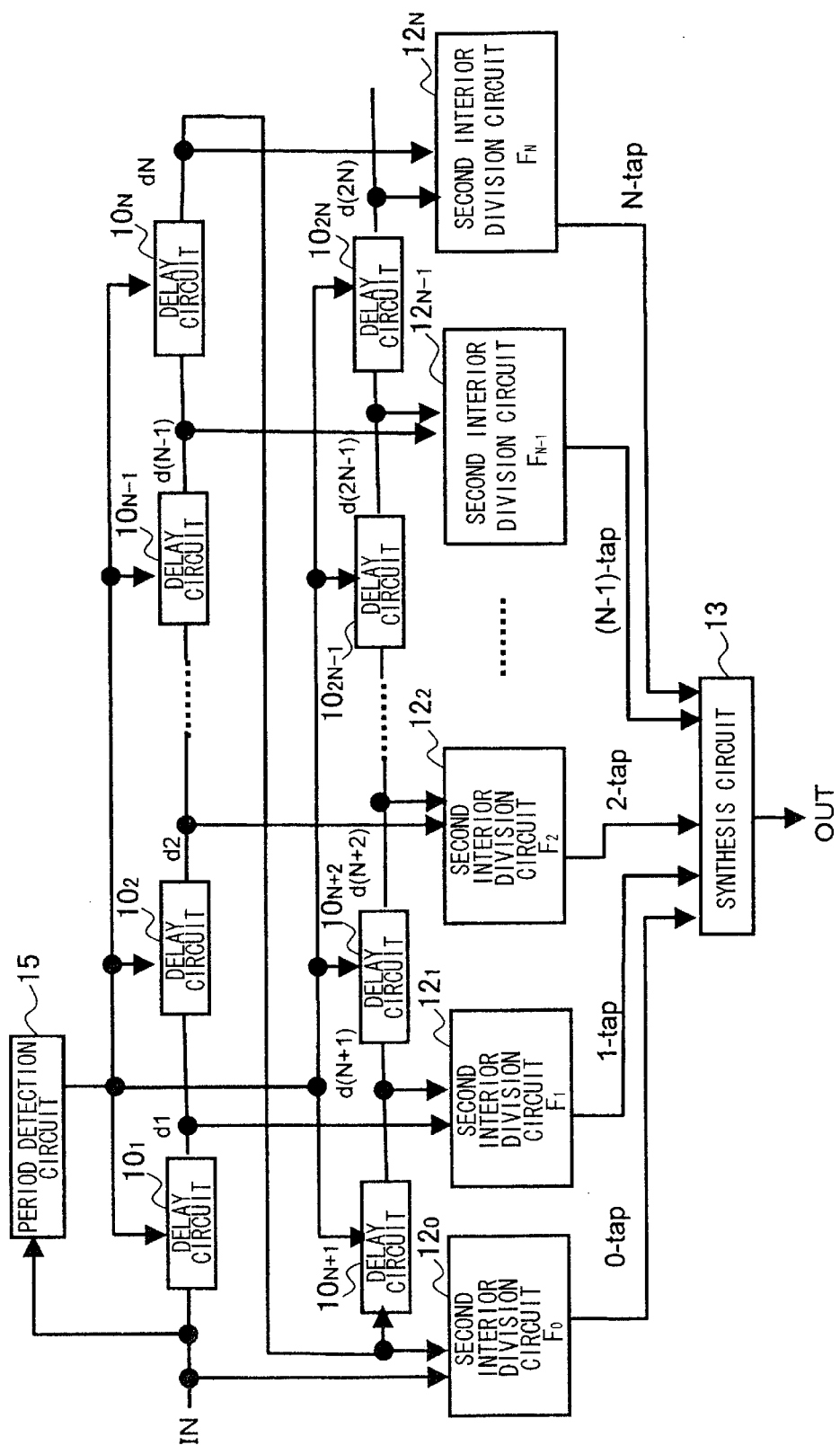
FIG. 17 shows the structure of a further embodiment of the present invention.

The above-mentioned modified embodiments of the present invention will be described in mode detail with reference to the drawings. FIG. 17 shows the structure of a modified embodiment of the present invention.

Referring to FIG. 17, the structure for generating N-tupled signals includes serially connected 2N delay circuits $10_1$ to $10_{2N}$, and N+1 second interior division circuits $12_0$ to $12_{2N}$, having the weighting (interior division ratio) from $F_0$ to $F_N$. Output signal 0-tap to N-tap of the second interior division circuits $12_0$ to $12_{2N}$ are input to the synthesis circuit 13 which synthesizes the input signals to output a clock OUT corresponding to N-tupled input clock.

The input clock IN is received by the initial stage delay circuit $10_1$ and delayed by the N-stage delay circuits $10_1$ to $10_{2N}$. The second interior division circuit $12_0$ receives an output d(N+1) of the delay circuit $10_{N+1}$, and an output d1 corresponding to the next cycle input clock IN delayed by the delay circuit $10_1$. The second interior division circuit $12_1$ receives an output d(N+1) of the delay circuit $10_{N+1}$, and an output d1 corresponding to the next cycle input clock IN delayed by the delay circuit $10_1$. The second interior division circuit $12_2$ receives an output d(N+2) of the delay circuit $10_{N+2}$, and an output d2 corresponding to the next cycle input clock IN delayed by the delay circuit $10_2$. In similar manner, the second interior division circuit $12_N$ receives an output d(2N) of the delay circuit $10_{2N}$, and an output dN corresponding to the next cycle input clock IN delayed by the delay circuit $10_N$.

Referring to FIG. 17, a common signal is input to input IN1, IN2 of the delay circuits $10_1$ to $10_{2N}$ in the circuit configuration shown in FIG. 5.

In FIG. 17, the period detection circuit 15 is of the structure similar to that of the previous embodiment explained with reference to FIG. 2. The control signal output from the period detection circuit 15 is supplied as a control signal for the delay circuits $10_1$ to $10_{2N}$ shown in FIG. 5 and determines the capacitance value depending on the clock frequency. Alternatively, the configuration shown in FIG. 3*b* may be used, in which case the delay time is variably set by the selector 17 in FIG. 3*b*.

The operation of the circuit shown in FIG. 17 is hereinafter explained. If the delay time of the delay circuits $10_1$ to $10_{2N}$ is unanimously equal to td, the delay time of the serially connected N delay circuits $10_1$ to $10_N$ is N×td. With the period tCK of the input clock IN, the difference between the delay time of the delay circuits $10_1$ to $10_N$ and tCK, where tCK>N×td, is $$N \times td + T = tCK \qquad (11)$$

and hence $$T = tCK - N \times td \qquad (12).$$

It is assumed that two input signals to the second interior division circuits $12_0$ to $12_N$ are a first input signal corresponding to the input clock delayed by a delay circuit and a second input signal corresponding to the next cycle clock or the next cycle clock delayed by the delay circuit.

If the period of the input clock IN is tCK, the delay time of each delay circuit is td and T=tCK−N×td (as will be explained subsequently, this time T is also a phase difference of two signals input to the interior division circuits $12_0$ to $12_N$), in the plural second interior division circuits $12_0$ to $12_N$, the respective delay time is sequentially increased by a step of a preset time (T/N), where T=tCK−N×td. The phase difference of the outputs of the two neighboring interior division circuits is tCK/N, with the time difference between an output signal of the number 1 interior division circuit and an output signal of the number N interior division circuit being the input clock period tCK (2 π).

More specifically, the second interior division circuits $12_0$ outputs an output signal 0-tap which makes a transition at a timing corresponding to division by the interior division ratio (weight) $F_0$ of the phase difference between the rising edge of the clock signal(output dN of the delay circuit $10_N$) which rises at a delay time N×td as from the start time point of the clock cycle and the rising edge of the clock IN of the next clock cycle.

The second interior division circuits $12_1$ outputs an output signal 1-tap which makes a transition at a timing corresponding to division by the interior division ratio (weight) $F_1$ of the phase difference between the rising edge of the clock signal(output d(N+1)) which rises at a delay time (N+1)×td as from the start time point of the clock cycle of the delay circuit $10_{N+1}$ and the rising edge of the output signal dl of the next clock cycle delayed by the delay circuit $10_1$.

In similar manner, the second interior division circuits $12_{N-1}$ outputs an output signal (N−1)−tap which makes a transition at a timing corresponding to division by the interior division ratio (weight) $F_1$ of the phase difference between the rising edge of the clock signal (output d(2N−1)) which rises at a delay time (2N−1)×td as from the start time point of the clock cycle of the delay circuit $10_{2N-1}$ and the rising edge of the output signal d(N−1) of the next clock cycle delayed by the delay circuit $10_{N-1}$.

The second interior division circuits $12_N$ outputs an output signal N-tap which makes a transition at a timing corresponding to division by the interior division ratio (weight) $F_N$ of the phase difference between the rising edge of the clock signal (output d2N of the delay circuit $10_{2N}$) which rises at a delay time 2Ntd as from the start time point of the clock cycle and the rising edge of the output signal dN of the next clock cycle delayed by the delay circuit $10_N$.

Figure 22:
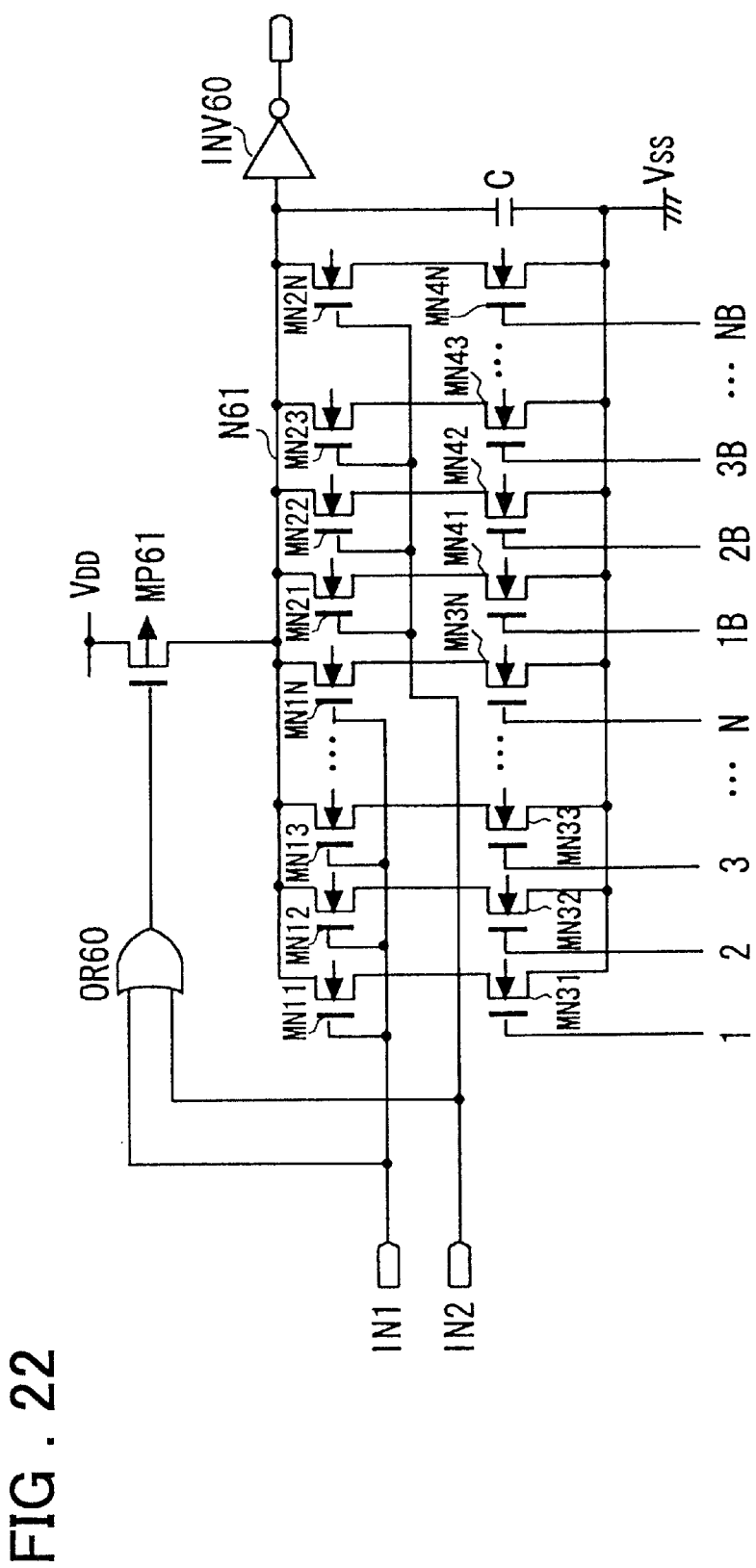
FIG. 22 shows a typical structure of an interior division circuit.

A circuit structure of the second interior division circuits $12_1$ to $12_N$, shown in FIG. 17, is now explained. FIG. 22 shows the structure of the second interior division circuits $12_1$ to $12_N$, adapted for dividing the time difference T of two input signals by resolution N (division by 1/N) and for outputting the resulting signal at a timing corresponding to an integer number multiple thereof. Meanwhile, the N+1 second interior division circuits $12_1$ to $12_N$ shown in FIG. 17 has a basic structure in common, with only the setting value of the control signal determining the interior division ratio (weight) differing from one another.

Referring to FIG. 22, the second interior division circuit $12_n$, where n is an integer from 0 to N, includes a logical OR circuit OR60 which receives signals of the two input terminals IN1, IN2, a p-channel MOS transistor MP61 having its source, drain and gate connected respectively to a power supply (VDD; a high level power supply), to an internal node N61 and to an output terminal of the logical OR circuit OR60, n-channel MOS transistors MN11 to MN1N, having drains in common connected to the internal node N61 and gates in common connected to the input terminal IN1, n-channel MOS transistors MN31 to MN3N, having drains connected respectively to the sources of the n-channel MOS transistors MN11 to MN1N, having sources connected in common to the ground (VSS; low level power supply) and having gates connected respectively to control signals 1 to N, n-channel MOS transistors MN21 to MN2N, having drains connected in common to the internal node N61 and gates connected to the input terminal IN2, and n-channel MOS transistors MN41 to MN4N, having drains connected respectively to the sources of the n-channel MOS transistors MN21 to MN2N, sources connected to the ground (VSS) and gates respectively connected to the control signals 1B to NB.

The capacitor C is connected across the common node N61 and the ground. From an output terminal of the inverter INV60 which has the input terminal connected to the common node N61, is output an output signal n-tap of the number n second interior division circuit $12_n$.

In the second interior division circuit $12_n$, the n-channel MOS transistors MN31 to MN3N and n-channel MOS transistors MN41 to MN4N, connected to the n-channel MOS transistors MN11 to MN1N and n-channel MOS transistors MN21 to MN2N, connected in parallel to each other, are on/off controlled by the control signals 1 to N and 1B to NB fed to respective gate terminals thereof, such as to determine the interior division ratio of the time difference of two input signals prescribing the delay time of the output signals. For example, in the number n second interior division circuit $12_n$, having the interior division ratio Fn, (N−n) pieces of the n-channel MOS transistors MN31 to MN3N are set in the on-state by the input control signals 1B to NB, whilst n pieces of the n-channel MOS transistors MN41 to MN4N are set to the on-state by the control signals 1B to NB. At this time, x in the interior division ratio x: (1−x) of the timing difference T of the input signals IN1, IN2 is given by n/N, as will be explained subsequently. This may also be said that the weighting is n.

The operation of the second interior division circuit $12_n$ is explained. If, in the second interior division circuit $12_n$, where n is an integer not less than 0 and not larger than N, the input signals IN1, IN2 are both at a low level, an output signal of the OR circuit 60 is at a low level, and the capacitor C is charged from the power supply VDD through the p-channel MOS transistor MP61 (the terminal voltage of the capacitor C is the power supply voltage VDD), with the output signal of the inverter INV 60 being at a low level.

If, in the second interior division circuit $12n$, the amount of the electric charge Q that need to be extracted from the capacitor C in order for the terminal voltage of the capacitor to get to the threshold value of inverter INV60 is such that Q=CV, where C and V are capacitance value and the terminal voltage of the capacitor, respectively, (N−n) pieces of n-channel MOS transistors MN31 to MN3N are set to the on-state by the control signal. During the time when only the input signal INI rises from a low level to reach a high level, with the input signal IN2 being then at a low level, the n-channel MOS transistors MN11 to MN1N are turned on, however, since (N−n) pieces of the n-channel MOS transistors MN31 to MN3N are on, the current flows through (N−n) pieces of the n-channel MOS transistors MN11 to MN1N to discharge the electric charge stored in the capacitor C by a current value of (N−n)×I. So, the amount of the electric charge stored in the capacitor C after time T is $$CV-(N-n) \times I \times T \tag{13}.$$

The input signal IN2 then rises to turn the n-channel MOS transistors MN11 to MN1N on. In the second interior division circuit $12_n$, since n pieces of the n-channel MOS transistors MN41 to MN4N are turned on by the control signals 1B to NB, as described above, the current flow through n pieces of the n-channel MOS transistors MN21 to MN2N. So, with (N−n) pieces of the transistors through which flow the current among the n-channel MOS transistors MN11 to MN1N, gates of which are fed with the input signal IN, the electric charge accumulated in the capacitor C is discharged with the current value N×I of N transistors, with the number of the conducting transistors being (N−n)+n=N.

So, the propagation delay as from the rising transition of the output signal d(N+n) of the delay circuit $10_{N+n}$, which is input to the second interior division circuit $12_n$ as the input signal IN1 (input signal with phase lead) until the transition of the output signal n-tap of the inverter INV60 of the second interior division circuit 12n is given by $$tpd=(CV-(N-n) \times I \times T/(N \times I)=CV/NI+nT/N-T \tag{14}.$$

The interior division ratio $F_0$ of the interior division circuit 120 with the weight equal to 0 is 0:1, with the propagation delay time tpd being the shortest and equal to CV/NI−T. The interior division ratio of the interior division circuit with the weight n equal to N is 1:0, with the propagation delay time tpd being the longest and equal to CV/NI.

The output signal n-tap of the number n second interior division circuit $12_n$ makes a transition from a low level to a high level at a timing of the delay time tpd=CV/NI+nT/N−T as from the rising timing (N+n)×td of the output d(N+n) of the number (N+n) delay circuit $10_{N+n}$.

So, the rising transition timing of the output signal n-tap of the number n second interior division circuit $12_n$, as from the clock cycle start time point corresponding to the rising transition edge of the input clock, is given by the following expression (15):

$$(N+n) \times td+CV/NI+nT/N-T=n(td+T/N)+N \times td+CV/NI-T \tag{15}.$$

The phase difference T between the rising transition of d(N+n) forming the input signal IN1 in the second interior division circuit and the rising transition of dn forming the input signal IN2 rising with a lag is given by $$T=tCK+n \times td-(N+n) \times td=tcK-N \times td \tag{16}.$$

From N×td+T=tCK, the above expression (15) may be rewritten as n×tCK/N+ constant $$\text{where } n=0,1,2,\ldots,N-1,N \qquad (17).$$

It may be seen from the above expression (17) that the phase difference of neighboring output signals among output signals 0-tap, 1-tap, . . . , N-tap of the second interior division circuits $12_1$ to $12_N$ is tCK/N, and is spaced at an equal interval. That is, multi-phase clocks corresponding to division by an equal interval N of the clock period tCK may be obtained from the second interior division circuits $12_1$ to $12_N$. It should be noted that the phase difference between the output signal N-tap of the second interior division circuit $12_N$ and the output signal 0-tap of the second interior division circuit $12_0$ is 2π (=time difference tCK).

The synthesis circuit 13 receives the signals 0-tap, 1-tap, . . . ,N-tap output with a phase difference tCK/N, to synthesize or multiplex the signals into one signal to generate a multiplied clock signal corresponding to N equal division of the period tCK of the input clock IN, as in the above-described embodiments. It is also possible for the synthesis circuit 13 to decimate every mth signals 0-tap,1-tap, . . . ,N-tap to generate a multiplied clock signal corresponding to N/m division of the input clock IN.

Figure 18:
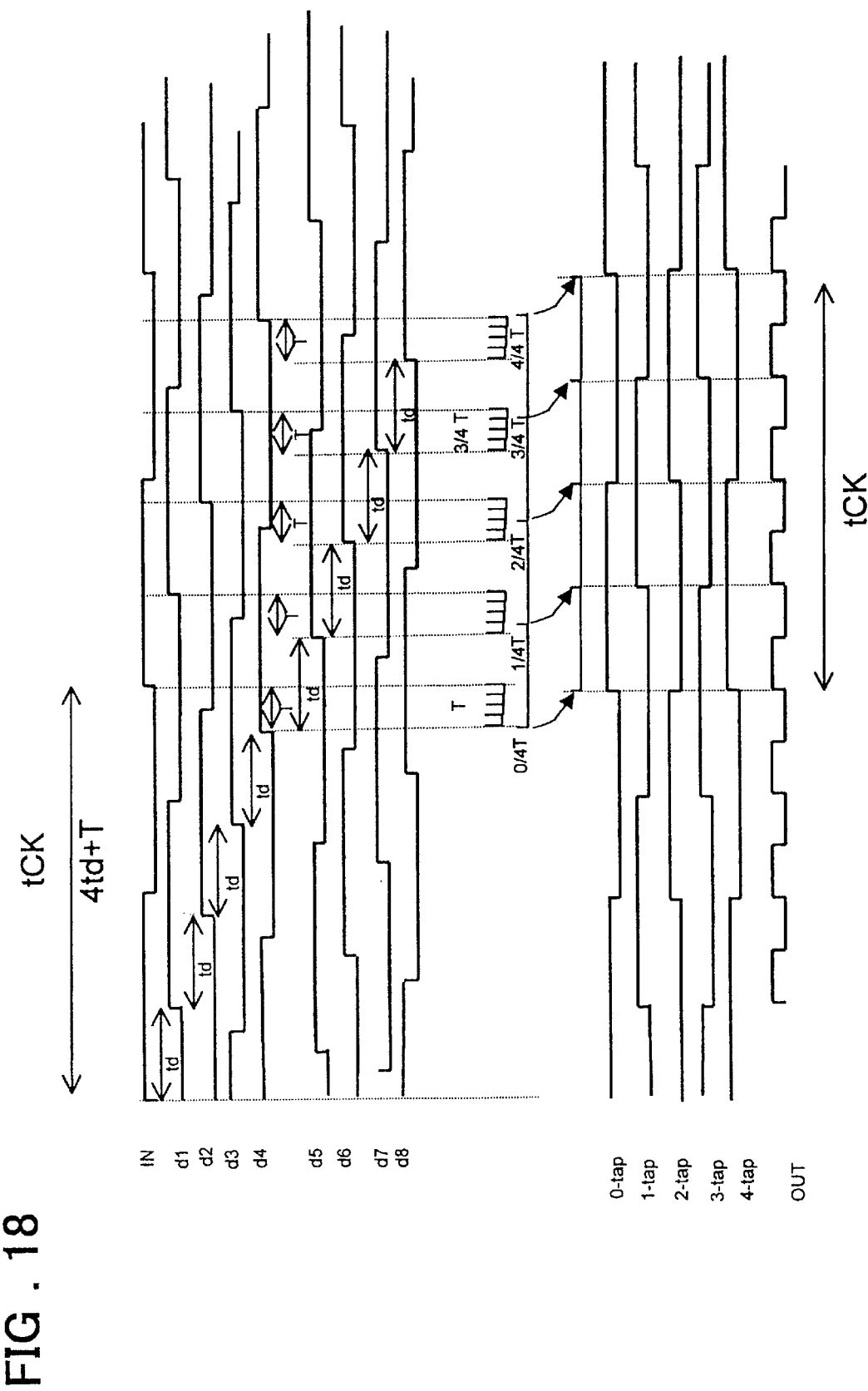
FIG. 18 is a timing diagram for illustrating the operation of a further embodiment of the present invention shown in FIG. 17.

FIG. 18 shows a timing diagram for illustrating the operation in case N=4. In this figure, d1 to d8 are output signals of the delay circuits $10_1$ to $10_8$ of FIG. 17, while 0-tap to 4-tap are output signals of the second interior division circuits $12_0$ to $12_4$ of FIG. 17 and OUT is an output signal of the synthesis circuit 13.

The output signal n-tap of the second interior division circuits $12_0$ to $12_4$, where n is 0 to 4, rises with a timing of $$n(td+T/N)+N\times td+CV/NI-T$$

where N=4, as from the rising of the clock IN. That is, from n=0, the timing of the rising edge of the output signal 0-tap is $$4\times td+CV/4I-T.$$

Also, from n=1, the timing of the rising edge of the output signal 1-tap is $$td+T/4+4\times td+CV/4I-T.$$

From n=2, the timing of the rising edge of the output signal 2-tap is $$2(td+T/4)+4\times td+CV/4I-T.$$

From n=3, the timing of the rising edge of the output signal 3-tap is $$3(td+T/4)+4\times td+CV/4I-T.$$

From n=4, the timing of the rising edge of the output signal 4-tap is $$4(td+T/4)+4\times td+CV/4I-T.$$

Since 4td+T=tCK, the output signals 0-tap to 4-to are four-phase clocks making transitions with an equal phase difference tCK/4. The synthesis circuit 13 to give an output clock signal corresponding to quadruple input clock synthesizes these clocks.

Figure 19:
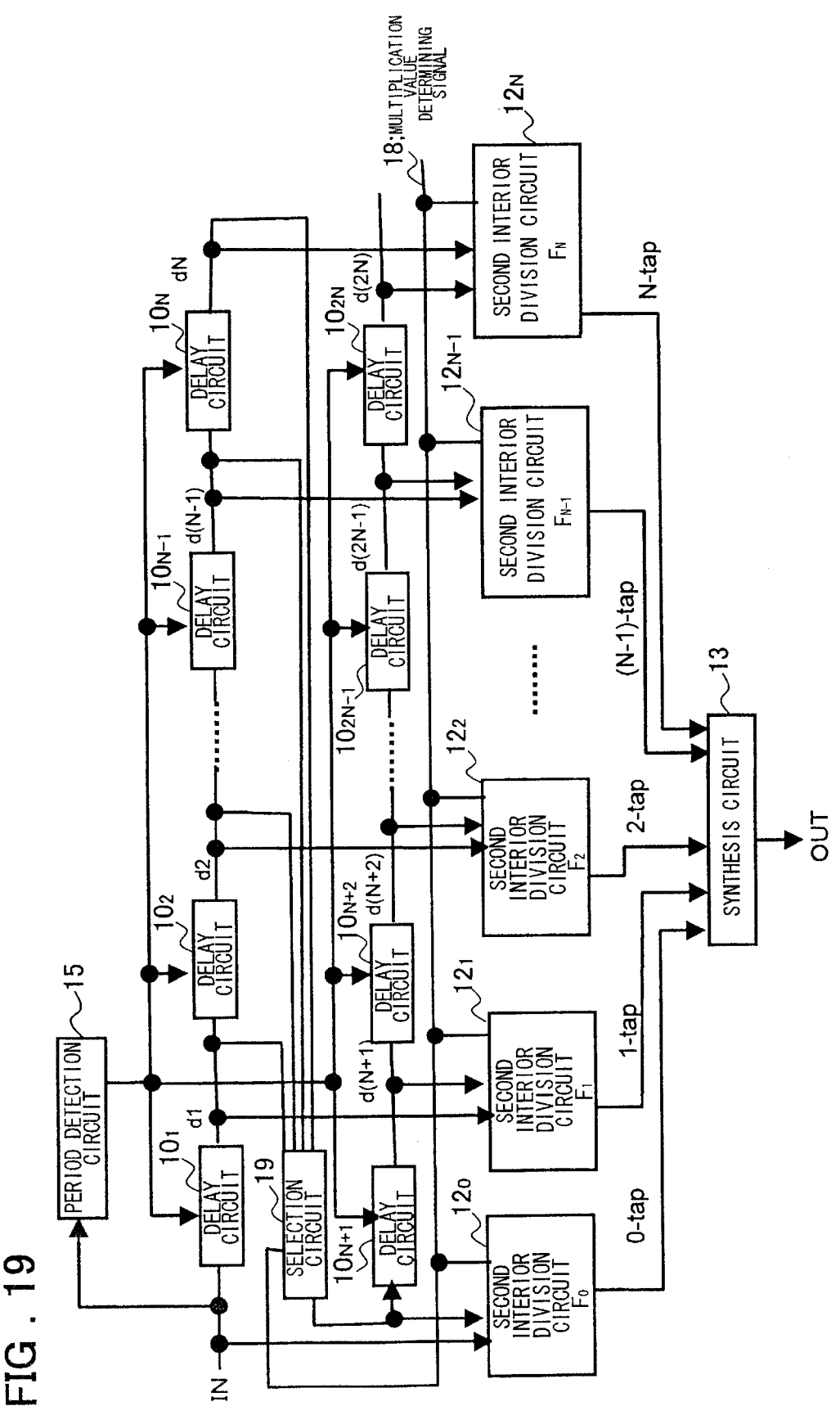
FIG. 19 shows the structure of a further embodiment of the present invention.

The further embodiment of the present invention is explained. Referring to FIG. 19, the further modification, shown therein, is not provided with a phase difference detection circuit as in the embodiment shown in FIG. 17, but is provided with a selection circuit in its stead. This modified embodiment differs from the embodiment shown in FIG. 17 in that the phase difference of the multi-phase clock outputs from the second interior division circuits $12_1$ to $12_N$ can be set variably. In the present embodiment, the phase difference of output signals of the neighboring output circuits is set to tCK/K, where K can be set variably within a range of 1 to N relative to the period tCK of the input clock IN, as will be explained subsequently in detail. The synthesis circuit 13 synthesizes multi-phase clocks of the phase difference tCK/K to output a frequency multiplied clock signal corresponding to K-tupled input clock IN.

More specifically, a selection circuit 19 is newly added to the circuit structure shown in FIG. 17. A multiplication value-determining signal 18 is provided to the selection circuit 19 and to the second interior division circuits $12_1$ to $12_N$. In FIG. 19, the period detection circuit 15, delay circuits $10_1$ to $10_{2N}$, second interior division circuits $12_0$ to $12_N$ and the synthesis circuit 13 are similar to those shown in FIG. 17. As the control signals 1 to N and 1B to NB, the multiplication value determining signal 18 is used.

The selection circuit 19 receives outputs d1 to dN of the N delay circuits $10_1$ to $10_N$ of the preceding delay circuit sequence to select one of them based on the multiplication value determining signal 18 to the first delay circuit $10_{N+1}$ of the n delay circuits of the succeeding delay circuit sequence and to the second interior division circuit $12_0$.

If, based on the multiplication value determining signal 18, the multiplication value is set to N and the output dn of the delay circuit $10_N$ is selected at the selection circuit 19 which receives signals from the N delay circuits $10_1$ to $10_N$, the configuration is the same as that of FIG. 17, so that multi-phase clocks obtained on N equal division of tCK are output. From the synthesis circuit 13, an N-tupled clock signal is output.

The present embodiment has a structural feature that the multiplication value can be set not only to N but also to a value smaller than N.

If the multiplication value is K, the selection circuit 19 selectively outputs the output dK (with the delay time K×td) of outputs d1 to dN of the number K delay circuit $10k$, based on the value of the multiplication value determining signal 18.

The multiplication value determining signal 18 is received by the second interior division circuit, shown in FIG. 22, as control signals 1B to NB and, if the multiplication value is K, K pieces of the n-channel MOS transistors MN31 to MN3N and the n-channel MOS transistors MN41 to MN4N as parallel-connected switching transistors (see FIG. 22) are turned on.

If, in the second interior division circuit $12_m$, shown in FIG. 22, with a weighting factor being m, where m is an integer from 0 to K, the multiplication value determining signal 18 is set to K, (K−m) pieces of the n-channel MOS transistors MN11 to MN1N, rising with the input signal IN1, that is rising at a timing of K×td+m×td as from the clock cycle start timing, are turned on, and m pieces of the n-channel MOS transistors MN21 to MN2N are turned on with the rising of the input signal IN2 after time T, so that the sum total of K n-channel MOS transistors are turned on.

If the amount of electric charge Q that need to be extracted from the capacitor C for the terminal voltage of the capacitor C reaches the threshold voltage of the inverter INV60 is such that Q=CV, where C and V are a capacitance value and the terminal voltage of the capacitance, respectively, the output signal rises at a timing of $$(CV-(K-m)\times IT)/KI=CV/KI+m\times T/K-T \qquad (18).$$

So, with the clock cycle start time point as a reference, the output signal of the second interior division circuit $12_m$ rises at a timing of $$(K+m)\times td+CV/KI+mT/N-T=m(td+T/K)+K\times td+CV/KI-T \qquad (19).$$

Since the input signal IN2 fed to the second interior division circuit $12_m$ (see FIG. 22) is a signal corresponding to the next input signal IN delayed by m delay circuits $10_1$ to $10_m$ (see FIG. 19), the phase difference between the input signal IN1 fed to the second interior division circuit $12_m$ and the input signal IN2 is given by the expression (20):

$$T=tCK-(K+m)td+m\times td=tCK-K\times td \qquad (20).$$

Thus, td+T/K=tCK/K, so that, from the above equation (17), the output signal m-tap of the second interior division circuit $12_m$ rises at a timing of the following expression (20):

$$m\times tCK/K+\text{constant} \qquad (21).$$

with the clock cycle start point as a reference.

That is, output signals 0-tap to (K−1)-tap of neighboring K second interior division circuits $12_0$ to $12_{K-1}$, become K-phase multi-phase clocks corresponding to equal division of the clock period tCK. These multiphase clocks are combined in the synthesis circuit 13 to produce a K-tupled clock signal.

A further embodiment of the present invention is explained. FIG. 20 shows the structure of this modified embodiment suitable for high-speed clock transmission. While in the embodiment shown in FIG. 17, an unbalanced clock transmission system is adopted, the present fifth embodiment of the present invention, shown in FIG. 20, a balanced clock transmission path is adopted and there are provided 2N delay circuits $10_1$ to $10_{2N}$ and 2N delay circuits $10_{B1}$ to $10_{BN}$ for each of the clock CLK and complementary clock having a reversed in phase (out of phase by 180° ($\pi$)) with respect to the clock CLK, and interior division circuits $12_0$ to $12_N$ and $12_{B0}$ to $12_{BN}$, for the respective clocks. The interior division circuits $12_0$ to $12_N$ and $12_{B0}$ to $12_{BN}$ generate multi-phase clocks corresponding to 2N equal division of the clock period tCK. The delay circuits $10_1$ to $10_{2N}$ and the delay circuits $10_{B1}$ to $10_{B2N}$ may be of the same configuration as the delay circuits $10_1$ to $10_{2N}$ shown in FIG. 17. The interior division circuits $12_0$ to $12_N$ and $12_{B0}$ to $12_{BN}$ are of the same configuration as the second interior division circuits $12_1$ to $12_N$, explained with reference to FIGS. 17 and 22.

It is assumed that the delay time of the delay circuits $10_1$ to $10_{2N}$ and the delay circuits $10_{B1}$ to $10_{BN}$ are all equal and equal to td and that $$N\times td+T=tCK/2 \text{ (a half period of tCK)} \qquad (22).$$

The interior division circuit $12_0$ outputs an output signal $(0/N)\pi$ of a timing corresponding to division by the interior division ratio (weighting) F0 of the time difference T between the output dN+$\pi$ of the delay circuit $10_{BN}$ of the reverse-phase clock CLKB and the next cycle non-inverting-phase clock CLK.

The interior division circuit $12_1$ outputs an output signal $(1/N)\pi$ of a timing corresponding to division by the interior division ratio (weighting) $F_1$ of the time difference T between the output d(N+1)+$\pi$ of the stage number (N+1) delay circuit $10_{BN+1}$ of the inverse-phase clock CLKB and signal d1 of the delay circuit $10_N$ of the next cycle non-inverting-phase clock CLK.

The interior division circuit $12_{N-1}$ outputs an output signal (N−1)/N) $\pi$ of a timing corresponding to division by the interior division ratio (weighting) $F_{N-1}$ of the time difference T between the output d(N−1)+$\pi$ of the of the delay circuit $10_{B2N-1}$ of the reverse phase clock and an output d(N−1) of the delay circuit 10N−1 of the next cycle non-inverting phase clock CLK.

The interior division circuit $12_N$ outputs an output signal $\pi$ of a timing corresponding to division by the interior division ratio (weighting) $F_N$ of the time difference T between the output signal d(2N)+$\pi$ of the of the delay circuit $10_{B2N}$ for the reverse phase clock and an output signal d(N) of the delay circuit 10N for the next cycle non-inverting phase clock CLK.

Figure 15:
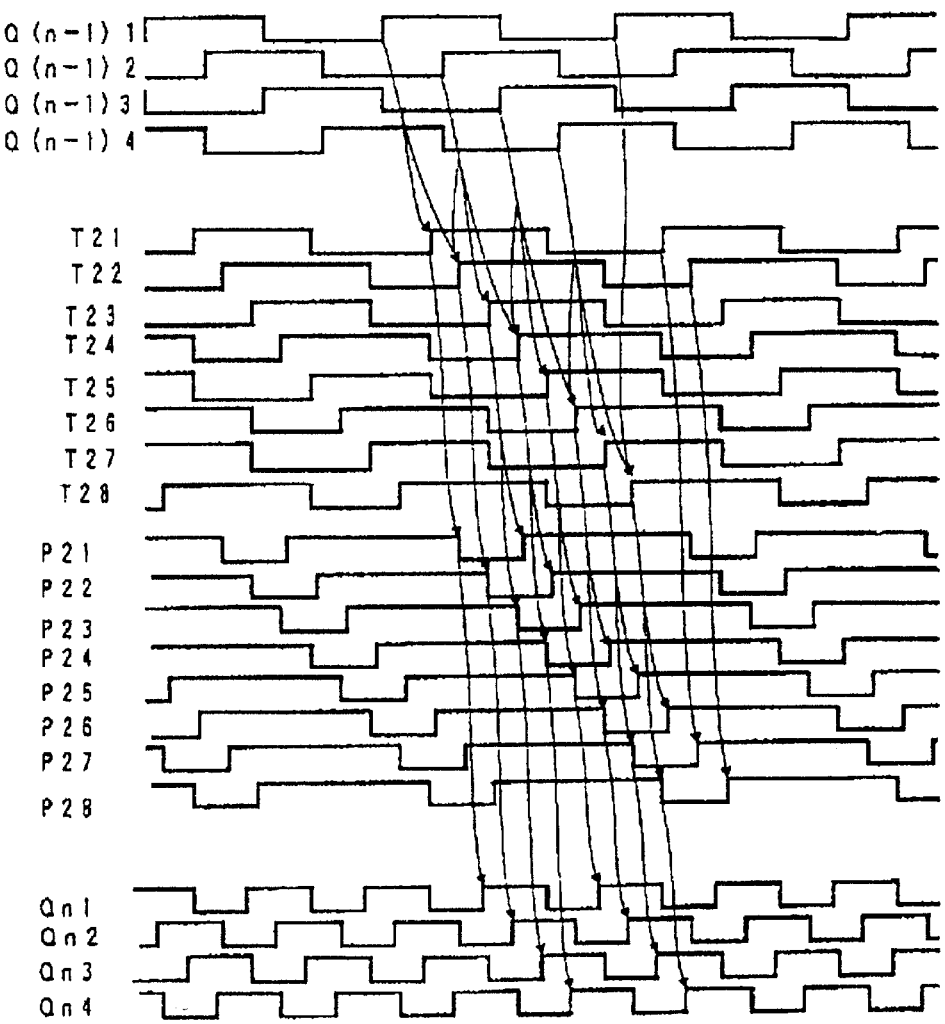
FIG. 15 is a timing diagram for illustrating the operation of the four-phase clock multiplier circuit shown in FIG. 11.
Figure 16:
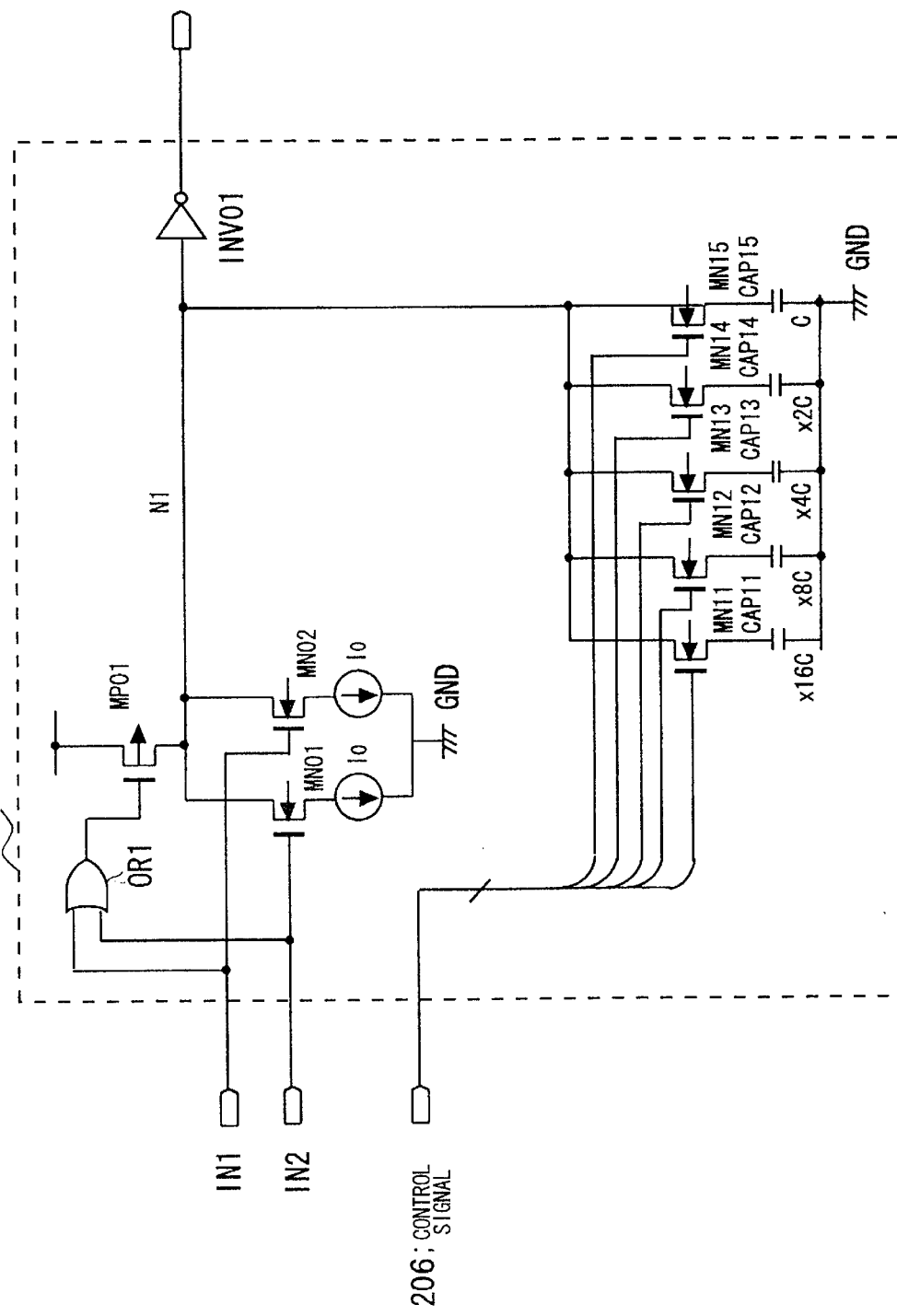
FIG. 16 shows a typical structure of a timing difference division circuit.

In FIG. 15, the rising timing of the output signal (n$\pi$)/N of the interior division circuit $12_n$ where n is an integer from 0 to N, with the clock cycle start time point as a reference, is $$(N+n)\times td+\pi+CV/NI+nT/N-T=n(td+T/N)+\pi+CV/NI-T=n(tCK/2N)+\\ \pi+CV/NI-T=n(\pi/2N)+\pi+CV/NI-T \qquad (23).$$

The interior division circuits $12_{B0}$ outputs an output signal $\lambda$ of a timing corresponding to division by the interior division ratio (weighting) $F_0$ of the time difference T (tCK/2−N×td) between the output dN of the delay circuit $10_N$ of the non-inverting phase clock CLK (delay time: N×td) and the reverse phase clock CLKB (phase difference from the forward phase clock CLK=tcK/2).

The interior division circuits $12_{B1}$ outputs an output signal ((N+1)/N)$\pi$ of a timing corresponding to division by the interior division ratio (weighting) $F_1$ of the time difference T between the output d(N+1) of the stage number N+1 delay circuit $10_{N+1}$ of the non-inverting phase clock CLK and the output d1+$\pi$ of the reverse phase clock CLKB by the delay circuit $10_{B1}$.

The interior division circuits $12_{BN-1}$ outputs an output signal ((2N−1)/N)$\pi$ of a timing corresponding to division by the interior division ratio (weighting) $F_{N-1}$ of the time difference T between the output d(2N−1) of the delay circuit $10_{2N-1}$ of the non-inverting phase clock CLK and the output d(N−1)+$\pi$ of the delay circuit $10_{BN-1}$ of the reverse phase clock CLK by the delay circuit $10_{BN-1}$.

The interior division circuits $12_{BN}$ outputs an output signal 2$\pi$ of a timing corresponding to division by the interior division ratio (weighting) $F_N$ of the time difference between the output d(2N)+$\pi$ of the delay circuit $10_{B2N}$ for the reverse phase clock CLKB and the output dN of the delay circuit 10N for the next cycle non-inverting phase clock.

The rising timing of the output signal ((N+n)/N)$\pi$ of the interior division circuit $12_{Bn}$, with the clock cycle start time point as a reference, where n is an integer from 0 to N, in the equation (15), is $$(N+n)\times td+CV/NI+nT/N-T=n(td+T/N)+CV/NI-T=n(tCK/2N)+CV/\\ NI-T=n(\pi/2N)+CV/NI-T \qquad (24).$$

An output signal (n/N)$\pi$ of the interior division circuit $12_n$ and the output signal ((N+n)/N)$\pi$ of the interior division circuit $12_{Bn}$ ((N+n)/N) $\pi$ is spaced by a phase $\pi$ from each other. An output signal (n/N)$\pi$ of the interior division circuit $12_n$ and an output signal ((n+1)/N))$\pi$ of the interior division circuit $12_{B+1}$ is spaced by a phase $\pi$/2N from each other, while an output signal (N+n/N)$\pi$ of the interior division circuit $12_{B_n}$ and an output signal $((N+n+1)/N)\pi$ of the interior division circuit $12_{B_{N+1}}$ are is spaced by a phase $\pi/2N$ from each other. Using the outputs of the interior division circuits $12_0$ to $12_N$ and the outputs of the interior division circuits $12_{B0}$ to $12_{BN}$, multi-phase clocks may be obtained by 2N equal division of the clock period tCK. A 2N-tupled clock signal may also be produced from these multi-phase clocks.

Figure 21:
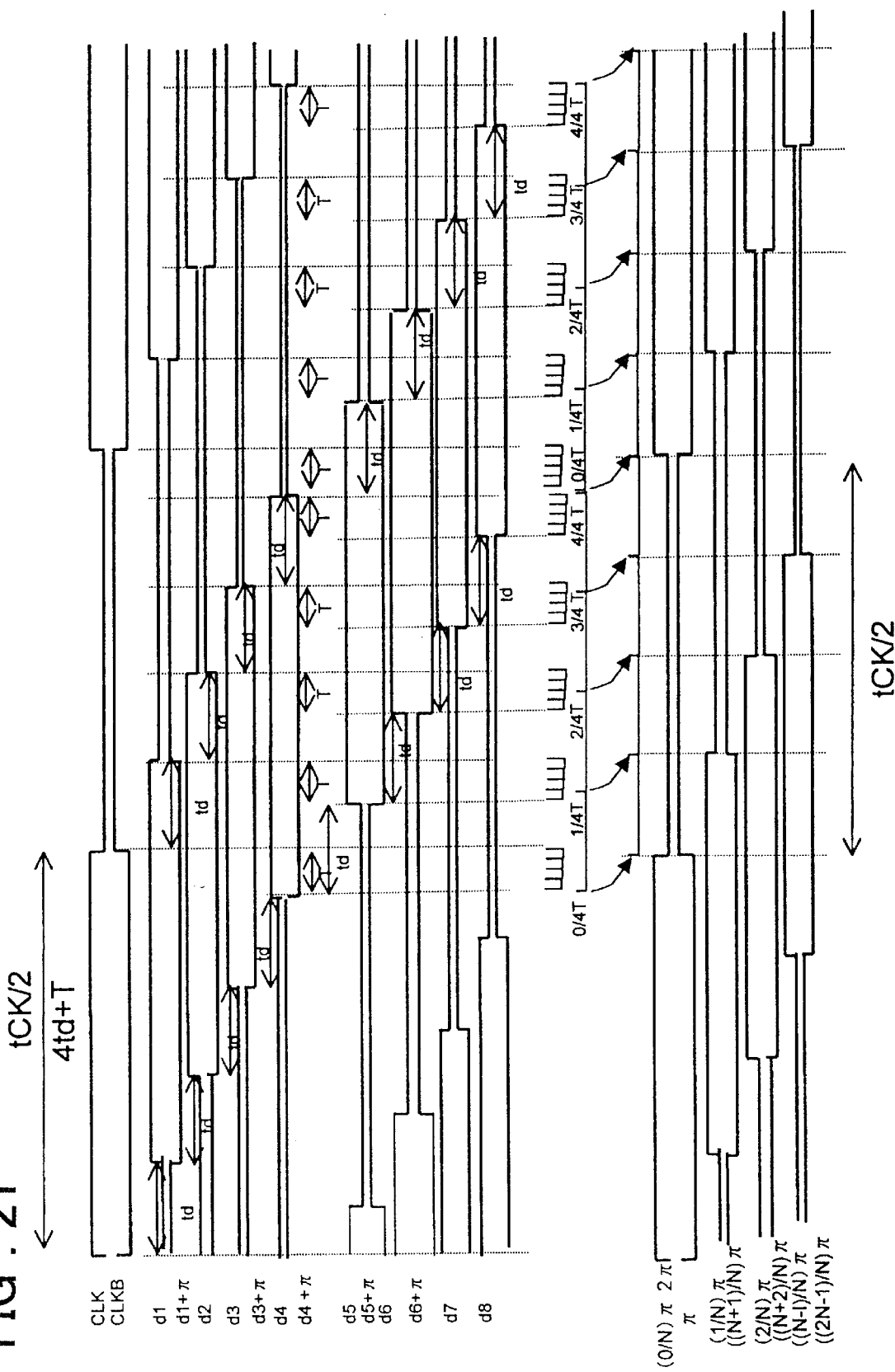
FIG. 21 is a timing diagram for illustrating the operation of a further embodiment of the present invention.

FIG. 21 shows a timing diagram of d1 to d8, d1+π to d8+π, an output signal $(n/N)\pi$ of the interior division circuits $12_0$ to $12_N$, an output signals of the interior division circuits $12_{BO}$ to $12_{BN}$ $((N+n)/N)\pi$, where N=4, n=0. 1. 2, 3) in a circuit shown in FIG. 20.

Using the outputs of the interior division circuits $12_0$ to $12_4$ and the outputs of the interior division circuits $12_{B0}$ to $12_{B4}$, multi-phase clocks may be obtained by 2N equal division of the clock period tCK.

Meanwhile, the circuit shown in FIG. 20 may, of course, be provided with a period detection circuit (15 of FIG. 17) so that the delay time can be variably adjusted based on the clock period as detected by the period detection circuit. The delay circuits $10_1$ to $10_{2N}$ and the delay circuits $10_{B1}$ to $10_{2N}$ are of the circuit configuration shown in FIG. 5 or 3b.

Figure 23:
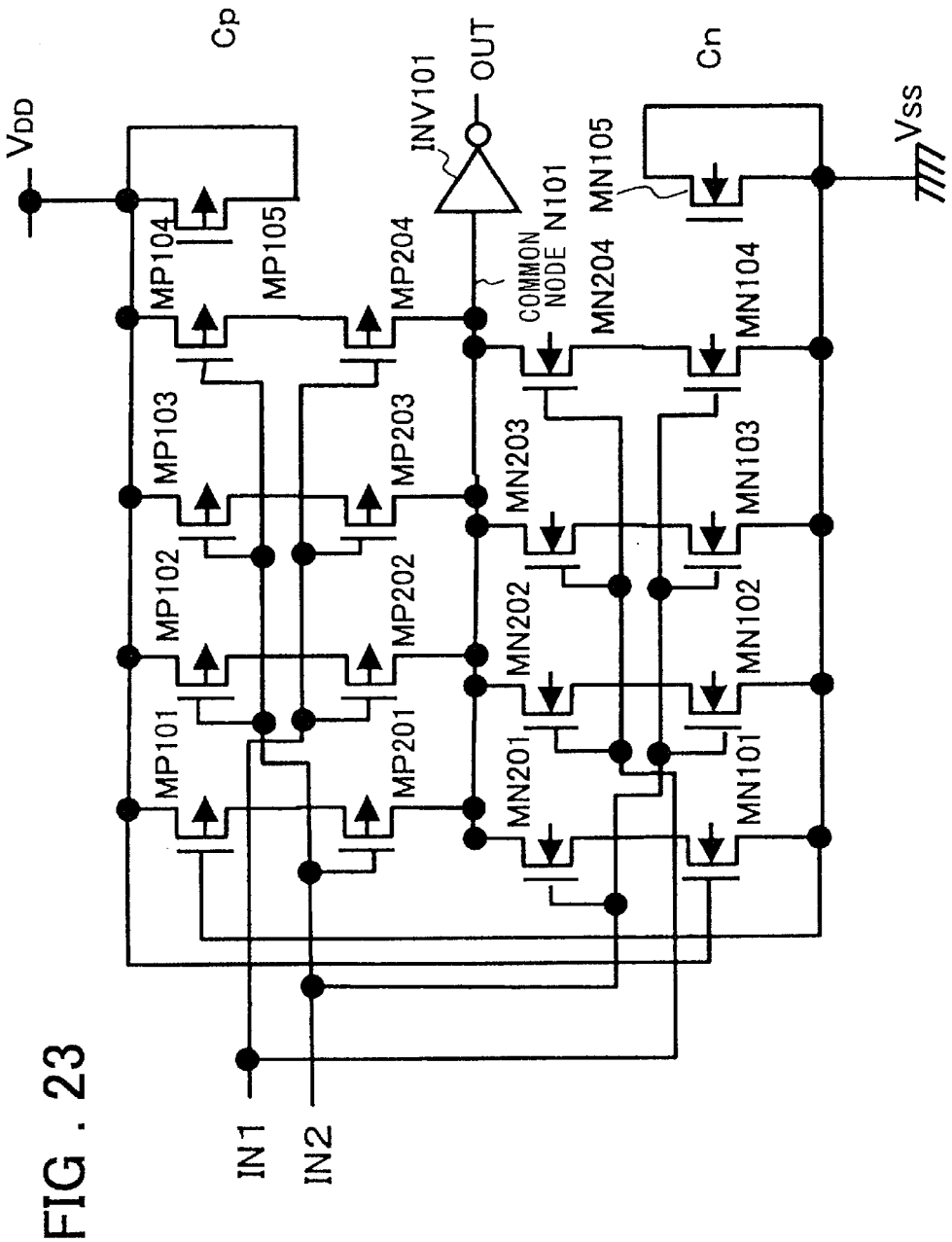
FIG. 23 shows another typical structure of an interior division circuit.

FIG. 23 shows al illustrative configuration of the interior division circuits $12_0$ to $12_N$ and the interior division circuits $12_{B0}$ to $12_{BN}$, shown in FIG. 20 and is shown a circuit configuration of the flow-through current suppressing type in which the multiplication value N=4 and the interior division ratio is 1:3. It should be noted that the interior division ratio is defined by the ratio of the discharge (charging) current by one of the two input signals making transition at an earlier time (number of transistors) to the charging (discharge) current by the input signal making transition at a later time (number of transistors). FIG. 24 is a timing diagram for illustrating the operation of the interior division circuit shown in FIG. 23.

Referring to FIG. 23, the interior division circuit includes p-channel MOS transistors MP101, MP102, MP103 and MP104, the sources of which are connected to a power supply VDD, p-channel MOS transistors MP201, MP202, MP203 and MP204, connected across the drains of the p-channel MOS transistors MP101, MP102, MP103 and MP104 and a common node 101, n-channel MOS transistors MN201, MN202, MN203 and MN204, having drains connected to the common node, and n-channel MOS transistors MN101, MN102, MN103 and MN104, connected across the n-channel MOS transistors MN201, MN202, MN203 and MN204 and the ground.

A gate of the p-channel MOS transistor MP101 is connected to the ground, gates of the n-channel MOS transistors MP102, MP103 and MP104 are connected to the input signal IN2, and gates of the n-channel MOS transistors MN202, MN203 and MN204 are connected to the input signal IN1. A gate of the n-channel MOS transistor MN101 is connected to the power supply VDD, gates of the n-channel MOS transistors MP102, MP103 and MP104 are connected are connected to the input signal IN2, a gate of the n-channel MOS transistor MN201 is connected to the input signal IN2 and gates of the n-channel MOS transistors MN202, MN203 and MN204 are connected to the input signal IN1.

The interior division circuit further includes a p-channel MOS transistor 105, a source and drain of which are connected to the power supply VDD, and an n-channel MOS transistor MN105, a source and drain of which are connected to the ground.

The common node N101 is connected to an input terminal of the inverter INV 101, while a signal is output from an output terminal OUT of the inverter INV101.

Referring to FIGS. 23 and 24, the operation of the present interior division circuit is explained. When the input signals IN1, IN2 make transitions from the low level to the high level, the n-channel MOS transistor operates as an interpolator (interior division circuit). When the input signal IN2 goes to a high level, the n-channel MOS transistor MN201 is turned on, whilst the n-channel MOS transistors MN102 to 104 are turned on to discharge the electric charge of the common node N101, with the current value I (drain current of the transistor MN201), through the transistor MN201. When the input signal IN1 goes to a high level after a time difference T, the n-channel MOS transistors MN202 to 204 are turned on to discharge the electric charge of the common node N101 with the current 4×I. Since an inversion layer is formed beneath the NMOS only during the period of the high level of the common node N101, the capacitor Cn operates as capacitance only during the high level period of the common node N101.

If the electric charge necessary for inverting the output signal of the inverter 101 which receives the voltage of the common node N101 as an input is CV, the electric charge after discharging the electric charge for a time T with a current value I through the transistor MN201 is CV-I×T, and discharging then occurs with the current 4×I, the delay time since transition of the input signal IN2 from the low level to the high level is given by T+(CV-I×T)/4I.

When the input signals IN1, IN2 make transitions from a high level to a low level, the p-channel MOS transistor operates as an interpolator. When the input signal IN2 goes down to a low level from a high level, the p-channel MOS transistor MP201 is turned on, while the p-channel MOS transistors MP102 to MP104 are turned on. The electric charge of the common node N101 is charged through the transistors MP101, MP201 with the current I (drain current of the transistor MP201). If the input signal INI goes down to a low level from a high level after tine T (phase difference T), the p-channel MOS transistors MP202 to MP204 are turned on to charge the common node N101 with the current 4×I.

Since the inversion layer is formed below PMOS only during the time period of the low level of the common node N101, the capacitor Cp operates as a capacitance (MOS capacitor) only during the time of the PMOS operation. If the charge necessary for inverting the output signal of the inverter INV101 fed with the potential of the common node N101 is CVTH, the electric charge when charging is made for time T with the current I through the transistor MP201 on transition of the input signal IN2 from the light level to the low level is I×T. Since charging then is made with the current 4×I, the delay time from a transition of the input signal IN2 from the high level to the low level to the switching of the output signal from the high level to the low level is given by $T+(CV_{TH}-I\times T)/4I$.

If, with the multiplication value N and the weighting of the interior division circuit m, the numbers of parallel connected transistors, i.e., the number of p-channel MOS transistors MP101 to MP104 located on the power supply side, that of p-channel MOS transistors MP201 to MP204 located on the common node side, that of n-channel MOS transistors MN101 to MN104 located on the ground level side, and that of n-channel MOS transistors MN201 to MN204 located on the common node side are all N.

In the p-channel MOS transistors located on the power supply side, the number of the transistors having the gates connected to IN2 is m and the gates of the remaining transistors are set at the ground level.

In the p-channel MOS transistors located on the common node side, the number of the transistors having gates connected to the input signal IN1 is m, and the gates of the remaining transistors are connected to the input signal IN2.

In the n-channel MOS transistors located on the ground level side, the number of the transistors the gates of which are connected to the input signal IN1 is m and the gates of the remaining transistors are set at a power supply voltage.

In the n-channel MOS transistors located on the common node side, the number of the transistors the gate of which are connected to the input signal IN1 is m and the gates of the remaining transistors are connected to the input signal IN2.

If, in the interior division circuit, shown in FIG. 23, the input signal goes down to a low level from a high level, the p-channel MOS transistor is in operation, whereas, if the input signal goes up to a high level from a low level, the n-channel MOS transistor is in operation, thus suppressing the flow-through current flowing from the power supply VDD to the ground VSS in transition of the input signal.

The clock control circuit, explained with reference to FIGS. 17, 19 and 20, is simplified in a circuit structure, and hence the present invention can be applied with advantage to a clock control circuit adapted for generating from an external clock an internal clock synchronized with the external clock in the semiconductor integrated circuit (LSI). If, in a semiconductor integrated circuit (LSI), including a clock control circuit, in which multi-phase clocks or a multiplied clock signal, synchronized with the external clock supplied from the clock terminal through input buffer and a clock generated a clock control circuit is provided as an internal clock from the clock driver to the synchronization circuit (sequential circuit) forming an internal circuit to the semiconductor integrated circuit device, a clock control circuit in accordance with the present invention, as explained with reference to FIGS. 17, 19 and 20, is provided as the clock control circuit in place of the PLL circuit, marked results can be achieved in reducing the circuit size and time needed for synchronization.

The circuitry shown in FIGS. 17, 19 and 20 may be used with advantage to a device receiving as an external clock a clock signal supplied from e.g., a crystal oscillator circuit to generate a frequency multiplied clock signal, a timing generator circuit for generating signals at a timing obtained on equal division of the clock period tCK or a signal having a variable multiplication frequency.

The meritorious effects of the present invention are summarized as follows.

According to the present invention, as described above, multiplied clocks phase-synchronized with an input clock may be output without using feedback type circuit configuration.

The present invention also has a meritorious effect that clock signals which make transition at a timing corresponding to equal division of a clock period of an external clock period supplied from an outside and a frequency multiplied clock signal synchronized with an external clock may be generated by a simplified structure.

The present invention also has a meritorious effect that multiphase clock signals and a frequency multiplied clock signal having the phase difference obtained on equal division of the clock period of the input clock can be generated by a simplified structure without employing a feedback circuit structure.

The present invention also has a meritorious effect that multi-phase clock signals and a frequency multiplied clock signal having the phase difference obtained on equal division of the clock period of the input clock can be generated by a simplified structure based on the delay circuit sequence and the interior division circuit without employing a phase difference detection circuit.

Moreover, the present invention has a meritorious effect that multiplied clock signals having a variably set multiplication value can be generated by a simplified structure based on the delay circuit sequence and the interior division circuit without employing a phase difference detection circuit.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items might fall under the modifications aforementioned.

What is claimed is:

1. A clock control circuit comprising:
   a delay circuit sequence including a plurality number of cascaded stages of delay circuit units, each made up of a first circuit receiving an input signal to output said input signal with a first delay time and a second circuit receiving an output signal from said first circuit to output said signal with a second delay time;
   a phase difference detection circuit receiving an input clock fed to said delay circuit sequence and an output clock output from said delay circuit sequence to detect a time difference between a clock period of said input clock and a delay time of said delay circuit sequence as a phase difference of said received two clocks; and
   a plurality of third circuits, each receiving an output signal of said first circuit of each of said delay circuit units to delay and output transition edge of said output signal of said first circuit with respective different delay time, depending on a stage number of said delay circuit unit to which belongs said first circuit in said delay circuit sequence, in terms of time obtained on equally dividing said phase difference by the number of said delay circuit units in said delay circuit sequence, as a unit;
   wherein said third circuits output a plurality of output signals which make transition at a time interval corresponding to equal division of the clock period of said input clock by the number of said delay circuit units in said delay circuit sequence.

2. A clock control circuit as defined in claim 1 wherein said third circuit comprises:
   a circuit controlling charging and discharging of a capacitor; and
   a circuit outputting, as said output signal of said third circuit, a logic value corresponding to the magnitude relation between a terminal voltage of said capacitor and a threshold value; and
   wherein said capacitor is charged or discharged during the time corresponding to said phase difference,
   said capacitor is again discharged or charged following said discharging or charging during the time period corresponding to the phase difference, responsive to transition of an output signal of said first circuit of the delay circuit unit associated with said third circuit; and
   a rise or fall transition edge of an output signal of said first circuit of said delay circuit unit associated with said third circuit is output with a delay equal to time corresponding to said second delay time less a delay time corresponding to a phase obtained on multiplying a phase obtained by equally dividing the phase difference by a number equal to the number of delay circuit units with a value indicating the stage number in said delay circuit sequence of said delay circuit unit corresponding to said third circuit.

3. The clock control circuit as defined in claim 1 further comprising:
a synthesis circuit generating and outputting a frequency multiplied clock signal of a clock period obtained on equal division of the clock period of said input clock based on said input signal and on plural output signals output from the third circuits.

4. A clock control circuit comprising:
a delay circuit sequence comprised of a plural number (N) of cascaded stages of delay circuit units, each made up of a first delay circuit with a first delay time t1 and a second delay circuit for delaying and outputting rise or fall transition edge of an output signal of said first delay circuit with a second delay time t2; to said delay circuit sequence an input clock with a clock period tCK being entered from a stage number 1 delay circuit unit;
a phase difference detection circuit receiving an output clock output from the last stage delay circuit unit of said delay circuit sequence and an input clock entered to said delay circuit sequence to detect from said two clocks a phase difference T corresponding to a time difference between a delay time of said delay circuit sequence and the period tCK of said input clock (T=N×(t1+t2−tCK);
(N−1) third delay circuits receiving respectively an output signal of a first delay circuit of from stage number 1 to stage number (N−1) said delay circuit units;
a number n said third delay circuit, where n is a positive integer of from 1 toN−1, delaying transition edge of an output signal of said first delay circuit of a corresponding stage number n delay circuit unit, based on the phase difference T as detected by said phase difference detection circuit, by time t2−n×T/N which is corresponding to said second delay time t2 less a delay time n×T/N corresponding to the phase T/N, obtained on equally dividing the phase difference T by the number N of the delay circuit units multiplied by the number of stages n in the delay circuit sequence of said delay circuit units corresponding to said third delay circuit, and outputting the delayed signal;
the number n said third delay circuit, where n is an integer from 1 to N−1, outputting a signal which makes a rise or fall transition at a timing delayed as from a start time point of a clock cycle of said input clock by time n×(t1+t2−T/N)=n×tCK/N; and
a synthesis circuit for generating a frequency multiplied clock signal of a clock period obtained on equal division of the clock period tCK of said input clock based from said input clock and output signals output from number 1 to number (N−1) said third delay circuits.

5. The clock control circuit as defined in claim 4 wherein said second delay circuit is comprised of a first interior division circuit at least including:
a first switch for controlling on and off of a charging path of a capacitor in said second delay circuit;
N second switches connected parallel to one another for controlling on and off of a discharging path of said capacitance; and
a buffer circuit for outputting a logic value corresponding to the magnitude relation between said terminal voltage of said capacitor and a threshold value;
said first switch being turned on to charge said capacitor when an output signal of said first delay circuit fed to said second delay circuit is of a second value;
said N second switches being turned on to discharge said capacitor when an output signal of said first delay circuit is of a first value.

6. The clock control circuit as defined in claim 4 wherein said second delay circuit is comprised of a first interior division circuit at least including:
a first switch for controlling on and off of a charging path of a capacitor in said second delay circuit;
N second switches connected parallel to one another for controlling on and off of a discharging path of said capacitor; and
a buffer circuit for outputting a logic value corresponding to the magnitude relation between said terminal voltage of said capacitor and a threshold value;
said first switch being turned on to discharge said capacitor when an output signal of said first delay circuit fed to said second delay circuit is of a second value;
said N second switches being turned on to charge said capacitor when an output signal of said first delay circuit is of a first value.

7. The clock control circuit as defined in claim 4 wherein
a number n said third circuit, wherein n is a positive integer from 1 to N−1, is comprised of a second interior division circuit at least including:
a third switch for controlling on and off of a charging path of a capacitor in said third delay circuit;
a plurality of fourth switches connected in parallel to one another for controlling on and off of a discharging path of said capacitor; and
a buffer circuit for outputting a logic value corresponding to the magnitude relation between said terminal voltage of said capacitor and a threshold value;
n of said plural forth switches being controlled on and off by an output signal of said phase difference detection circuit and being in an on-state during the time corresponding to said phase difference T as detected by said phase difference detection circuit to partially discharge the electric charge accumulated in said capacitor;
N of said fourth switches being controlled on and off by an output signal of said first delay circuit, being turned on as from a time point of transition of the nth first delay circuit from said capacitor in the partially discharged state, the electric charge in said capacitor being discharged to lower the terminal voltage thereof to change the output value of said buffer circuit.

8. The clock control circuit as defined in any one of claim 4 wherein
a number n said third circuit, wherein n is a positive integer from 1 to N−1, is comprised of a second interior division circuit at least including:
a third switch for controlling on and off of a charging path of a capacitor in said third delay circuit;
a plurality of fourth switches connected parallel to one another for controlling on and off of a discharging path of said capacitor; and
a buffer circuit for outputting a logic value corresponding to the magnitude relation between said terminal voltage of said capacitor and a threshold value;
n of said plural forth switches being controlled on and off by an output signal of said phase difference detection circuit and being in an on-state during the time corresponding to said phase difference T as detected by said phase difference detection circuit to partially charge said capacitor;
N of said fourth switches, being controlled on and off by an output signal of said first delay circuit, being turned on as from a time point of transition of the nth first delay circuit from said capacitor in the partially charged state, to further charge said capacitor to raise the terminal voltage thereof to change the output value of said buffer circuit.

9. A clock control circuit comprising:
a delay circuit sequence including a plurality number of cascaded (N) stages of delay circuit units each made up of a first delay circuit with a first delay time t1 and a second delay circuit for delaying and outputting the rise or fall transition edge of an output signal of said first delay circuit with a second delay time t2, said delay circuit sequence receiving an input clock with a period tCK and outputting the received clock after a time delay of ×(t1+t2);
said second delay circuit comprised of a first interior division circuit comprising:
a first switch for turning on a charging path of said first capacitor in said second delay circuit when an output signal of said first delay circuit input to said second delay circuit is of a second value;
N parallel-connected second switches for turning on a discharge path for discharging the electric charge accumulated in said first capacitor when the output signal of said first delay circuit is of a first value; and
a first buffer circuit for outputting a logic value corresponding to the magnitude relation between said terminal voltage of said first capacitor and a threshold value;
there being provided a phase difference detection circuit for detecting a phase difference T (T=N×(t=1+t2)-tCK) between an output clock output from the last stage delay circuit unit of said delay circuit sequence and an input clock of the next clock cycle associated with said output clock to output a signal in an activated state for a time corresponding to said phase difference; with the time period tCK/N corresponding to N equal division of one clock period tCK of said input clock being represented as t1+t2-T/N;
there being provided number 1 to numberN−1 second interior division circuits in association with said first delay circuits of the stage number 1 to stage number N delay circuit units;
a number n second interior division circuit, receiving an output signal of the first delay circuit of a number n first delay circuit, n being a positive integer from 1 o N−1, comprising:
a third switch for controlling on and off of a charging path of a second capacitor in said second interior division circuit;
a plurality of parallel-connected fourth switches for controlling on and off of a discharge path for discharging the electric charge accumulated in said second capacitor; and
a second buffer circuit for outputting a logical value corresponding to the magnitude relation between said terminal voltage of said second capacitor and a threshold value;
n of said plural fourth switches being turned on during the active period of an output signal of said phase difference detection circuit to partially discharge the electric charge accumulated in said second capacitor, N of said plural fourth switches being turned on to discharge said partially discharged second capacitor as from a time point the output signal of the number n first delay circuit is changed to a first value,
said second buffer circuit outputting an output signal which makes a transition to a high or low level at a timing of a delay time t2−n×T/N as from the rise or fall transition timing (N−1)×(t1+t2)+t1 of the number n first delay circuit, said output signal having transition timing of n(t1+t2−T/N)=n×tCK/N as from the clock cycle start time point which is the transition timing of said input clock;
the number 1 to number N−1 second interior division circuit outputting (N−1) clocks which make transition at a time interval tCK/N corresponding to N equal division of one clock period tCK of said input clock.

10. The clock control circuit as defined in claim 9 comprising:
a synthesis circuit for combining said input clock signals and plural clock signals output from N−1 second interior division circuits into one line signal to generate a frequency multiplied clock signal comprised of pulse signals each synchronized with rise or fall transition timing of said clock signals, said synthesis circuit outputting the frequency multiplied clock signal corresponding to equal division of the period tCK of said input clock.

11. The clock control circuit as defined in claim 9 wherein said phase difference detection circuit includes
a first signal generating circuit for generating a first signal when an output signal of said delay circuit sequence makes transition from a second value to a first value;
a second signal generating circuit for generating a second signal when the input clock make transition from said second value to said first value; and
a sequential logic circuit for setting an output signal to an active state responsive to a first signal from said first signal generating circuit and resetting the output signal to an inactive state responsive to a second signal from said first signal generating circuit.

12. The clock control circuit as defined in claim 9 wherein said phase difference detection circuit includes a logic circuit for activating an output when an output signal of said delay circuit sequence is of a first value and said input clock are of a second value.

13. The clock control circuit as defined in claim 11 wherein said phase difference detection circuit is provided in said second interior division circuit.

14. The clock control circuit as defined in claim 4 wherein there is provided a period detection circuit for detecting the period of said input clock;
the delay time of said first and second delay circuits being varied based on a control signal output from said period detection circuit.

15. The clock control circuit as defined in claim 9 wherein there is provided a period detection circuit for detecting a period of said input clock;
the capacitance value of said first capacitor in said first interior division circuit being changed based on a control signal output from said period detection circuit.

16. The clock control circuit as defined in claim 9 wherein there is provided a period detection circuit for detecting a period of said input clock; and wherein
said first interior division circuit comprises a first switch connected across a first power supply and an internal node;
a logic circuit receiving signals from first and second input terminal thereof and having an output terminal connected to a control terminal of said first switch, said first switch being turned on when the input signal fed to said first and second input ends are both of a second value;

a non-inverting or inverting type buffer circuit to an input terminal of which said internal node is connected and which is adapted for outputting a logical value in accordance with magnitude relation between the voltage of said internal node and a threshold voltage; and a plurality of second switches connected in parallel across said internal node and said second power supply, said second switches being fed at control terminals thereof with input signals from said first and second input terminals and being turned on when said input signal is of a first value;

there being a plurality of parallel connected serial circuits, each comprised of a switch and a capacitor, across said internal node and said second power supply; said switch forming said serial circuit being turned on and off by control signals output from said period detection circuit, the capacitance value of said capacitor connected to said internal node being varied depending on the clock period of said input clock;

said first and second input terminals being connected in common so that said input signals are fed thereto in common.

17. The clock control circuit as defined in claim 14 wherein the first delay circuit includes a delay circuit for delaying an input signal; and a selector receiving an output signal of respective different delay time taken out from plural output terminals of said delay circuit, said selector selectively outputting one signal based on a control signal output from said period detection circuit.

18. The clock control circuit as defined in claim 9 wherein the number n second interior division circuit, where n is a positive integer from 1 to N−1, comprises:

a first signal generating circuit for detecting transition from a second value to a first value of an output signal of said first delay circuit of the number n stage delay circuit unit to output a first signal;

a second signal generating circuit for detecting transition to an activated state of an output signal of said phase difference detection circuit to output a second signal; and a sequential logic circuit having its output signal set and reset responsive to said first signal output from said first signal generating circuit and responsive to said second signal output from said second signal generating circuit, respectively;

said third switch being turned on when said second signal from said second signal generating circuit is of a second value;

n of said fourth switches, to the control terminals of which is fed the output signal of said phase difference detection circuit, being turned on during the period of the activated output signal of said phase difference detection circuit to partially discharge the electric charge of said second capacitor;

N of said fourth switches, to the input terminals of which is fed an output signal of said sequential logic circuit, being turned on, as from a time point when an output signal of the number n first delay circuit goes to a first value, to discharge said second capacitor.

19. The clock control circuit as defined in claim 9 wherein the number n second interior division circuit, n being a positive integer from 1 to N−1, comprises:

a first signal generating circuit including an odd stage number first inverter sequence for inverting and delaying an output signal of said first delay circuit of the stage number n delay circuit unit, and a first logic circuit fed with an output signal of said first delay circuit and with an output signal of said first inverter sequence for outputting a first pulse signal of a second value during the time period corresponding to the delay time of said first inverter sequence at the time of transition of the output signal of said first delay circuit from a second value to a first value;

a second signal generating circuit including an odd stage number second inverter sequence for inverting and delaying an output signal of said phase difference detection circuit, and a second logic circuit fed with an output signal of said phase difference detection circuit and with an output signal of said second inverter sequence for outputting a second pulse signal of a second value during the time period corresponding to the delay time of said second inverter sequence at the time of transition of the output signal of said phase difference detection circuit from a second value to a first value; and a sequential logic circuit set by a first pulse signal output by said first signal generating circuit to output a second value and reset by a second pulse signal output from the second signal generating circuit to output a first value;

said third switch being turned on when a second pulse signal from said second signal generating circuit is of a second value;

n of said fourth switches, the control terminals of which are fed with an output signal of said phase difference detection circuit obtained on inverting an inverted output signal of said second inverter sequence of said second signal generating circuit by an inverter, being turned on as from a time point when an output signal of the number n first delay circuit is changed to a first value to discharge said second capacitor.

20. The clock control circuit as defined in claim 9 wherein the number n second interior division circuit, n being a positive integer from 1 to N−1 comprises:

a first signal generating circuit including an odd stage number first inverter sequence for inverting and delaying an output signal of said first delay circuit of the stage number n delay circuit unit, and a first logic circuit fed with an output signal of said first delay circuit and with an output signal of said first inverter sequence for outputting a first pulse signal of a second value during the time period corresponding to the delay time of said first inverter sequence at the time of transition of the output signal of said first delay circuit from a second value to a first value;

a second signal generating circuit including an odd stage number second inverter sequence for inverting and delaying an output signal of said phase difference detection circuit, and a second logic circuit fed with an output signal of said phase difference detection circuit and with an output signal of said second inverter sequence for outputting a second pulse signal of a second value during the time period corresponding to the delay time of said second inverter sequence at the time of transition of the output signal of said phase difference detection circuit from a second value to a first value; and sequential logic circuit;

a sequential logic circuit set by a first pulse signal output by said first signal generating circuit to output a second value and reset by a second pulse signal output from the second signal generating circuit to output a first value;

a third switch connected across a first power supply and an internal node and turned on when a second pulse signal from said second signal generating circuit is of a second value;

a second capacitor connected across said internal node and the second power supply;

an inverter having an input terminal connected said internal node; and 2N fourth switches connected parallel to one another and having one ends connected to said internal node and 2N fifth switches having one ends connected to the opposite ends of said 2N fourth switches and having the opposite ends connected to said second power supply;

one side half of N of said 2N fourth switches having their control terminals fed with non-inverting signals of said period detection circuit obtained on inverting a complemented output signal of said second inverter sequence of said second signal generating circuit by an inverter;

the N fifth switches connected to said N fourth switches being turned on and off by a control signal input to control terminals thereof, n of said fifth switches of the number n interior division circuit fed with an output signal of the number n first delay circuit being turned on and the fourth switch serially connected to the fifth switch in the on state being turned on when the output signal of the phase difference detection circuit assumes a first value to discharge the electric charge of said second capacitor;

an output signal of said sequential logic circuit being connected in common to control terminals of the other half N of said 2N fourth switches, with the N fifth switches being turned on by a control signal input to the control terminals of said fifth switches connected to said N fourth switches.

21. The clock control circuit as defined in claim 9 wherein the number n second interior division circuit, n being a positive integer from 1 to N−1, comprises:

a first signal generating circuit including an odd stage number first inverter sequence for inverting and delaying an output signal of said first delay circuit of the stage number n delay circuit unit, and a first logic circuit fed with an output signal of said first delay circuit and with an output signal of said first inverter sequence for outputting a first pulse signal of a second value during the time period corresponding to the delay time of said first inverter sequence at the time of transition of the output signal of said first delay circuit from a second value to a first value;

a second signal generating circuit including an odd stage number second inverter sequence for inverting and delaying an output signal of said phase difference detection circuit, and a second logic circuit fed with an output signal of said phase difference detection circuit and with an output signal of said second inverter sequence for outputting a second pulse signal of a second value during the time period corresponding to the delay time of said second inverter sequence at the time of transition of the output signal of said phase difference detection circuit from a second value to a first value; and sequential logic circuit;

a sequential logic circuit set by a first pulse signal output by said first signal generating circuit to output a second value and reset by a second pulse signal output from the second signal generating circuit to output a first value;

a third switch connected across a first power supply and an internal node and turned on when a second pulse signal from said second signal generating circuit is of a second value;

a second capacitor connected across said internal node and the second power supply;

an inverter having an input terminal connected said internal node; and n+N fourth switches connected in parallel across said internal node and said second power supply;

the control terminals of n of said fourth switches being fed with an output signal of said phase difference detection circuit obtained on further inverting a inverted output signal of said second inverter sequence of said second signal generating circuit by an inverter;

an output terminal of said sequential logic circuit being connected to control terminals of said N fourth switches.

22. A signal generating circuit comprising:

a delay circuit sequence including a plurality of cascaded stages of delay circuit units each made up of a first circuit outputting an input signal with a first delay time and a second circuit outputting an output signal of said first circuit with a second delay time;

a phase difference detection circuit receiving an input clock input to said delay circuit sequence and an output clock output from said delay circuit sequence with a delay to detect the time difference between the period of said input signal and the delay time of said delay circuit sequence as a phase difference of said two input clock; and a plurality of third circuits, each receiving an output signal of said first circuit of each of said delay circuit units for outputting transition edge of the output signal of said first circuit with respective different delay time, depending on the stage number of said delay circuit in said delay circuit sequence to which belongs said first circuit, in terms of the time obtained on equally dividing said phase difference with the number of said delay circuit units in said delay circuit sequence, as a unit;

said third circuits outputting a plurality of output signals which make transition at a time interval corresponding to equal division of the clock period of said input clock with the number of said delay circuit units in said cascaded connection of said delay circuit sequence.

23. The signal generating circuit as defined in claim 22 wherein said third circuit includes a circuit for controlling charging and discharging of a capacitor and a circuit for outputting, as said output signal of the third circuit, a logic value corresponding to the magnitude relation between a terminal voltage of said capacitor and a threshold value; and wherein said capacitor is charged or discharged during the time corresponding to said phase difference, said capacitor is again discharged or charged following said discharging or charging during the time period corresponding to the phase difference, responsive to transition of an output signal of said first circuit of the delay circuit unit associated with said third circuit; and a rise or fall transition edge of an output signal of said first circuit of said delay circuit unit associated with said third circuit is output with a delay equal to time corresponding to said second delay time less the delay time corresponding to a phase obtained on multiplying a phase obtained on equally dividing the phase difference with a number equal to the number of delay circuit units by a value indicating the stage number in said delay circuit sequence of said delay circuit unit corresponding to said third circuit.

24. A frequency multiplier circuit having a signal generating circuit as defined in claim 22 further comprising:
a circuit for generating a frequency multiplied clock signal of a clock period obtained on equal division of a clock period of said input clock based on said input signal and on output signals of the third circuits.

25. A clock control circuit comprising
a delay circuit sequence including a plurality of cascaded stages of delay circuit units each made up of a first circuit for outputting an input signal with a first delay time;
a phase difference detection circuit receiving an input clock input to said delay circuit sequence and an output clock output from said delay circuit sequence to detect the time difference between the clock period of said input clock and the delay time of said delay circuit sequence as a phase difference of said two input clock; and
a plurality of second circuits fed with an output signal of a plurality of said first circuits for outputting transition edges of the output signals of said first circuit with respective different delay time, depending on the stage number of said delay circuit in said delay circuit sequence, in terms of the time obtained on equally dividing said phase difference with the number of said delay circuit units in said delay circuit sequence, as a unit;
said second circuits outputting a plurality of output signals which make transition at a time interval corresponding to equal division of the clock period of said input clock with the number of said delay circuit units in said delay circuit sequence.

26. A clock control circuit as defined in claim 25 wherein said third circuit includes a circuit for controlling charging and discharging of a capacitor and a circuit for outputting, as said output signal, a logic value corresponding to the magnitude relation between a terminal voltage of said capacitor and a threshold value;
said capacitor being charged and discharged during the time corresponding to said phase difference, said capacitor being again discharged or charged following said discharging or charging during the time period corresponding to the phase difference, responsive to transition of an output signal of said first circuit of the delay circuit unit associated with said second circuit; and
wherein with the phase different being T, the number of the first circuits being N and with the stage number of said first circuit associated with said second circuit in the delay circuit sequence being n, said output signal is output with a delay time from a rising or falling edge of a transition edge of the output signal of said first circuit, said delay time being a time corresponding to the delay time proper to said second circuit less T−n× T/N corresponding to subtraction of the n×T/N from said phase difference T.

27. The clock control circuit as defined in claim 25 wherein a frequency multiplied clock signal is generated based on said input signal and output signals of plural second circuits.

28. A clock control circuit comprising:
a delay circuit sequence comprised of a plural number (N) of cascaded stages of first delay circuits, each with delay time t1; said delay circuit sequence being fed with input clock of a period tCK from a stage number 1 first delay circuit;
a phase difference detection circuit for detecting a phase difference T (T=tCK−N×t1) corresponding to the time difference between the delay time of said delay circuit sequence and the clock period tCK of said input clock, from an output clock output from the last stage first delay circuit of said delay circuit sequence and an input clock input to said delay circuit sequence;
N second delays circuits fed respectively with outputs of number 1 to number N first delay circuits;
the number n second delay circuit, n being a positive integer from 1 to N, delaying transition edge of an output signal of the corresponding stage number n first delay circuit, based on a phase difference T detected by the phase difference detection circuit, by a time corresponding to the delay time proper to said plural second delay circuits tpd less (N−n)×T/N corresponding to a product of the phase T/N corresponding to the phase difference T divided equally by the total number of first delay circuits with the difference between N and the number of stages n of said first delay circuits in said delay circuit sequence;
the number n second delay circuit, n being a positive integer from 1 to N, outputting signals making rise or fall transition with a timing delayed by $$n \times t1 + tpd - (1 - n/N) \times T$$

as from the start time point of the clock cycle of said input clock;
multi-phase clocks with a time interval of t1+T/N being generated from an output signal of each of the number 1 to number N second delay circuits.

29. The clock control circuit as defined in claim 28 wherein the number n second delay circuit, n being a positive integer from 1 to N−1, having
a first switch for controlling on and off of a charging path of a capacitor in said second delay circuit;
a plurality of second switches connected parallel to one another for controlling on and off of a discharging path of said capacitor;
a buffer circuit for outputting a logic value corresponding to the magnitude relation between said terminal voltage of said capacitor and a threshold value;
n of said plural second switches being controlled on and off by an output signal of said phase difference detection circuit and being turned on during a time period corresponding to the phase difference T as detected by said phase difference detection circuit to partially discharge the electric charge of said capacitor;
N second switches, controlled on and off by the output signal of said first delay circuit, being turned on as from the time point of transition of the output signal of the number n first delay circuit, by an output signal of said phase difference detection circuit, to discharge the capacitor the electric charge of which have been partially discharged to lower the terminal voltage of said capacitor to change the output value of said buffer circuit.

30. The clock control circuit as defined in claim 28 wherein the number n second delay circuit, n being a positive integer from 1 to N−1, at least including
a first switch for controlling on and off of a charging path of a capacitor in said second delay circuit;
a plurality of second switches connected parallel to one another for controlling on and off of a discharging path of said capacitor; and a buffer circuit for outputting a logic value corresponding to the magnitude relation between said terminal voltage of said capacitor and a threshold value;

n of said plural second switches being controlled on and off by an output signal of said phase difference detection circuit and being turned on during a time period corresponding to the phase difference T as detected by said phase difference detection circuit to partially charge said capacitor;

N second switches, controlled on and off by the output signal of said first delay circuit, being turned on as from the time point of transition of the output signal of the number n first delay circuit, by the output signal of said first delay circuit to further discharge the capacitor to lower the terminal voltage of said capacitor to change the output value of said buffer circuit.

31. A clock control circuit comprising:

a delay circuit sequence including a plural number of cascaded stages (N stages) of delay circuits with a delay time t1, said delay circuit sequence receiving an input clock with a clock period of tCK and outputting the clock with a time delay of N×t1;

a phase difference detection circuit receiving said input clock and an output clock of the last stage first delay circuit of said delay circuit sequence to detect a phase difference T (T=tCK−N×t1) between said output clock and the input clock of the next cycle associated with said output clock to output an activated output signal during the time corresponding to said phase difference T;

with the period corresponding to N equal division of one clock period tCK of said input clock being given as t1+T/N; and number 1 to number N interior division circuits associated with the stage number 1 to stage number N first delay circuits;

the number n interior division circuit, receiving an output signal of the number n first delay circuit, n being a positive integer from 1 toN−1, including:
a first switch for controlling on and off of the charging path of a capacitor in said interior division circuit;
a plurality of parallel-connected second switches for controlling on and off of a discharge path for discharging the electric charge accumulated in said capacitor; and
a buffer circuit for outputting a logic value corresponding to the magnitude relation between said terminal voltage of said capacitor and a threshold value;
wherein n of said plural switches is turned on during an activated period of the output signal of said phase difference detection circuit to partially discharge the electric charge of said capacitor, N of said plural second switches is turned on as from a time point the output signal of the number n first delay circuit is changed to a first value to discharge the capacitor, and said buffer circuit outputs an output signal which makes rise or fall transition with a delay time from a rise or fall transition timing of an output signal of the number n first delay circuit or n×t1, said delay time corresponding to a time proper to the interior division circuit subtracted by (N−n)×T/N; and
wherein the number 1 to number N said interior division circuits output N multi-phase clocks which make transition with an equal time interval t1+T/N.

32. The clock control circuit as defined in claim 31 comprising
a synthesis circuit receiving said input clock and clocks output from said plural interior division circuits to form a single line synthesized signal to generate a frequency multiplied clock signal.

33. A semiconductor integrated circuit comprising:
a clock control circuit as claimed in claim 1, the output signal of said clock control circuit being supplied as an internal clock to an internal circuit.

34. A clock controlling method comprising the steps of:
entering an input clock to a delay circuit sequence including a plurality number of cascaded stages of delay circuit units each made up of a first circuit for outputting an input signal with a first delay time and a second circuit for outputting an output signal of said first circuit with a second delay time;

detecting, by a phase difference detection circuit, a phase difference between a clock pulse of the clock cycle next to the input clock fed to said delay circuit sequence and a clock pulse output from the last state delay circuit unit of the delay circuit sequence, that is a difference between the delay time of the delay circuit sequence and the clock period of input clock; and outputting, from a plurality of third circuits which receives output signals of the first circuits of said plural delay circuit units, transition edges of the output signals of said first circuits with respective different delay time, depending on a stage number of said delay circuit unit to which belongs said first circuit in said delay circuit sequence, in terms of time obtained on equally dividing said phase difference by the number of said delay circuit units in said delay circuit sequence, as a unit;

wherein said third circuits outputs a plurality of output signals which make transition at a time interval corresponding to equal division of the clock period of said input clock with the number of said delay circuit units in said delay circuit sequence.

35. The clock controlling method as defined in claim 34 wherein
said third circuits output, based on said phase difference, the rise or fall transition edge of the output signal of the first circuit of the delay circuit unit associated with the third circuit with a delay corresponding to the second delay time less the delay time corresponding to a phase obtained on multiplying the phase obtained on equally dividing the phase difference by the number of the delay circuit units with a value corresponding to the number of stages in said delay circuit sequence of the delay circuit units corresponding to said third circuit.

36. The clock controlling method as defined in claim 34 wherein a frequency multiplied clock signal obtained on equally dividing a clock period of said input clock is generated based on said input clock and on output signals of the third circuits.

37. A clock controlling method for outputting a frequency multiplied clock signal synchronized with an input clock, comprising the steps of:
entering an input clock of a clock period tCK to a delay circuit sequence comprised of N cascaded stages of first delay circuits with a delay time t1 and second delay circuits for delaying the rising or falling edges of the output signal of the first delay circuit with a delay time t2, and outputting the delayed signal;

detecting, by a phase difference detection circuit, a phase difference T (T=N×(t1+t2)−tCK) between an output clock output from the last stage first delay circuit of the delay circuit sequence and the input clock of the next cycle input clock to the input clock associated with said output clock;

1 to N−1 third delay circuits in association with the number 1 to number N first delay circuits being provided, said third delay circuits being fed with outputs of said first delay circuits of the stage number 1 to stage number N−1 delay circuit units;

the number n said third delay circuit, n being an integer from 1 to N−1, outputting, based on the phase difference T as detected by said phase difference detection circuit, transition edge of the output signal of the associated stage number n first delay circuit, with a delay corresponding to the second delay time t2 less the product of the number of sages n in the delay circuit sequence of the delay circuit units associated with the third delay circuits with the phase T/N corresponding to division of the phase difference T by the number of the delay circuit units, or t2−n×T/N;

the number n said third delay circuit, n being a positive integer from 1 to N, outputting a signal making rise or fall transition with a timing delayed by $n \times (t1+t2-T/N)$ from the start time point of the clock cycle of the input clock; and generating a frequency multiplied clock signal of a clock period corresponding to equal division of a clock period of the input clock being by synthesizing the input clock and the outputs of the number 1 to number N−1 third delay circuits.

38. A clock controlling method for outputting a frequency multiplied clock signal synchronized with an input clock, comprising the steps of:

entering an input clock of a clock period tCK to a delay circuit sequence comprised of N cascaded stages of first delay circuits with a delay time t1, said delay circuit sequence being fed with input clock with a period of tCK;

detecting, by a phase difference detection circuit, a phase difference T (T=tCK−N×t1) between an output clock output from the last stage first delay circuit of the delay circuit sequence and the input clock of the next cycle input clock to the input clock associated with said output clock;

N second delay circuits in association with the number 1 to number N first delay circuits being provided, said second delay circuits being fed with outputs of said first delay circuits;

the number n second delay circuit, n being an integer from 1 to N, outputting, based on the phase difference T as detected by said phase difference detection circuit, the transition edges of the output signal of the associated stage number n first delay circuit, with a delay corresponding to the delay time tpd proper to said plural second delay circuits less the time prescribed by the difference between the total number N of the first delay circuits and the number of stages n in the delay circuit sequence of said first delay circuits, or (N−n)×T/N;

the number n second delay circuit, n being a positive integer from 1 to N, outputting a signal making rise or fall transition with a timing delayed by $n \times t1 + tpd - (1-n/N) \times T$ from the start time point of the clock cycle of the input clock; and generating multi-phase clocks with a time interval of t1+T/N from output signals of the number 1 to number N second delay circuits.

39. The clock controlling method as defined in claim 38 wherein said input clock and the output signals of the number 1 to number N second delay circuits being combined together to generate multiplied clocks corresponding to equal division of the clock period tCK of said input clock.

40. A clock controlling circuit comprising:

a first delay circuit sequence including plural cascaded stages of delay circuits;

a second delay circuit sequence including plural cascaded stages of delay circuits;

an input clock received by the stage 1 delay circuit of said first delay circuit sequence being output from the last stage delay circuit of the first delay circuit sequence after propagation through said first delay circuit sequence to be input to the stage 1 delay circuit of said second delay circuit sequence for propagation through said second delay circuit sequence;

a plurality of interior division circuits arranged in juxtaposition to one another in association with respective stages of the delay circuits of said first and second delay circuit sequences for outputting output signals with a delay time prescribed by the time corresponding to division of the phase difference between two input signals with a preset interior division ratio, the number 1 interior division circuit of said juxtaposed plural interior division circuits being fed with an input clock output by said first delay circuit sequence and fed to the stage number 1 delay circuit of the second delay circuit sequence and the next cycle input clock;

the number n+1 interior division circuit, n being an optional integer such that n+1 is not less than 2 and not larger than the stage number of the last stage delay circuit of said first delay circuit sequence, being fed with an output signal of the stage number n delay circuit of the second delay circuit sequence associated with the interior division circuit and with an output signal of the stage number n delay circuit of said first delay circuit sequence fed with the input clock of the next cycle;

the interior division ratio of plural interior division circuits being set so as to be larger every unit value in association with the order of said interior division circuits;, such that, if, with the input clock period tCK<the number of stages of the last stage delay circuit of said first delay circuit sequence being n and the delay time of each delay circuit being td, $T=tCK-N \times td$, the interior division ratio of said plural interior division circuits is set such as to increase the respective delay time every preset unit T/N, with the phase difference between output signals of two neighboring interior division circuits being tCK/N, with the phase difference between the output signal of the number 1 interior division circuit and the number (N+1) interior division circuit being 2π.

41. A clock control circuit comprising a delay circuit sequence made up of cascaded 2N delay circuits, N being an integer not less than 1, with an input clock received by the stage number 1 delay circuit of said delay circuit sequence being propagated through said delay circuit sequence, and at least N interior division circuits for outputting output signals of delay time prescribed by the time corresponding to division of a phase difference between the two input signals with a preset interior division ratio, with the interior division ratio of said plural interior division circuits being set to respective different values;

the number 1 interior division circuit being fed with an output signal of the stage number N delay circuit and with an input clock of the next cycle;

the number i interior division circuit, i being an integer from 2 to N, being fed with an output signal of the stage number (N+i−1) delay circuit and with an output signal of the stage number (i−1) delay circuit of the input clock of the next cycle;

the number 1 to number N interior division circuit outputting multiphase clocks of a phase difference corresponding to N equal division of the input clock period.

42. The clock control circuit as defined in claim 40 comprising a synthesis circuit fed with multi-phase clocks output from number 1 to number N interior division circuits to form a sole synthesized signal by multiplexing and synthesis to generate N-tupled clock signals.

43. A clock control circuit comprising
a first delay circuit sequence including 2N cascaded stages of first delay circuit sequences, with a non-inverting-phase clock being input at a stage number 1 delay circuit of said first delay circuit sequence for propagation through said first delay circuit sequence, where N is an integer not less than 1;

a second delay circuit sequence including 2N cascaded stages of second delay circuit sequences, with an inverting phase clock being input at a stage number 1 delay circuit of said second delay circuit sequence for propagation through said second delay circuit sequence, where N is an integer not less than 1;

first and second groups of interior division circuits, each group including (N+1) interior division circuits for outputting an output signal of a delay time prescribed by the time obtained on dividing a phase difference of two input signals with a preset interior division ratio;

the interior division ratio of said (N+1) interior division circuits being set to respective different values in each group;

the number 1 interior division circuit of the first group of the interior division circuits being fed with an output signal of the stage number N delay circuit of said second delay circuit sequence and with a forward phase clock of the next cycle;

the number i interior division circuit of the first group of the interior division circuits, i being a number from 2 to N+1, being fed with an output signal of the number (N+i−1) delay circuit of said second delay circuit sequence and with an output signal of said delay circuit of the (i−1) stage number delay circuit of said first delay circuit sequence fed with forward phase clocks of the next cycle;

the number 1 to number (N+1) interior division circuit of said first group of the interior division circuits outputting multi-phase clocks of a phase difference corresponding to N equal division of one half of the period of the input clock (phase π);

the number 1 interior division circuit of the second group of the interior division circuits being fed with an output signal of the stage number N delay circuit of said first delay circuit sequence and with reverse-phase clocks of the next cycle;

the number i interior division circuit of the second group of the delay circuit sequence, i being an integer from 2 to N+1, being fed with an output signal of the stage number (N+i−1) delay circuit of said first delay circuit sequence and with an output signal of the stage number (i−1) delay circuit of the second delay circuit sequence fed with a reverse phase clock of the next cycle;

the number 1 to number (N+1) interior division circuit of the second group of the interior division circuits outputting multi-phase clocks of a phase difference corresponding to N equal division of one half the clock period (phase π) of said input clock with a phase shift of π from an output signal of the number 1 to number (N+1) interior division circuits of the first group of the interior division circuits.

44. A clock control circuit as defined in claim 40 wherein said interior division circuit comprises:

a logic circuit having input terminals connected to a first input terminal and a second input terminal receiving said two signals as inputs to output a signal of a first value when signals input to said first input terminal and to the second input terminal are both of a first value;

a first switch connected across the first power supply and the internal node and being turned on when an output signal of said logic circuit is of a first value;

a capacitor connected across said internal node and a second power supply;

a buffer circuit having an input terminal connected to said internal node, an output signal of said buffer circuit being changed on inversion of the relative magnitudes between said internal node voltage and a threshold value;

N second switches having one ends connected to said internal node and having control terminals thereof connected to said first input terminal so as to be controlled on and off;

N third switches having one ends connected to the other ends of the N second switches and having the other ends connected to said second power supply so as to be on and off controlled when a control signal is input to each control terminal thereof;

N fourth switches having one ends connected to said internal node and having control terminals thereof connected to said second input terminal; and N fifth switches having one ends connected to the other ends of the N fourth switches and having the other ends connected to said second power supply so as to be on/off controlled when a control signal is input to each control terminal thereof;

(N−n) switches of said N third switches in said number n interior division circuit being set to an on state by said control signal; n of said N fifth switches being set to an on state by said control signal.

45. A clock control circuit comprising:
first and second delay circuit sequences comprised of N cascaded stages of delay circuits, N being an integer not less than 1;

an input clock being fed to said delay circuit of the number 1 delay circuit of the first delay circuit sequence so as to be propagated through said first delay circuit sequence;

a selection circuit receiving an output signal of each delay circuit of said first delay circuit sequence to select one delay circuit output depending on a multiplication value K as specified by an input multiplication value determining signal, K being an integer not less than 1 and not larger than N;

an output signal of said selection circuit being fed to the stage number 1 delay circuit of said second delay circuit sequence so as to be propagated through said second delay circuit sequence; and at least N interior division circuits arranged in juxtaposition for outputting an output signal of a delay time prescribed by the time corresponding to division of a phase difference of two input signals with a preset interior division ratio;

the interior division ratio of said interior division circuits differing from one another and being prescribed by the multiplication value K specified by said multiplication value determining signal;

the number 1 interior division circuit being fed with an output signal of said selection circuit and with an input clock of the next cycle;

the number i interior division circuit, i being an integer from 2 to N, being fed with an output signal of the stage number (i−1) delay circuit of said second delay circuit sequence and with an output signal of the stage number (i−1) delay circuit of the first delay circuit sequence of the next cycle clock;

the number i to number K interior division circuit outputting multi-phase clocks of a phase difference corresponding to K equal division of said input clock;

said multiplication value K being varied by said multiplication value determining signal.

46. The clock control circuit as defined in claim 45 comprising a synthesis circuit receiving K clocks output from the number 1 to number K interior division circuits and multiplexing said clocks to one signal to output a K-tupled clock signal.

47. A clock control circuit as defined in claim 45 wherein said interior division circuit comprises:

a logic circuit having input terminals connected to a first input terminal and a second input terminal fed with said two signals, as inputs, and outputting a signal of a first value when signals input to said first input terminal and to the second input terminal are both of a first value;

a first switch connected across the first power supply and the internal node and being turned on when an output signal of said logic circuit is of a first value;

a capacitor connected across said internal node and a second power supply;

a buffer circuit having an input terminal connected to said internal node, an output signal of said buffer circuit being changed on inversion of the relative magnitudes between said internal node voltage and a threshold value;

N second switches having one ends connected to said internal node and having control terminals thereof connected to said first input terminal so as to be controlled on and off;

N third switches having one ends connected to the other ends of the N second switches and having the other ends coupled to said second power supply so as to be on an off controlled when a control signal is input to each control terminal thereof;

N fourth switches having one ends connected to said internal node and having control terminals thereof connected to said second input terminal; and N fifth switches having one ends connected to the other ends of the N fourth switches and having the other ends connected to said second power supply so as to be on and off controlled when a control signal is input to each control terminal thereof; wherein if said multiplication value determining signal specifies a multiplication value K, K of said control signals are activated; of the N third switches of the number m interior division circuit, (K−m) switches are set to an on state by said control signal and wherein m of said N fifth switches are set to an on state by said control signal.

48. The clock control circuit as defined in claim 40 further comprising a period detection circuit for detecting the input clock period, the delay time of said delay circuit being varied based on a clock period detection signal output from said period detection circuit.

49. The clock controlling circuit as defined in claim 48 wherein said delay circuit comprises:

a logic circuit having its input terminal connected to first and second input terminals to output a signal of a first value when the signals fed to said first and second input terminals are both of a first value;

a first switch connected across a first power supply and an internal node and adapted for being turned on when an output signal of said logic circuit is of a first value;

a buffer circuit having an input terminal connected to said internal node and having an output signal changed on inversion of the magnitude relation between said internal node voltage and a threshold value;

one or more serial circuits connected across said internal node and the second power supply, said serial circuit including a second switch the control terminal of which is connected to said first input terminal and a first constant current source;

one or more serial circuits including a third switch the control terminal of which is connected to said second input terminal and a second constant current source; and a plurality of parallel-connected serial circuits connected across said internal node and said second power supply, said serial circuit including a switch controlled on and off by a control signal output by said period detection circuit and a capacitor;

said first and second input terminals being fed with the same signal in common.

50. The clock control circuit as defined in claim 48 wherein said delay circuit includes a plurality of unit delay circuits connected in tandem; and a selector receiving output signals of the plural unit delay circuits as inputs for selectively outputting one output signal of the plural unit delay circuits using the control signal output by said period detection circuit as a selection control signal.

51. A clock control circuit as defined in claim 44 wherein, with the delay time td of the delay circuit, the period tCK of the input clock and with the delay time of the N delay circuits N×td smaller than tCK by a time difference T, a signal of an equal phase difference tCK/N being output from the (N+1) interior division circuits.

52. The clock controlling circuit as defined in claim 40 wherein, in case the interior division circuit includes first and second input terminals fed with two input signals and the interior division ratio is m/M: 1−m/M, where m is an integer from 0 to N, (N−m) serial circuits each comprised of a MOS transistor of a first conductivity type, a control terminal of which is connected to said first input terminal, and a MOS transistor of a first conductivity type, a control terminal of which is connected to said second input terminal, are connected in parallel across the first power supply and the internal node;

m serial circuits each comprised of a MOS transistor of a first conductivity type, set to an on state by a voltage applied to the control terminal, and a MOS transistor of a first conductivity type, a control terminal of which is connected to said first input terminal, are connected in parallel across the first power supply and the internal node;

a MOS transistor of a first conductivity type, the source and the drain of which are connected to said first power supply;

(N−m) serial circuits each comprised of a MOS transistor of a second conductivity type, a control terminal of which is connected to said second input terminal, and a MOS transistor of a second conductivity type, a control terminal of which is connected to said first input terminal, are connected in parallel across the internal node and the second power supply;

m serial circuits each comprised of a MOS transistor of a second conductivity type, set to an on state by a voltage applied to the control terminal, and a MOS transistor of a first conductivity type, a control terminal of which is connected to said second input terminal, are connected in parallel across the internal node and the power supply;

a MOS transistor of a second conductivity type, the source and the drain of which are connected to said second power supply; and a buffer circuit having its input end connected to said internal node, with the output signal being changed on inversion of the magnitude relation between the internal node voltage and a threshold value.

53. A semiconductor integrated circuit having a clock controlling circuit as defined in claim 40 wherein the output signal from said clock control circuit are supplied as internal clocks to an internal circuit.

54. A clock controlling method comprising connecting 2N cascaded stages of delay circuits, N being an integer not less than 1, inputting input clock to a stage number 1 delay circuit of a delay circuit sequence;

at least N interior division circuits for outputting an output signal of a delay time prescribed by time obtained on dividing a phase difference of two input signals by a predetermined interior division ratio, with the interior division ratio of said plural interior division circuits being set to respective different values;

the interior division circuit receiving an output signal of the stage number N delay circuit and with the input clock of the next cycle, and outputting an output signal of a delay time prescribed by the time obtained on dividing the phase difference of two input signals with a predetermined interior division ratio;

the interior division circuit fed with an output signal of the stage number (N+i) delay circuit, i being an integer from 1 toN−1, and with an output signal of the stage number i of the delay circuit of the next cycle input clock, outputting an output signal of a delay time prescribed by time obtained on dividing the phase difference of the two input signals by a preset interior division ratio; and generating multi-phase clocks of a phase difference corresponding to N equal division of the input clock period through N of said interior division circuits.

55. The clock controlled method as defined in claim 54 comprising the step of providing to a synthesis circuit N-phased clocks of the N interior division circuits for synthesizing said signals to form a single line N-tuple multiplied clock signal.

56. A clock controlling method comprising the steps of:

entering a non-inverting phase clock to a stage number 1 delay circuit of a first delay circuit sequence so as to be propagated through said first delay circuit sequence comprised of 2N cascaded stages of delay circuits, N being an integer not less than 1;

entering an-inverting phase clock to a stage number 1 delay circuit of a second delay circuit sequence so as to be propagated through said second delay circuit sequence comprised of 2N cascaded stages of delay circuits, N being an integer not less than 1;

the (N+1) interior division circuits making up each of first and second groups of interior division circuits, adapted for outputting output signals of delay time prescribed by time corresponding to division of a phase difference of two input signals by a preset interior division ratio, setting the interior division ratio of (N+1) interior division circuits to respective different values;

the number 1 interior division circuit of said first group of interior division circuits being fed with an output signal of a stage number N delay circuit and a forward phase clock of the next cycle in the number 1 interior division circuit of said first group of the interior division circuits;

the number i interior division circuit of said first group of interior division circuits, i being an integer from 2 to N+1, being fed with an output signal of the stage number (N+i−1) delay circuit of said second delay circuit sequence in the number i interior division circuit of the first group of interior division circuits, i being an integer from 2 to N+1, and an output signal of the stage number (i−1) delay circuit of said first delay circuit sequence fed with the forward phase clocks of the next cycle;

the number 1 to number (N+1) interior division circuits of said first group of interior division circuits outputting multi-phase clocks of a phase difference corresponding to N equal division of one half of the period of said input clock (phase of π);

the number 1 interior division circuit of said second group of the interior division circuits being fed with an output signal of a stage number N delay circuit and a reverse phase clock of the next cycle;

the number i interior division circuit of the second group of interior division circuits being fed with an output signal of the stage number (N+i−1) delay circuit of said first delay circuit sequence, i being an integer from 2 to N+1, and with an output signal of the stage number (i−1) delay circuit of said second delay circuit sequence fed with the forward phase clocks of the next cycle; and the number 1 to number (N+1) interior division circuits of said second group of the interior division circuits outputting multi-phase clocks of a phase difference corresponding to N equal division of one half of the period of the input clock (phase of π), with a phase shift π from the output signals of the number 1 to number (N+1) interior division circuits of said first group of the interior division circuits.

57. A clock controlling method comprising:

entering an input clock to a stage number 1 delay circuit of a first delay circuit sequence comprised of N cascaded stages of delay circuits, N being an integer not less than 1;

a selection circuit receiving an output signal of each delay circuit of said first delay circuit sequence and selecting one output depending on a multiplication value K, as specified by a multiplication value determining signal, K being an integer not less than 1 and not larger than N, feeding an output signal of said selection circuit to a stage number 1 delay circuit of said second delay circuit sequence comprised of N cascaded delay circuits, N being an integer not less than 1;

juxtaposing at least N interior division circuits outputting an output signal of a delay time prescribed by time corresponding to division of a phase difference of two input signals with a preset interior division ratio, a number i interior division circuit of the interior division circuits, having respective different values of the interior division ratio and prescribed by the multiplication value, as specified by the multiplication value determining signal, being fed with an output signal of said selection circuit and with an input clock of the next cycle;

a number i interior division circuit, i being an integer from 2 to N, being fed with an output signal of an (i−1) stage number delay circuit of said second delay circuit sequence and with an output signal of an (i−1) stage number delay circuit of said first delay circuit sequence of the clock of the next cycle; and number 1 to number K interior division circuits outputting multi-phase clocks having a phase difference corresponding to K equal division of the period of said input clock.

* * * * *

UNITED STATES PATENT AND TRADEMARK OFFICE
CERTIFICATE OF CORRECTION

PATENT NO. : 6,742,133 B2
DATED : May 25, 2004
INVENTOR(S) : Saeki

It is certified that error appears in the above-identified patent and that said Letters Patent is hereby corrected as shown below:

Column 55,
Line 16, "sages" should be -- stages --.

Signed and Sealed this

Twenty-ninth Day of March, 2005

JON W. DUDAS
*Director of the United States Patent and Trademark Office*